(12) United States Patent
Ono

(10) Patent No.: US 7,692,473 B2
(45) Date of Patent: Apr. 6, 2010

(54) SWITCH CIRCUITS WITH THE ABILITY TO CONTROL LATCH-UP DUE TO A PARASITIC ELEMENT

(75) Inventor: Takashi Ono, Osaka (JP)

(73) Assignee: Panasonic Corporation, Osaka (JP)

( * ) Notice: Subject to any disclaimer, the term of this patent is extended or adjusted under 35 U.S.C. 154(b) by 55 days.

(21) Appl. No.: 11/642,790

(22) Filed: Dec. 21, 2006

(65) Prior Publication Data

US 2007/0146953 A1    Jun. 28, 2007

(30) Foreign Application Priority Data

Dec. 28, 2005    (JP) .............................. 2005-379474

(51) Int. Cl.
*H03K 17/687* (2006.01)
(52) U.S. Cl. .................. 327/427; 327/303; 327/428
(58) Field of Classification Search ................ 327/427, 327/303, 428
See application file for complete search history.

(56) References Cited

U.S. PATENT DOCUMENTS

| | | | |
|---|---|---|---|
| 4,256,979 A * | 3/1981 | Hendrickson et al. ....... | 327/409 |
| 5,467,050 A * | 11/1995 | Clapp et al. ................. | 327/530 |
| 5,682,050 A * | 10/1997 | Williams ..................... | 257/368 |
| 5,925,910 A | 7/1999 | Menegoli | |
| 6,111,278 A | 8/2000 | Kim | |
| 6,404,261 B1 * | 6/2002 | Grover et al. ............... | 327/320 |
| 6,700,433 B2 * | 3/2004 | Zuk ............................ | 327/427 |
| 7,129,766 B2 * | 10/2006 | Steinhagen ................. | 327/427 |
| 2006/0170461 A1 * | 8/2006 | Bhattacharya et al. ........ | 327/65 |
| 2006/0202739 A1 * | 9/2006 | Lee et al. .................... | 327/427 |

FOREIGN PATENT DOCUMENTS

| | | |
|---|---|---|
| JP | 2000-244298 A | 9/2000 |
| JP | 2003-163589 A | 6/2003 |
| JP | 2003-224244 A | 8/2003 |
| JP | 2004-350127 A | 12/2004 |

* cited by examiner

*Primary Examiner*—Lincoln Donovan
*Assistant Examiner*—John W Poos
(74) *Attorney, Agent, or Firm*—McDermott Will & Emery LLP

(57) ABSTRACT

In a conventional switch circuit capable of bidirectional conductivity, there is the problem that latch-up occurs in a parasitic thyristor included in a transistor having a switching function. Therefore it is an object of the present invention to provide a switch circuit capable of bidirectional conductivity while suppressing the occurrence of latch-up due to a parasitic thyristor. The present invention provides a switch circuit that includes diodes connected in parallel with each of a MOS transistor having the switching function and parasitic diodes present at the source and the drain of the MOS transistor.

18 Claims, 39 Drawing Sheets

SWITCH CIRCUITS WITH THE ABILITY TO CONTROL LATCH-UP DUE TO A PARASITIC ELEMENT

This application is based on an application Ser. No. 2005-379474 filed in Japan, the content of which is hereby incorporated by reference.

BACKGROUND OF THE INVENTION (1) Field of the Invention

The present invention relates to switch circuits with the ability to control latch-up due to a parasitic element.

(2) Description of the Related Art

Japanese Patent Application Publication Nos. 2003-224244, 2000-224298, and 2004-350127 each disclose a conventional switch circuit in which bidirectional conductivity is possible.

Japanese Patent Application Publication No. 2003-163589 discloses a semiconductor device in which a transistor and a Schottky barrier diode are provided on the same chip. In the Schottky barrier diode, the drain electrode of the transistor is connected to a cathode electrode, and the source electrode of the transistor is connected to an anode electrode. By providing this semiconductor device with a Schottky barrier diode, the occurrence of a minority carrier in a PN junction face between a drain diffusion layer and an N-well region of the transistor is suppressed, so that it is possible to prevent the operation of a parasitic transistor present on the substrate on which the semiconductor device is formed.

However, the transistors used to configure the switch circuit disclosed in Japanese Patent Application Publication Nos. 2003-224244, 2000-224298, and 2004-350127 have PN junction faces between each of the diffusion layers that function as the drain or the source, and the well regions in which these diffusion layers are formed, and when a forward bias voltage is applied to these PN junction faces, minority carrier injection occurs. When minority carrier injection occurs, there is a risk that latch-up will occur due to a parasitic thyristor present on the substrate on which the switch circuit is formed.

Also, with the semiconductor device disclosed in Japanese Patent Application Publication No. 2003-163589, it is possible to suppress the occurrence of a minority carrier by mitigating the forward bias current that occurs at the drain-side PN junction face, but when the direction of the current between the source and the drain has been reversed, it is not possible to suppress the occurrence of a minority carrier at the source-side PN junction face.

In order to address these problems, it is an object of the present invention to provide a switch circuit, a diode, and a transistor, in which bidirectional conductivity is possible, and with the ability to control the occurrence of latch-up due to a parasitic element.

SUMMARY OF THE INVENTION

In order to attain the above object, the present invention provides a switch circuit comprising first and second input-output terminals; a MOS transistor, whose source is connected to the first input-output terminal, and whose drain is connected to the second input-output terminal; a first rectifying unit, provided between the first input-output terminal and a back gate of the MOS transistor; a second rectifying unit, provided between the second input-output terminal and the back gate of the MOS transistor; and a control unit operable to control an on-off state of the MOS transistor based on a control signal.

The first rectifying unit is connected having the same rectifying direction as and in parallel with a parasitic diode that is parasitic between the source and the back gate of the MOS transistor; and the second rectifying unit is connected having the same rectifying direction as and in parallel with a parasitic diode that is parasitic between the drain and the back gate of the MOS transistor.

According to the above configuration, the first rectifying unit is connected having the same rectifying direction as and in parallel with a parasitic diode on the source-side of the MOS transistor, and reduces the current that flows to the source-side parasitic diode. Also, the second rectifying unit is connected having the same rectifying direction as and in parallel with a parasitic diode on the drain-side of the MOS transistor. Thus it is possible to reduce the forward bias current that flows to the two parasitic diodes, to suppress the occurrence of latch-up in both a parasitic element that includes the source-side parasitic diode and a parasitic element that includes the drain-side parasitic diode. Accordingly, in a case in which current is allowed to flow from the first input-output terminal to the second input-output terminal, and in a case in which current is allowed to flow from the second input-output terminal to the first input-output terminal, it is possible to attain the excellent effect of being able to suppress the occurrence of latch-up.

Also, the MOS transistor is a P-channel-type transistor; the first rectifying unit and the second rectifying unit are respectively provided with an anode terminal and a cathode terminal, the anode terminal receiving input of current and the cathode terminal outputting current; the anode terminal of the first rectifying unit is connected to the first input-output terminal, and the cathode terminal is connected to the back gate of the MOS transistor; and the anode terminal of the second rectifying unit is connected to the second input-output terminal, and the cathode terminal is connected to the back gate of the MOS transistor.

The switch circuit further comprises a third rectifying unit, in which the anode terminal is connected to a power source potential, and the cathode terminal is connected to the back gate of the MOS transistor; wherein the control unit acquires an operating potential from the back gate of the MOS transistor.

According to this configuration, the control unit acquires an operating potential from the back gate of the MOS transistor, so a separate power source is not required.

Also, according to the above configuration, a power source potential is always supplied to the back gate of the MOS transistor via the third rectifying unit. Thus, it is possible for the control unit to always operate normally, even when the potential of the first and second input-output terminals supplied to the back gate of the MOS transistor does not reach the potential necessary for operation of the control unit.

The switch circuit further comprises a supplemental transistor that is an N-channel-type MOS transistor, whose source is connected to the first input-output terminal, and whose drain is connected to the second input-output terminal, and whose back gate is connected to a ground potential; wherein the control unit further controls the on-off state of the supplemental transistor in synchronization with the on-off state of the MOS transistor.

According to this configuration, the switch circuit is provided with an N-type supplemental transistor whose on-off state is switched in synchronization with the on-off state of the MOS transistor, so it is possible to expand the range of potential that can be transmitted between the input-output terminals.

The switch circuit further comprises a first adjusting transistor that is a P-channel-type MOS transistor, whose source or drain is connected to the first input-output terminal, and whose back gate and the other among the source and the drain are connected to the back gate of the MOS transistor, and whose gate is connected to the second input-output terminal; and a second adjusting transistor that is a P-channel-type MOS transistor, whose source or drain is connected to the second input-output terminal, and whose back gate and the other among the source and the drain are connected to the back gate of the MOS transistor, and whose gate is connected to the first input-output terminal.

According to this configuration, when the potential of the first input-output terminal is higher than that of the second input-output terminal, the first adjusting transistor enters the on state, and the second adjusting transistor enters the off state. When in the on state, the first adjusting transistor, in parallel with the first rectifying unit, allows current to flow from the first input-output terminal to the back gate of the MOS transistor, and thus it is possible to further reduce the current that flows through the source-side parasitic diode of the MOS transistor. When, conversely, the potential of the second input-output terminal is higher than that of the first input-output terminal, the second adjusting transistor enters the on state, reducing the current that flows through the drain-side parasitic diode of the MOS transistor.

Also, when a high potential is applied to the first and second input-output terminals, the potential of the back gate of the MOS transistor also becomes a high potential. Then, when a low potential is applied to the first and second input-output terminals, regardless of the size of the potential of the first and second input-output terminals, the first and second adjusting transistors both enter the on state, and the potential of the back gate of the MOS transistor is reduced to the same potential as the higher potential among the potentials of the first and second input-output terminals. Thus, it is possible to prevent a reduction in current capacity due to a substrate bias effect of the MOS transistor.

Also, the MOS transistor used to configure the switch circuit is an N-channel-type transistor; the first rectifying unit and the second rectifying unit respectively comprise an anode terminal that receives input of current; a cathode terminal that outputs current; wherein the anode terminal of the first rectifying unit is connected to the back gate of the MOS transistor, and the cathode terminal of the first rectifying unit is connected to the first input-output terminal; and the anode terminal of the second rectifying unit is connected to the back gate of the MOS transistor, and the cathode terminal of the second rectifying unit is connected to the second input-output terminal.

The switch circuit further comprises a third rectifying unit, in which the anode terminal is connected to the back gate of the MOS transistor, and the cathode terminal is connected to a ground potential; wherein the control unit acquires an operating potential from the back gate of the MOS transistor.

According to this configuration, the control unit acquires an operating potential that is not greater than a predetermined threshold value from the back gate of the MOS transistor, so a separate power source is not necessary.

Also, with the above configuration, due to the third rectifying unit, a potential that is not greater than a ground potential is always maintained at the back gate of the MOS transistor. Thus, it is possible for the control unit to always operate normally, even when the potential of the first and second input-output terminals, which is supplied to the back gate of the MOS transistor via the first and second rectifying units, exceeds the threshold value of the control unit.

The switch circuit further comprises a supplemental transistor that is a P-channel-type MOS transistor, whose source is connected to the first input-output terminal, and whose drain is connected to the second input-output terminal, and whose back gate is connected to a power source potential; wherein the control unit further controls the on-off state of the supplemental transistor in synchronization with the on-off state of the MOS transistor.

According to this configuration, the switch circuit is provided with a P-type supplemental transistor whose on-off state is switched in synchronization with the on-off state of the MOS transistor, so it is possible to expand the range of potential that can be transmitted between the input-output terminals.

Also, the switch circuit further comprises a first adjusting transistor that is an N-channel-type MOS transistor, whose source or drain is connected to the first input-output terminal, and whose back gate and the other among the source and the drain are connected to the back gate of the MOS transistor, and whose gate is connected to the second input-output terminal; and a second adjusting transistor that is an N-channel-type MOS transistor, whose source or drain is connected to the second input-output terminal, and whose back gate and the other among the source and the drain is connected to the back gate of the MOS transistor, and whose gate is connected to the first input-output terminal.

According to this configuration, when the potential of the first input-output terminal is lower than that of the second input-output terminal, the first adjusting transistor enters the on state, and the second adjusting transistor enters the off state. When in the on state, the first adjusting transistor, in parallel with the first rectifying unit, allows current to flow from the back gate of the MOS transistor to the first input-output terminal, and thus it is possible to further reduce the current that flows through the source-side parasitic diode of the MOS transistor. Accordingly, it is possible to further reduce the risk of latch-up in a parasitic element that includes a source-side PN junction.

When the potential of the second input-output terminal is less than that of the first input-output terminal, conversely, the second adjusting transistor enters the on state, so it is possible to further reduce the current that flows to the drain-side parasitic diode of the MOS transistor.

Also, when a low potential is applied to the first and second input-output terminals, the potential of the back gate of the MOS transistor also becomes a low potential. Then, when a high potential is applied to the first and second input-output terminals, regardless of the size of the potential of the first and second input-output terminals, the first and second adjusting transistors both enter the on state, reducing the potential of the back gate of the MOS transistor. Thus, it is possible to prevent a reduction in current capacity due to a substrate bias effect of the MOS transistor.

Also, at least one among the first and second rectifying units comprises a first semiconductor region of a second conductivity-type, formed on a semiconductor substrate of a first conductivity-type; a first diffusion layer of the second conductivity-type, formed in the first semiconductor region; a second semiconductor region of the first conductivity-type, formed in the first semiconductor region; a second diffusion layer of the first conductivity-type, formed in the second semiconductor region; a third diffusion layer of the second conductivity-type, formed in the second semiconductor region; a first terminal, connected to the first diffusion layer and the second diffusion layer; and a second terminal, connected to the third diffusion layer.

In order for the first and second rectifying units to reduce the current that flows to the parasitic diodes of the MOS transistor, it is necessary to allow more current to flow, and thus it is desirable to adopt a configuration in which latch-up is not caused by the first and second rectifying units themselves.

According to this configuration, a parasitic thyristor is present in the diode, but because the first and second diffusion layers are connected, the adjacent first and second semiconductor regions have the same potential. Thus, current does not flow between the first and second semiconductor regions, so latch-up is not caused in the parasitic thyristor even if minority carrier injection occurs at another PN junction face.

Also, in the switch circuit, at least one among the first and second rectifying units comprises a first semiconductor region of a second conductivity-type, formed on a semiconductor substrate of a first conductivity-type; a first diffusion layer of the second conductivity-type, formed in the first semiconductor region; a second semiconductor region of the first conductivity-type, formed in the first semiconductor region; a second diffusion layer of the first conductivity-type, formed in the second semiconductor region; an internal MOS transistor of these second conductivity-type, formed in the second semiconductor region; a first terminal, connected to the first and second diffusion layers, either the source or the drain of the internal MOS transistor, and the gate of the internal MOS transistor; and a second terminal, connected to the other among the source and the drain of the internal MOS transistor.

In order for the first and second rectifying units to reduce the current that flows to the parasitic diodes of the MOS transistor, it is necessary to allow more current to flow, and thus it is desirable to adopt a configuration in which latch-up is not caused by the first and second rectifying units themselves.

According to this configuration, in the first or second rectifying unit, the first and second diffusion layers are connected, so the adjacent first and second semiconductor regions have the same potential, and thus current does not flow between the first and second semiconductor regions. Accordingly, latch-up is not caused in the parasitic thyristor including the first and second semiconductor regions.

Further, it is possible for a rectifying unit with the above configuration to reduce minority carrier injection at a PN junction face in the internal MOS transistor, because current is allowed to flow via a channel region formed in the internal MOS transistor. Accordingly, latch-up does not occur even in a parasitic thyristor including a PN junction face in the internal MOS transistor.

Also, in the switch circuit, a threshold voltage of the internal MOS transistor is lower than a built-in potential of the parasitic diode.

When, as described above, the threshold voltage of the internal MOS transistor is reduced, the current that passes through the channel region is increased in the internal MOS transistor, reducing the current that passes through the parasitic diode between the source or the drain and the back gate of the internal MOS transistor. Accordingly, it is possible to further reduce the risk that latch-up will occur in a parasitic thyristor including a PN junction face in the internal MOS transistor.

The switch circuit further comprises a voltage dividing unit that causes a predetermined voltage drop between the source of the MOS transistor and the first input-output terminal, and/or between the drain of the MOS transistor and the second input-output terminal.

According to the above configuration, it is possible to reduce the voltage applied to at least one of the parasitic diode present on the source side of the MOS transistor and the parasitic diode present on the drain side. The current that flows to a parasitic diode increases according to the voltage that is applied to the parasitic diode. Accordingly, by reducing the voltage that is applied to the parasitic diode, it is possible to reduce the current that flows to the parasitic diode.

The present invention provides a switch circuit comprising first and second input-output terminals; a P-channel-type MOS transistor, whose source is connected to the first input-output terminal, and whose drain is connected to the second input-output terminal; a first rectifying unit whose anode terminal is connected to the first input-output terminal, and whose cathode terminal is connected to the back gate of the P-channel-type MOS transistor, the anode terminal receiving input of current and the cathode terminal outputting current; a second rectifying unit whose anode terminal is connected to the second input-output terminal, and whose cathode terminal is connected to the back gate of the P-channel-type MOS transistor, a third rectifying unit whose anode terminal is connected to a power source potential, and whose cathode terminal is connected to the back gate of the P-channel-type MOS transistor; a first control unit that acquires an operating potential from the back gate of the P-channel-type MOS transistor, and controls the on-off state of the P-channel-type MOS transistor based on a control signal; an N-channel-type MOS transistor whose source is connected to the first input-output terminal, and whose drain is connected to the second input-output terminal; a fourth rectifying unit whose anode terminal is connected to the back gate of the N-channel-type MOS transistor, and whose cathode terminal is connected to the first input-output terminal; a fifth rectifying unit whose anode terminal is connected to the back gate of the N-channel-type MOS transistor, and whose cathode terminal is connected to the second input-output terminal; a sixth rectifying unit whose anode terminal is connected to the back gate of the N-channel-type MOS transistor, and whose cathode terminal is connected to a ground potential; and a second control unit that acquires an operating potential from the back gate of the N-channel-type MOS transistor, and controls the on-off state of the N-channel-type MOS transistor based on the control signal.

The structure of the P-channel-type MOS transistor and the N-channel-type MOS transistor used to configure the above switch circuit includes a parasitic diode configured with a PN junction between the back gate and the source and drain formed on the back gate.

The first rectifying unit is connected in parallel with the source-side parasitic diode of the P-channel-type MOS transistor, and reduces the current that flows to the source-side parasitic diode. Also, the second rectifying unit is connected in parallel with the drain-side parasitic diode of the P-channel-type MOS transistor, and reduces the current that flows to the drain-side parasitic diode. Thus, it is possible to suppress the occurrence of latch-up in both the parasitic thyristor that includes the source-side parasitic diode, and the parasitic thyristor that includes the drain-side parasitic diode. Accordingly, whether current is allowed to flow from the first input-output terminal to the second input-output terminal, or conversely current is allowed to flow from the second input-output terminal to the first input-output terminal, it is possible to attain the excellent effect of being able to suppress the occurrence of latch-up.

Also, the fourth rectifying unit and the fifth rectifying unit respectively reduce the current that flows to the parasitic diode between the source and back gate of the N-channel-type MOS transistor, and the current that flows to the parasitic diode between the drain and the back gate, thus controlling the occurrence of latch-up.

Further, the P-channel-type MOS transistor with the above configuration is capable of transmitting a positive potential, and the N-channel-type MOS transistor is capable of transmitting a negative potential. Thus, by connecting the two conductivity-type MOS transistors in parallel, it is possible to transmit a wide range of potential.

In addition, because the first control unit acquires an operating potential from the back gate of the P-channel MOS transistor, a separate external power source is not necessary. Also, the back gate of the P-channel-type MOS transistor is connected to a power source potential via the third rectifying unit. It is possible for the first control unit to operate normally even when the potential of the first and second input-output terminals transmitted to the back gate of the P-channel-type MOS transistor via the first and second rectifying units does not reach the potential necessary for operation of the first control unit.

Likewise, because the second control unit acquires an operating potential not more than a predetermined threshold value from the back gate of the MOS transistor, a separate external power source is not necessary. Also, due to the sixth rectifying unit, a potential that is not greater than a ground potential is always maintained at the back gate of the MOS transistor. Thus, it is possible for the second control unit to always operate normally, even when the potential of the first and second input-output terminals, which is supplied to the back gate of the MOS transistor via the fourth and fifth rectifying units, exceeds the threshold value of the second control unit.

Also, the present invention provides a diode, comprising a first semiconductor region of a second conductivity-type, formed on a semiconductor substrate of a first conductivity-type; a first diffusion layer of the second conductivity-type, formed in the first semiconductor region; a second semiconductor region of the first conductivity-type, formed in the first semiconductor region; a second diffusion layer of the first conductivity-type diffusion layer, formed in the second semiconductor region; a third diffusion layer of the second conductivity-type, formed in the second semiconductor region; a first terminal, connected to the first diffusion layer and the second diffusion layer; and a second terminal, connected to the third diffusion layer.

With this configuration, a parasitic thyristor is present in the diode of the present invention, but because the first and second diffusion layers are connected, the adjacent first and second semiconductor regions have the same potential. Thus, current does not flow between the first and second semiconductor regions, so latch-up is not caused in the parasitic thyristor even if minority carrier injection occurs at another PN junction face.

Also, the present invention provides a diode comprising a first semiconductor region of a second conductivity-type, formed on a semiconductor substrate of a first conductivity-type; a first diffusion layer of the second conductivity-type, formed in the first semiconductor region; a second semiconductor region of the first conductivity-type, formed in the first semiconductor region; a second diffusion layer of the first conductivity-type, formed in the second semiconductor region; an internal MOS transistor of the second conductivity-type, formed in the second semiconductor region; a first terminal, connected to the first and second diffusion layers, either the source or the drain of the internal MOS transistor, and the gate of the internal MOS transistor; and a second terminal, connected to the other among the source and the drain of the internal MOS transistor.

With this configuration, because the first and second diffusion layers are connected, the adjacent first and second semiconductor regions have the same potential, so current does not flow between the first and second semiconductor regions. Accordingly, in the diode of the present invention, latch-up does not occur in the parasitic thyristor including the first and second semiconductor regions.

Further, in the diode with the above configuration, because current is allowed to flow via the channel region formed in the internal MOS transistor, minority carrier injection at a PN junction face in the internal MOS transistor is reduced. Accordingly, latch-up is unlikely to occur even in the parasitic thyristor including a PN junction face in the internal MOS transistor.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings:

FIG. 5 is a circuit diagram that shows the configuration of a switch circuit 1a;

FIG. 12 is a circuit diagram that shows the configuration of a switch circuit 2a;

FIG. 16 is a circuit diagram that shows the configuration of a switch circuit 3a;

FIG. 20 is a circuit diagram that shows the configuration of a switch circuit 4a;

FIG. 24 is a circuit diagram that shows the configuration of a switch circuit 5a;

FIG. 28 is a circuit diagram that shows the configuration of a switch circuit 6a;

FIG. 33 is a circuit diagram that shows the configuration of a switch circuit 8a;

FIG. 37 is a circuit diagram that shows the configuration of a switch circuit 9a;

DESCRIPTION OF THE PREFERRED EMBODIMENTS

1. Embodiment 1

Following is a description of a switch circuit 1 according to Embodiment 1 of the present invention, with reference to the accompanying drawings.

1.1 Overview of Switch Circuit 1

Switch circuit 1 is provided with a PMOS transistor 113, and two diodes that are respectively connected in parallel to a PN junction face between the back gate and the drain and the source of the PMOS transistor 113. Forward bias current that flows into a parasitic diode between the back gate and the drain or the source is mitigated by these diodes, thus preventing latch-up due to a parasitic thyristor present on the substrate on which the switch circuit is formed.

In the present specification, in a MOS transistor, a semiconductor layer that faces a gate electrode, sandwiching insulating oxide film, is referred to as a back gate.

1.2 Configuration of Switch Circuit 1

Figure 1:
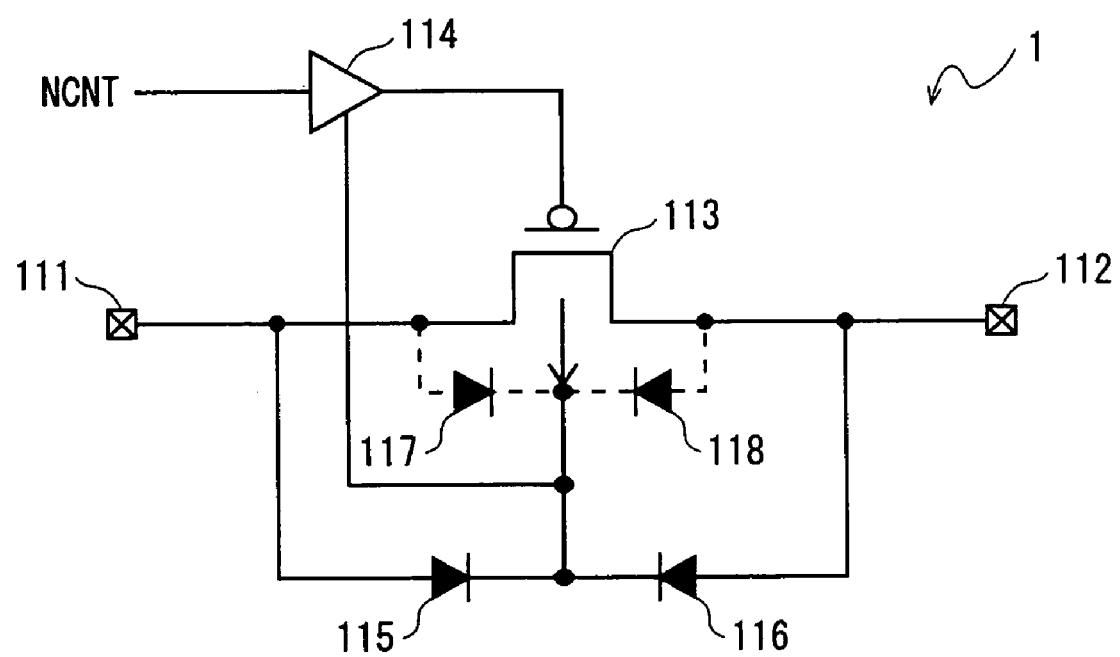
FIG. 1 is a circuit diagram that shows the configuration of a switch circuit 1.

FIG. 1 is a circuit diagram that shows the configuration of the switch circuit 1. As shown in FIG. 1, the switch circuit 1 is configured from the PMOS transistor 113, diodes 115 and 116, a level shift circuit 114, and input-output terminals 111 and 112. Either the drain or the source of the PMOS transistor 113 is connected to the input-output terminal 111, and the other is connected to the input-output terminal 112. An input terminal of the level shift circuit 114 is connected to an external circuit that outputs a control signal, and an output terminal is connected to a gate electrode of the PMOS transistor 113. A positive high voltage power terminal of the level shift circuit 114 is connected to the back gate of the PMOS transistor 113. The anode terminal of the diode 115 is connected to the input-output terminal 111, and the cathode terminal of the diode 115 is connected to the back gate of the PMOS transistor 113. The anode terminal of the diode 116 is connected to the input-output terminal 112, and the cathode terminal of the diode 116 is connected to the back gate of the PMOS transistor 113.

Parasitic diodes 117 and 118 in FIG. 1 are parasitic diodes included in the PMOS transistor 113.

Figure 2:
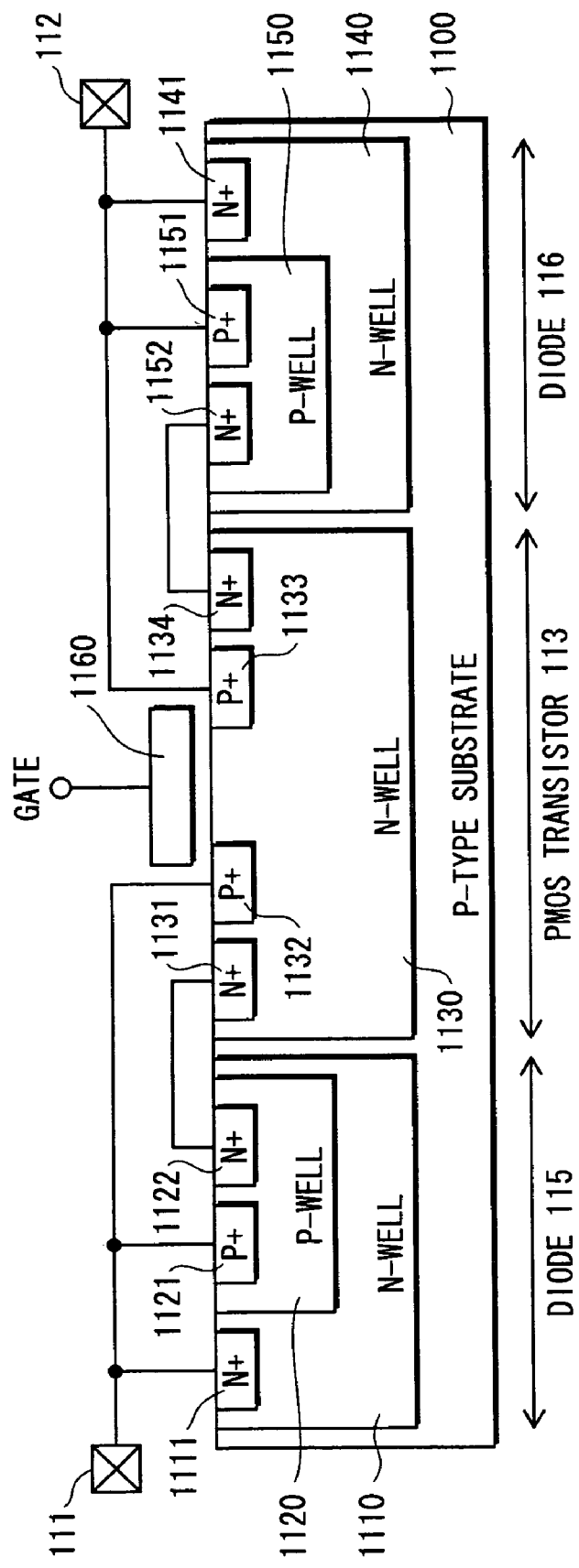
FIG. 2 is a cross-sectional diagram of a substrate on which the switch circuit 1 has been formed.

FIG. 2 shows the cross-sectional structure of a semiconductor substrate on which the switch circuit 1 has been formed. The level shift circuit 114 included in FIG. 1 is omitted from FIG. 2.

(1) PMOS Transistor 113

As shown in FIG. 2, the PMOS transistor 113 is configured from an N-well region 1130 formed on a P-type substrate 1100, P+ diffusion layers 1132 and 1133 formed in the N-well region 1130, and a gate electrode 1160. Although not shown in FIG. 2, an insulating oxide film is formed between the gate electrode 1160 and the N-well region 1130. The P-type substrate 1100 is connected to a ground potential.

The PN junction between the P+ diffusion layer 1132 and the N-well region 1130 forms the parasitic diode 117, and the PN junction between the P+ diffusion layer 1133 and the N-well region 1130 forms the parasitic diode 118.

In the PMOS transistor 113, when electric potential is transmitted bi-directionally and the potential of the input-output terminal 111 is higher than the potential of the input-output terminal 112, the P+ diffusion layer 1132 functions as the source, and the P+ diffusion layer 1133 functions as the drain. Conversely, when the potential of the input-output terminal 112 is higher than the potential of the input-output terminal 111, the P+ diffusion layer 1132 functions as the drain, and the P+ diffusion layer 1133 functions as the source.

As shown in FIGS. 1 and 2, the P+ diffusion layer 1132 of the PMOS transistor 113 is connected to the input-output terminal 111, and the P+ diffusion layer 1133 is connected to the input-output terminal 112. The PMOS transistor 113 is connected to the cathode terminal of the diodes 115 and 116 via N+ diffusion layers 1131 and 1134 formed in the N-well region 1130 (the back gate). Thus, the potential of the N-well region 1130 (the back gate) is the same as the higher potential among the potentials of the input-output terminals 111 and 112. The gate electrode 1160 is connected to the output terminal of the level shift circuit 114.

In the PMOS transistor 113, a signal with the same potential as the ground potential, or a signal with the same potential as the back gate of the PMOS transistor 113, is input from the level shift circuit 114 to the gate electrode. According to the input signal, the PMOS transistor 113 is switched on-off to allow or cut off current flow between the input-output terminal 111 and the input-output terminal 112. Specifically, the PMOS transistor 113 enters the off state when a signal with the same potential as the back gate is input, and the PMOS transistor 113 enters the on state when a signal with the same potential as the ground potential is input.

In the above configuration, even when the potential of the gate electrode of the PMOS transistor 113 is the ground potential (in the present specification, 0V), if the difference in potential between the source or the drain (that is, either of the P+ diffusion layer 1132 and the P+ diffusion layer 1133) of the PMOS transistor 113 and the gate electrode is not more than a threshold voltage of the PMOS transistor 113, the PMOS transistor 113 will not enter the on state. Thus, the potential that the switch circuit 1 can transmit is limited to not less than a value obtained by adding the threshold voltage of the PMOS transistor 113 to the ground potential, and the switch circuit 1 cannot transmit a negative potential.

(2) Diodes 115 and 116

As shown in FIG. 2, the diode 115 is configured from an N-well region 1110 formed on the P-type substrate 1100, a P-well region 1120 and an N+ diffusion layer 1111 formed in the N-well region 1110, and a P+ diffusion layer 1121 and an N+ diffusion layer 1122 formed in the P-well region 1120. Both the N+ diffusion layer 1111 and the P+ diffusion layer 1121 are connected to the input-output terminal 111, and the N-well region 1110 and the P-well region 1120 have the same potential as the input-output terminal 111. In the diode 115, the N+ diffusion layer 1111 and the P+ diffusion layer 1121 are connected to the anode terminal, and the N+ diffusion layer 1122 is connected to the cathode terminal.

The anode terminal of the diode 115 is connected to the input-output terminal 111, and the cathode terminal is connected to the back gate of the PMOS transistor 113 via the N+ diffusion layer 1131. When the potential of the input-output terminal 111 is higher than the potential of the back gate of the PMOS transistor 113, the PMOS transistor 113 is conductive, so the potential of the input-output terminal 111 is transmitted to the back gate of the PMOS transistor 113. When the potential of the back gate of the PMOS transistor 113 is higher than the potential of the input-output terminal 111, the PMOS transistor 113 is not conductive, so the transmission of potential between the input-output terminal 111 and the back gate of the PMOS transistor 113 is cut off.

As shown in FIG. 2, the diode 116 is configured from an N-well region 1140 formed on the P-type substrate 1100, a P-well region 1150 and an N+ diffusion layer 1141 formed in the N-well region 1140, and a P+ diffusion layer 1151 and an N+ diffusion layer 1152 formed in the P-well region 1150. Both the N+ diffusion layer 1141 and the P+ diffusion layer 1151 are connected to the input-output terminal 112, and the N-well region 1140 and the P-well region 1150 have the same potential as the input-output terminal 112.

The N+ diffusion layer 1141 and the P+ diffusion layer 1151 are connected to the anode terminal of the diode 116, and the N+ diffusion layer 1152 is connected to the cathode terminal.

The anode terminal of the diode 116 is connected to the input-output terminal 112, and the cathode terminal is connected to the back gate of the PMOS transistor 113 via the N+ diffusion layer 1134. When the potential of the input-output terminal 112 is higher than the potential of the back gate of the PMOS transistor 113, the diode 116 is conductive, so the potential of the input-output terminal 112 is transmitted to the back gate of the PMOS transistor 113. When the potential of the back gate of the PMOS transistor 113 is higher than the potential of the input-output terminal 112, the diode 116 is not conductive, so the transmission of potential from the input-output terminal 112 to the back gate of the PMOS transistor 113 is cut off.

(3) Level Shift Circuit 114

The positive high voltage power terminal of the level shift circuit 114 is connected to the back gate of the PMOS transistor 113, and the output terminal is connected to the gate electrode of the PMOS transistor 113.

The level shift circuit 114 is able to operate normally by receiving supply of an operating potential of not less than an operating threshold value, and obtains the operating potential from the back gate of the PMOS transistor 113 via the positive high voltage power terminal. Here, the operating threshold value is the potential of the power source.

The level shift circuit 114 receives an H-level or L-level control signal from an external circuit. In the present specification, H-level is the power source potential, and L-level is the ground potential.

When the received control signal NCNT is an H-level signal, the potential of the back gate of the PMOS transistor 113 is output instead of the power source potential. When the control signal NCNT is an L-level signal, the ground potential is output as-is. In the present specification, the potentials input to the electrodes and terminals are relative potentials based on the ground potential, so in the following description 0V is used as the ground potential.

1.3 Operation of Switch Circuit 1

Following is a specific description of the operation of the switch circuit 1. Here, the potential of the input-output terminal 111 is 10V, and the potential of the input-output terminal 112 is 3V.

When potential is applied to the input-output terminals 111 and 112 respectively, electric current flows in the forward bias direction to the diode 115 and the parasitic diode 117, so that the potential of the back gate of the PMOS transistor 113 becomes 10V.

When the control signal NCNT is an H-level signal, the level shift circuit 114 outputs 10V, which is the potential of the back gate of the PMOS transistor 113, to the gate electrode of the PMOS transistor 113. At this time, because the potential difference between the gate electrode and the source (the P+ diffusion layer 1132) of the PMOS transistor 113 is zero, the PMOS transistor 113 enters the off state, so that current is cut off between the input-output terminals 111 and 112.

When the control signal NCNT is an L-level signal, the level shift circuit 114 outputs the ground potential (0V) to the gate electrode of the PMOS transistor 113. At this time, because the potential difference between the gate electrode and the source (the P+ diffusion layer 1132) of the PMOS transistor 113 is 10V, the PMOS transistor 113 enters the on state, so that current flows between the input-output terminals 111 and 112.

When the size relationship of the potentials supplied to the input-output terminals 111 and 112 is reversed, the potential of the input-output terminal 112 is transmitted to the back gate of the PMOS transistor 113 via the diode 116 and the parasitic diode 118, so that the P+ diffusion layer 1133 functions as the source.

1.4 Effects

As described above, with the switch circuit 1 of the present invention, potential is transmitted from the input-output terminal 111 to the back gate of the PMOS transistor 113 by the diode 115, which is formed on the same substrate as the PMOS transistor 113, and the parasitic diode 117, which is between the N-well region 1130 and the P+ diffusion layer 1131 of the PMOS transistor 113. That is, a forward bias voltage is applied to the PN junction used to configure the parasitic diode 117, and forward bias current flows according to the applied voltage. That is, minority carrier injection occurs at the PN junction face of the N-well region 1130 and the P+ diffusion layer 1132.

As an example of a parasitic element present on the substrate on which the switch circuit 1 is formed, a parasitic thyristor is conceivable that is configured from the P+ diffusion layer 1132, the N-well region 1130, the P-type substrate 1100 and an N-type diffusion layer other than the N-well region 1130 formed on the P-type substrate 1100. This parasitic thyristor is equivalent to a circuit in which a bipolar first parasitic transistor, configured from the P+ diffusion layer 1132, the N-well region 1130, and the P-type substrate 1100, is connected to a bipolar second parasitic transistor, configured from the N-well region 1130, the P-type substrate 1100, and an N-type diffusion layer other than the N-well region 1130 formed on the P-type substrate 1100.

When minority carrier injection occurs at the PN junction face of the P+ diffusion layer 1132 and the N-well region 1130, a base current flows to the first parasitic transistor. At this time, if the potential of the N-type diffusion layer other than the N-well region 1130 is sufficiently low, a collector current flows to the first parasitic transistor so that the parasitic transistor enters the on state, that is, there is a risk that latch-up will occur.

At this time, the number of minority carriers grows as the current that flows through the PN junction forming the parasitic diode 117 in the forward bias direction increases, increasing the risk that latch-up will occur.

Here, the effects of the switch circuit 1 of the present invention will be more specifically described assuming that in the initial state, the potential of all of the input-output terminals 111 and 112 and the back gate of the PMOS transistor 113 is the ground potential (0V), and assuming that the potential of the input-output terminal 111 is 10V and the potential of the input-output terminal 112 is 3V.

When supplying a potential of 10V from an external circuit to the input-output terminal 111, a finite time Ta (Ta>0) is necessary for the potential of the input-output terminal 111 to reach 10V. This can be expressed as Ea (Ta)=10V when the potential of the input-output terminal 111 for an elapsed time t since starting to supply potential to the input-output terminal 111 is expressed as Ea(t). Also, the potential of the back gate of the PMOS transistor 113 for an elapsed time (t) since starting to supply potential to the input-output terminal 111 is expressed as E(t). E(t) increases according to the total amount of the charge supplied to the back gate, and when Ea(t)=E(t) =10V, electric current between the input-output terminal 111 and the back gate is stopped. The total amount of the charge supplied to the back gate is proportional to a value obtained by integrating the current between the input-output terminal 111 and the back gate with the time t.

When the elapsed time since starting to supply potential to the input-output terminal 111 is t1 (0=t1=Ta), the forward bias voltage applied to the parasitic diode 117 is Ea(t1)-E(t1), so the forward bias voltage applied to the parasitic diode 117 decreases as the potential of the back gate increases, or in other words, decreases as the amount of the charge supplied to the back gate during the passage of time t1 increases. The forward bias current that flows to the parasitic diode 117 decreases as the applied forward bias voltage decreases.

In the switch circuit 1 of the present invention, the parasitic diode 117 and the diode 115 are connected in parallel, and a charge is supplied by both to the back gate, and so the speed with which the charge is supplied is comparatively faster than when the diode 115 is not present. Accordingly, because the potential E(t1) of the back gate at the point in time of elapsed time t1 is higher than when the diode 115 is not present, the forward bias voltage Ea(t1)-E(t1) applied to the parasitic diode is reduced. Thus, the forward bias current that flows into the parasitic diode 117 is also reduced, and therefore it is possible to suppress the occurrence of latch-up in the parasitic thyristor.

Conversely, also when the potential of the input-output terminal 112 is higher than the potential of the input-output terminal 111, because the diode 116 is present, it is possible to achieve suppression of latch-up of the parasitic thyristor, which includes the PN junction face between the P+ diffusion layer 1133 and the N-well region 1130 of the PMOS transistor 113.

By, in this manner, respectively providing the diodes 115 and 116 in parallel with two parasitic thyristors of the PMOS transistor 113, in the switch circuit 1 of the present invention, it is possible to suppress the occurrence of latch-up in both the transmission of potential from the input-output terminal 111 to the input-output terminal 112, and the transmission of potential from the input-output terminal 112 to the input-output terminal 111.

Moreover, in the switch circuit 1, the higher potential among the potentials of the input-output terminals 111 and 112 is transmitted to the PMOS transistor 113, and the level shift circuit 114 acquires an operating potential from the back gate of the PMOS transistor 113 via the positive high voltage power terminal. Accordingly, due to the presence of the level shift circuit 114, the switch circuit 1 can allow current to flow or be cut off between the input-output terminal 111 and the input-output terminal 112 without requiring a special external power source.

1.5 Properties of Diodes 115 and 116

In the above description, the diodes 115 and 116, as shown in FIG. 2, were described as PN junction diodes formed by the PN junction of an N+ diffusion layer and a P-well region, but any desired diode may be used. However, the diodes used here are intended to mitigate the forward bias current that flows to the parasitic diodes 117 and 118, and thus actively allow a large current to flow. Therefore, it is desirable that the diodes themselves have a configuration that does not cause latch-up. Thus, it is necessary to satisfy one of the following two conditions.

Condition 1: latch-up is not caused even if minority carrier injection occurs when forward bias current flows to the PN junction face included in a diode.

Condition 2: minority carrier injection does not occur even if forward direction bias current is allowed to flow The diodes 115 and 116 shown in FIG. 2 satisfy above Condition 1. FIGS. 5 to 9 shows examples in which transistors are used as the diodes, and these transistors function as diodes that satisfy above Condition 2. A Schottky barrier diode is an example of a diode that satisfies Condition 2. Schottky barrier diodes are well known technology, and therefore are not described here.

Following is a description of the configuration and properties of diodes and transistors satisfying Conditions 1 and 2, with reference to the accompanying drawings.

(1) Diode Satisfying Condition 1

Following is a description of a diode that satisfies above Condition 1.

Figure 3A:
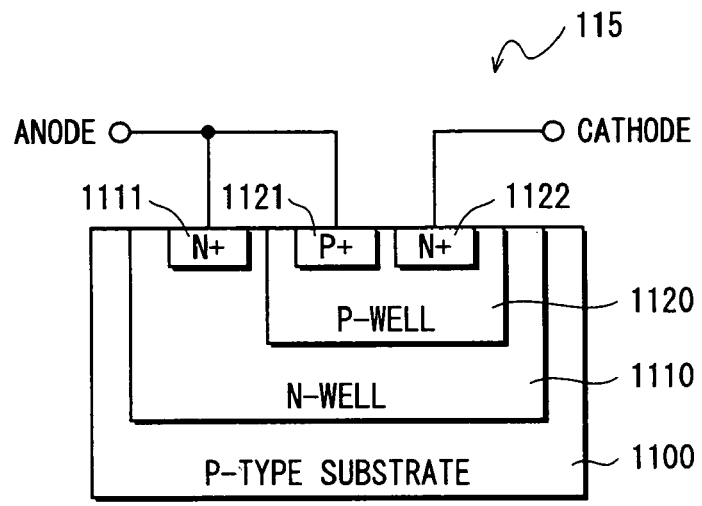
FIG. 3A is a cross-sectional diagram that shows the cross-sectional structure of a diode 115.
Figure 3B:
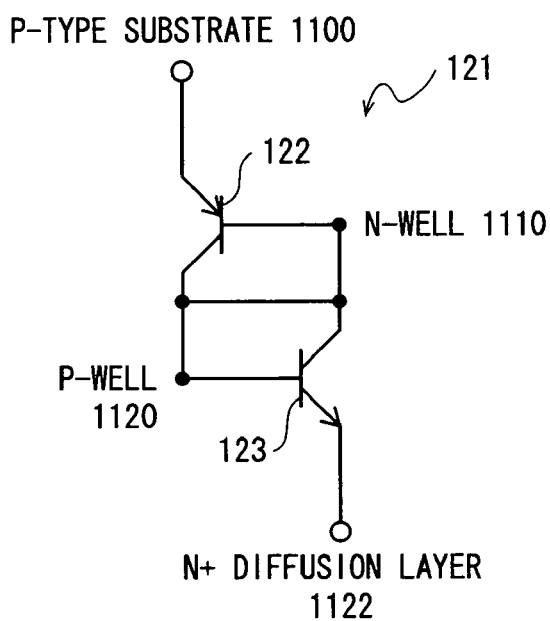
FIG. 3B is a circuit diagram that shows a parasitic thyristor 121 that is parasitic on the diode 115.
Figure 3C:
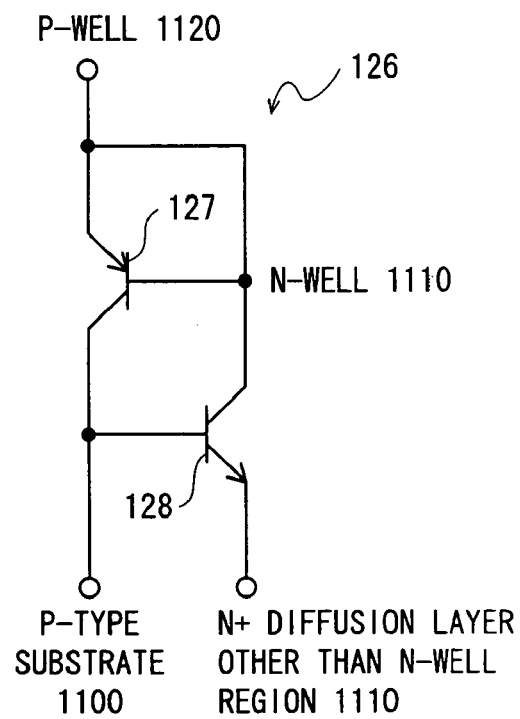
FIG. 3C is a circuit diagram showing a parasitic thyristor 126 that is parasitic on the diode 115.

(1-1) FIG. 3A shows the cross-sectional structure of the diode 115 described in above Embodiment 1, and FIGS. 3B and 3C show an example of a parasitic thyristor present on the substrate on which the diode 115 is formed.

The diode 115 shown in FIG. 3A, as previously described, is configured from the N-well region 1110 formed on the P-type substrate 1100, the P-well region 1120 and the N+ diffusion layer 1111 formed in the N-well region 1110, and the P+ diffusion layer 1121 and the N+ diffusion layer 1122 formed in the P-well region 1120. The N+ diffusion layer 1111 and the P+ diffusion layer 1121 are connected, so the N-well region 1110 and the P-well region 1120 have the same potential. The P-type substrate 1100 is connected to a ground potential (0V).

As shown in FIG. 3B, the diode 115 includes a parasitic thyristor 121, which is configured from the P-type substrate 1100, the N-well region 1110, the P-well region 1120, and the N+ diffusion layer 1122. The parasitic thyristor 121 is equivalent to a circuit in which the parasitic transistors 122 and 123 are connected. The parasitic transistor 122 is a PNP bipolar transistor in which the P-type substrate 1100 is used as an emitter, the N-well region 1110 is used as a base, and the P-well region 1120 is used as a collector. The parasitic transistor 123 is an NPN bipolar transistor in which the N+ diffusion layer 1122 is used as an emitter, the P-well region 1120 is used as a base, and the N-well region 1110 is used as a collector.

When voltage has been applied in the forward direction between the anode terminal and the cathode terminal of the diode 115, forward bias voltage is applied to the PN junction between the N+ diffusion layer 1122 and the P-well region 1120, so minority carrier injection occurs. However, as shown in FIG. 3A, both the N-well region 1110 and the P-well region 1120 have the same potential as the anode terminal. The P-type substrate 1100 has ground potential (0V), and at this time, is in a state with the bias always reversed between the base and the emitter. That is, base current does not flow to the parasitic transistor 122, so the parasitic transistor 122, and therefore also the parasitic thyristor 121, do not operate. Accordingly, even if minority carrier injection occurs at the PN junction face, latch-up does not occur in the diode 115.

As shown in FIG. 3C, a parasitic thyristor 126 may be present on the substrate on which the diode 115 is configured, the parasitic thyristor 126 being configured from the P-well region 1120, the N-well region 1110, the P-type substrate 1100, and an N-type diffusion layer other than the N-well region 1110 on the P-well substrate 1100.

The parasitic thyristor 126 is equivalent to a circuit in which the parasitic transistors 127 and 128 are connected. The parasitic transistor 127 is a PNP bipolar transistor configured using the P-well region 1120 as an emitter, using the N-well region 1110 as a base, and using the P-type substrate 1100 is used as a collector. The parasitic transistor 128 is an NPN bipolar transistor configured using the N-well region 1110 as a collector, using the P-type substrate 1100 as a base, and using an N-type diffusion layer other than the N-well region 1110 on the P-type substrate 1100 as an emitter.

In this configuration, the N-well region 1110 and the P-well region 1120 have the same potential. That is, there is no difference in potential between the base and the emitter of the parasitic transistor 127, so base current does not flow between the base and the emitter, and thus the parasitic transistor 127, and therefore also the parasitic thyristor 126, do not operate. Accordingly, latch-up is not caused in the diode 115 due being affected by other regions on the P-type substrate 1100 on which the diode 115 is formed.

Figure 4:
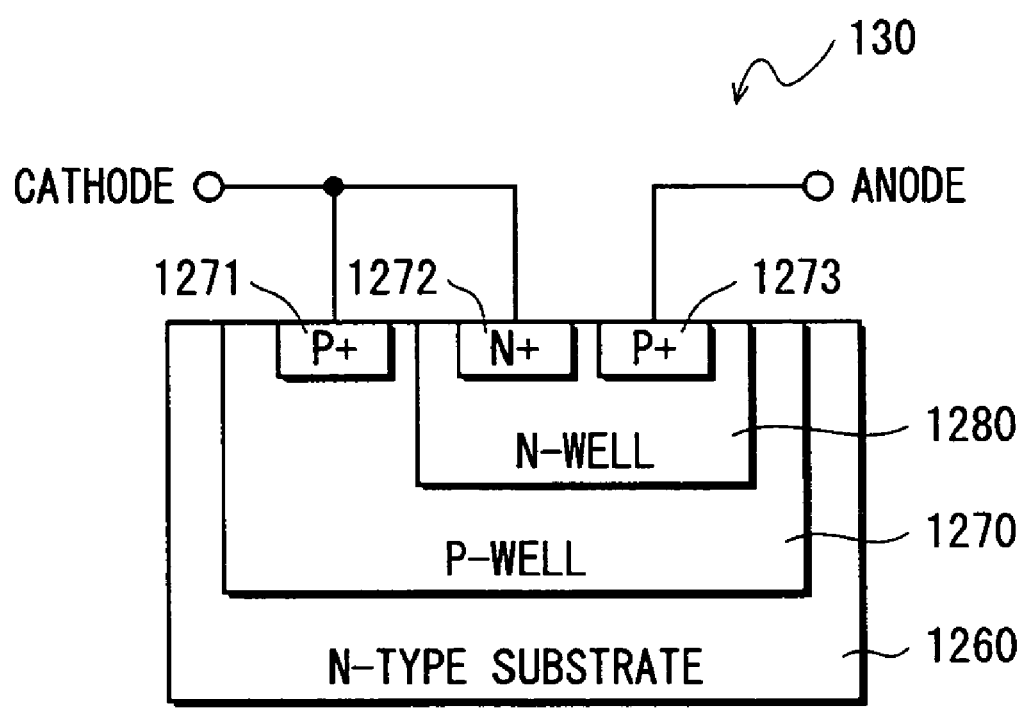
FIG. 4 is a cross-sectional diagram that shows the structure of a diode 130.

(1-2) FIG. 4 is a cross-sectional diagram that shows the configuration of a diode 130 that operates similarly to the diode 115 described in (1-1), formed on an N-type substrate. The diode 130 is configured from a P-well region 1270 formed on an N-type substrate 1260, a P+ diffusion layer 1271 and an N-well region 1280 formed in the P-well region 1270, and an N+ diffusion layer 1272 and a P+ diffusion layer 1273 formed in the N-well region 1280. The N-type substrate 1260 is connected to a power source potential.

When potential is applied in the forward direction between the anode terminal and the cathode terminal of the diode 130, forward bias voltage is applied to the PN junction face between the P+ diffusion layer 1273 and the N-well region 1280, causing minority carrier injection. However, because the N-well region 1280 and the P-well region 1270 have the same potential, latch-up due to the parasitic thyristor is not caused even if minority carrier injection occurs.

(2) Diode Satisfying Condition 2

Following is a description of a transistor that functions as a diode satisfying above Condition 2.

(2-1) As one transistor that functions as a diode satisfying Condition 2, an NMOS transistor is conceivable in which the back gate is connected to a ground potential, and the drain is connected with the gate electrode. In this case the NMOS transistor functions as a diode in which the terminal to which the drain and the gate electrode are connected is used as the anode terminal, and the source is used as the cathode terminal. When the difference in potential between the gate and the source exceeds a threshold voltage of the NMOS transistor, the NMOS transistor becomes conductive.

Figure 5:
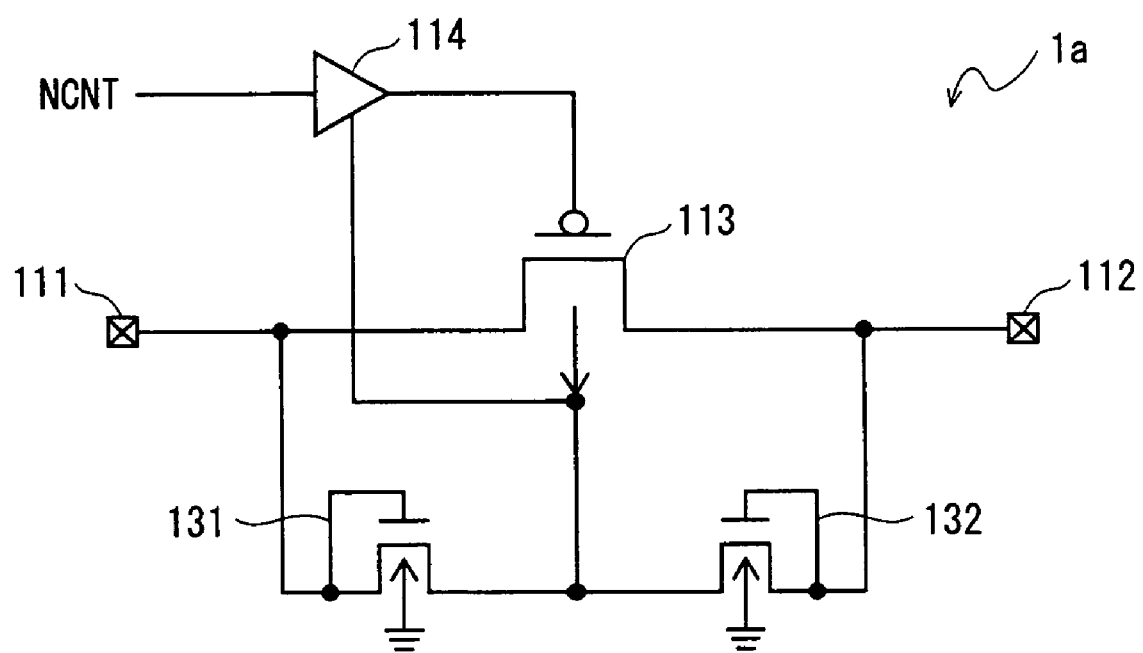

FIG. 5 shows a switch circuit 1a provided with transistors 131 and 132 having this configuration, instead of the diodes 115 and 116 of the switch circuit 1 shown in FIG. 1. In FIG. 5, the parasitic diodes 117 and 118 are omitted.

In this configuration, the back gate of the transistor 131 always has ground potential (0V). When the difference in potential between the input-output terminal 111 and the back gate of the PMOS transistor 113 is greater than the threshold voltage of the transistor 131, an N-type channel layer is formed in the back gate of the transistor 131, so that it is possible to transmit potential from the input-output terminal 111 to the PMOS transistor 113. A PN junction face is present between the N+ diffusion layer where the source and the drain of the transistor 131 are formed and the P-well region, but at this time, in the transistor 131, current is allowed to flow in the channel so minority carrier injection does not occur at the PN junction face.

The configuration and function of the transistor 132 is the same as that of the transistor 131.

When the potentials applied to the input-output terminals 111 and 112 are respectively Va and Vb, and the potential of the back gate of the PMOS transistor 113 prior to applying Va and Vb to the input-output terminals 111 and 112 is Vbac, in a state of ordinary usage, either Va>Vbac>Vb or Vb>Vbac>Va is satisfied, so that the transistors 131 and 132 are not in the on state at the same time. Accordingly, the transistors 131 and 132 function as diodes in which minority carrier injection does not occur.

(2-2) Also, a PMOS transistor is conceivable in which the drain, the gate electrode, and the back gate are connected. In this case, the PMOS transistor functions as a diode in which the terminal to which the drain, the gate electrode, and the back gate are connected is used as the cathode terminal, and the source is used as the anode terminal. When the difference in potential between the source and the drain exceeds a threshold value, the PMOS transistor enters the on state, and current is allowed to flow from the anode terminal to the cathode terminal.

Figure 6:
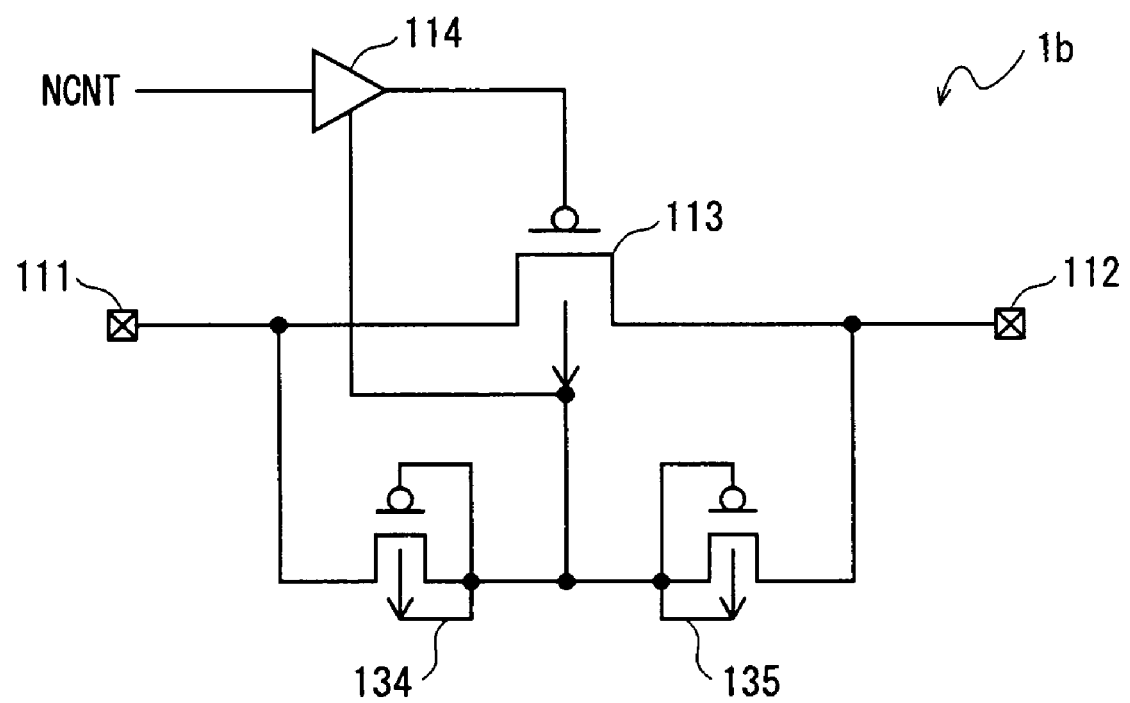
FIG. 6 is a circuit diagram that shows the configuration of a switch circuit 1b.
Figure 7:
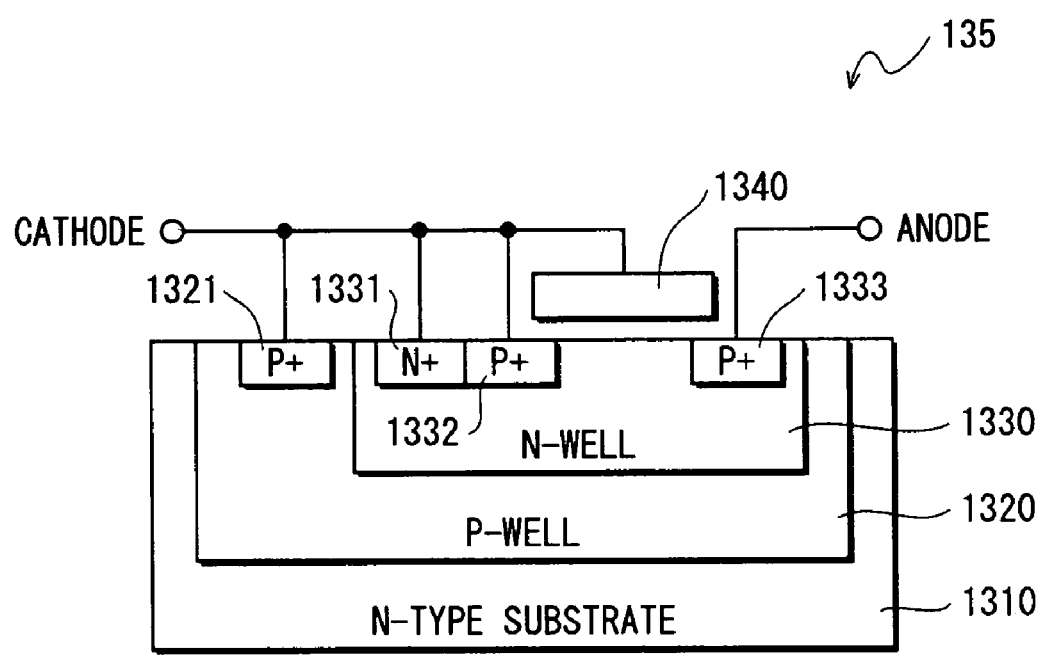
FIG. 7 is a cross-sectional diagram that shows the cross-sectional structure of a transistor 135.

FIG. 6 shows a switch circuit 1b provided with transistors 134 and 135 according to this configuration, instead of the diodes 115 and 116 shown in FIG. 1. In FIG. 6, the parasitic diodes 117 and 118 are omitted. FIG. 7 is a cross-sectional diagram that shows the configuration of the transistor 135.

The transistor 135 is configured from a P-well region 1320 formed on an N-type substrate 1310, a P+ diffusion layer 1321 and an N-well region 1330 formed in the P-well region 1320, and an N+ diffusion layer 1331, a P+ diffusion layer 1332, a P+ diffusion layer 1333 formed in the N-well region 1330, and a gate electrode 1340. The N-type substrate 1310 is connected to a power source potential.

A parasitic thyristor is present on the substrate on which the transistor 135 is formed. Conceivable as examples are a parasitic thyristor configured from the N-well region 1330, the P-well region 1320, the N-type substrate 1310, and a P-type diffusion layer other than the P-well region 1320 on the N-type substrate 1310, and a parasitic thyristor configured from the P+ diffusion layer 1333, the N-well region 1330, the P-well region 1320, and the N-type substrate 1310. However, same as in the case of the diode 115 described in (1-1) above, because the adjacent N-well region 1330 and P-well region 1320 have the same potential, these parasitic thyristors do not operate.

In the transistor 135, when the difference in potential between the gate and the source exceeds the threshold voltage of the transistor 135, a P-type channel region is formed and thus the transistor 135 enters the on state.

When potential is transmitted from the anode terminal to the cathode terminal, potential is applied in the forward bias direction to the PN junction face between the N-well region 1330 and the P+ diffusion layer 1333, but in the transistor 135, there is substantially no occurrence of minority carrier injection, because current flows more dominantly to the channel region than the PN junction face.

The configuration and function of the transistor 134 is the same as the transistor 135.

As also described in above (2-1), in ordinary use, the potential input to the input-output terminals 111 and 112 satisfy either Va>Vbac>Vb or Vb>Vbac>Va, and thus the transistors 134 and 135 do not enter the on state at the same time.

Accordingly, the transistors 134 and 135 function as diodes in which there is substantially no occurrence of minority carrier injection.

(2-3) Also, an NMOS transistor is conceivable in which the drain, the gate electrode, and the back gate are connected. In this case, the NMOS transistor functions as a diode in which the terminal to which the drain, the gate electrode, and the back gate are connected is used as the anode terminal, and the source is used as the cathode terminal. When the difference in potential between the drain and the source is equal to or greater than a threshold voltage, the NMOS transistor enters the on state.

Figure 8:
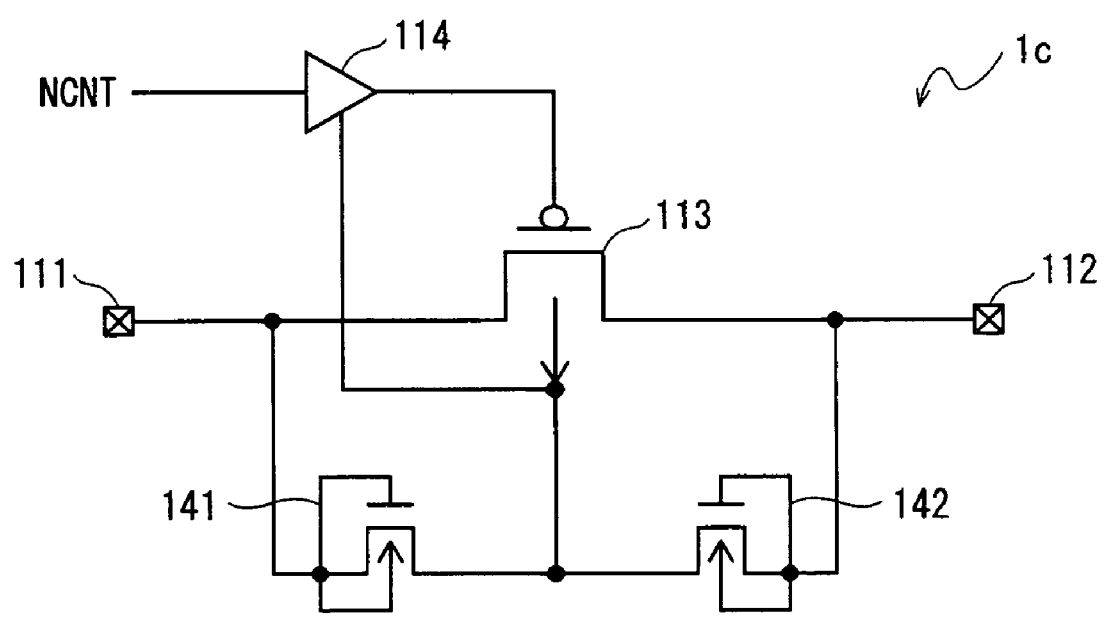
FIG. 8 is a circuit diagram that shows the configuration of a switch circuit 1c.
Figure 9:
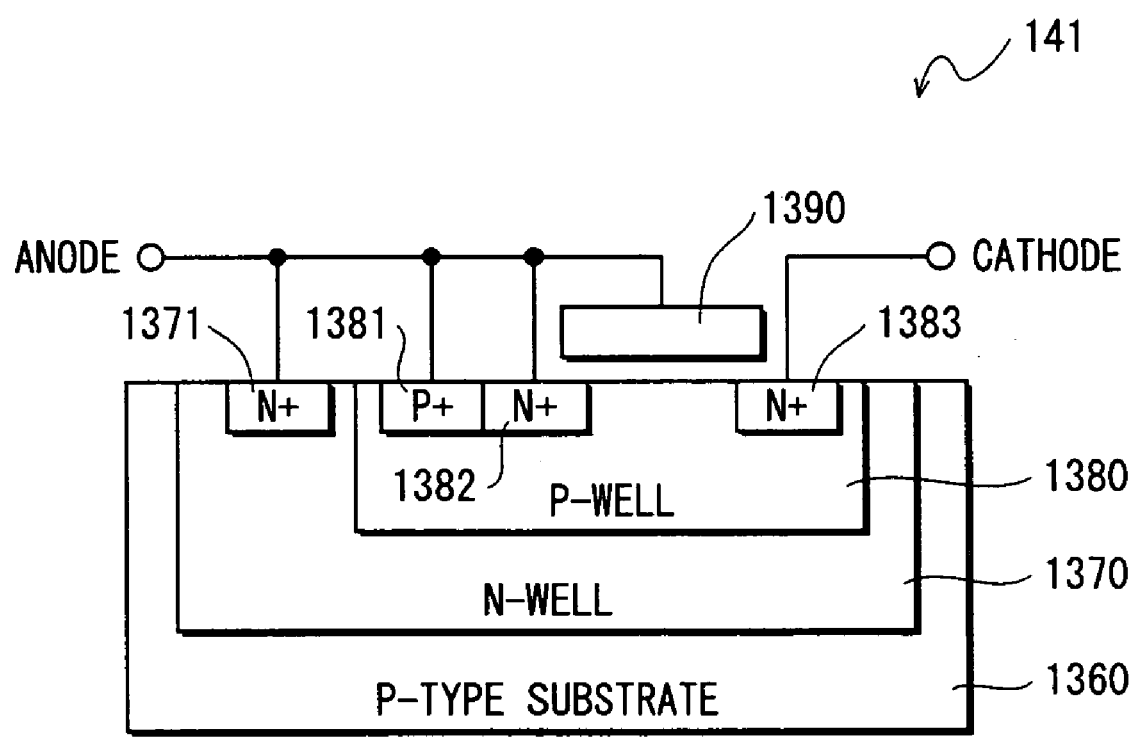
FIG. 9 is a cross-sectional diagram that shows the cross-sectional structure of a transistor 141.

FIG. 8 shows a switch circuit 1c provided with transistors 141 and 142 according to this configuration, instead of the diodes 115 and 116 shown in FIG. 1. FIG. 9 shows the cross-sectional structure of the transistor 141.

As shown in FIG. 9, the transistor 141 is configured from an N-well region 1370 formed on a P-type substrate 1360, an N+ diffusion layer 1371 and a P-well region 1380 formed in the N-well region 1370, and a P+ diffusion layer 1381 and N+ diffusion layers 1382 and 1383 formed in the P-well region 1380. The P-type substrate 1360 is connected to a ground potential.

Same as in the case of above (1-1) and (2-2), because the adjacent P-well region 1380 and N-well region 1370 have the same potential, latch-up does not occur in parasitic thyristors of the transistor 141.

In the transistor 141, when the difference in potential between the gate and the source exceeds the threshold voltage, an N-type channel region is formed and thus, via the channel region, current flows from the anode terminal to the cathode terminal. When doing so, forward bias voltage is applied to the PN junction face between the P-well region 1380 and the N+ diffusion layer 1383. However, same as in the case of (2-1) and (2-2) above, in the transistor 141, there is substantially no occurrence of minority carrier injection, because current flows more dominantly via the channel region than the PN junction face.

The configuration and function of the transistor 142 is the same as that of the transistor 141. Also, same as in the case of (2-2), the transistors 141 and 142 are never in the on state at the same time.

(4) As described above, a PN junction diode with the configuration in (1) above does not cause latch-up even if minority carrier injection occurs.

Also, a transistor with the configuration in (2) functions as a diode in which there is substantially no occurrence of minority carrier injection. In particular, by setting the threshold voltage of the transistor to less than the built-in potential of a parasitic diode formed by a PN junction face within the transistor, the difference between the current that flows via the PN-junction face and the current that flows through the channel region is enlarged, and thus it is possible to reduce the risk that latch-up will occur.

Also, in the diode in (1), and the transistors with the configuration in (2-2) and (2-3), by adopting the same potential for the adjacent P-well region and N-well region, latch-up caused by surrounding circuits on the same substrate does not occur.

Also, compared to a Schottky barrier diode, a transistor according to (2) above has the merit that it can be produced using widespread transistor production processes as-is, without including a process of producing a Schottky barrier junction.

Further, because minority carrier injection does not occur in a diode that satisfies Condition 2, it is not necessary to be concerned about latch-up caused by the diode itself. Accordingly, there is the benefit that when configuring a switch circuit adopting a plurality of these diodes, there is greater freedom in the cross-sectional structure of the switch circuit.

2. Embodiment 2

Following is a description of a switch circuit 2 according to Embodiment 2 of the present invention.

2.1. Overview of Switch Circuit 2

The switch circuit 2 allows current to flow or be cut off between two input-output terminals using an NMOS transistor 153, and is provided with two diodes that are connected in parallel to a parasitic diode that is parasitic on a PN junction face between a back gate and the drain and the source of the NMOS transistor 153. Forward bias current that flows into the parasitic diode between the back gate and the drain or the source is mitigated by these diodes, thus preventing latch-up due to a parasitic thyristor present on the substrate on which the switch circuit 2 is formed.

2.2 Configuration of Switch Circuit 2

Figure 10:
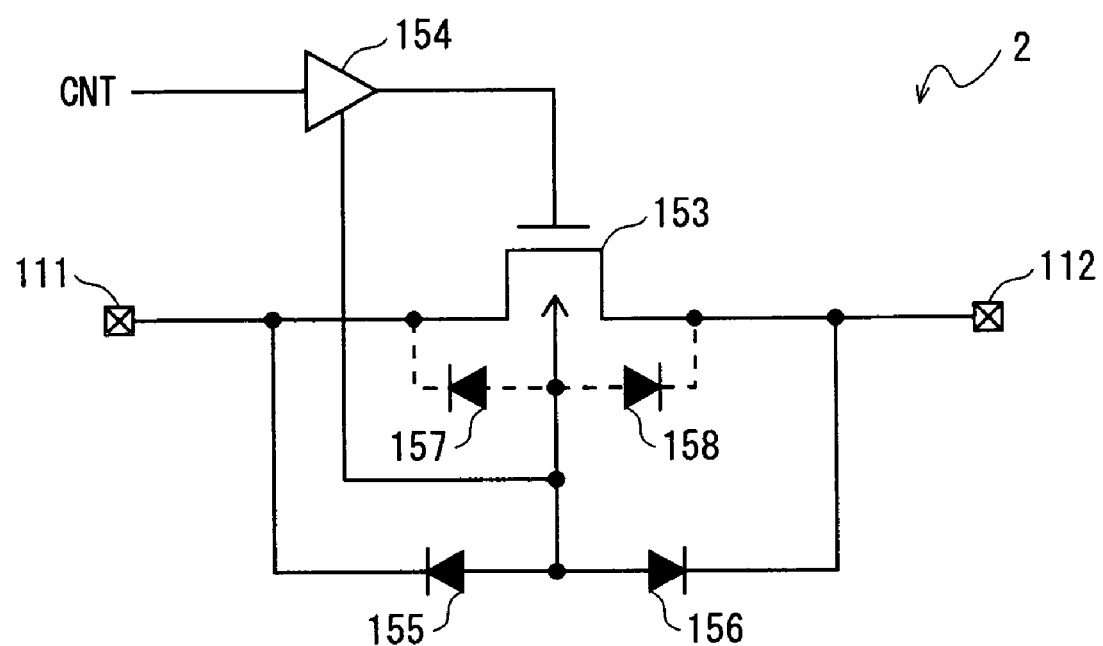
FIG. 10 is a circuit diagram that shows the configuration of a switch circuit 2.

FIG. 10 is circuit diagram that shows the configuration of the switch circuit 2. In FIG. 10, the same reference numerals are given to the same elements of the configuration as in the switch circuit 1 in Embodiment 1.

As shown in FIG. 10, the switch circuit 2 is configured from an NMOS transistor 153, diodes 155 and 156, a level shift circuit 154, and the input-output terminals 111 and 112. Either the drain or the source of the NMOS transistor 153 is connected to the input-output terminal 111, and the other is connected to the input-output terminal 112. An input terminal of the level shift circuit 154 is connected to an external circuit that outputs a control signal CNT, and an output terminal is connected to a gate electrode of the NMOS transistor 153. A negative high voltage power terminal is connected to the back gate of the NMOS transistor 153. The anode terminal of the diode 155 is connected to the back gate of the NMOS transistor 153, and the cathode terminal of the diode 155 is connected to the input-output terminal 111. The anode terminal of the diode 156 is connected to the back gate of the NMOS transistor 153, and the cathode terminal of the diode 156 is connected to the input-output terminal 112.

Also, parasitic diodes 157 and 158 are parasitic diodes present in the NMOS transistor 153.

Figure 11:
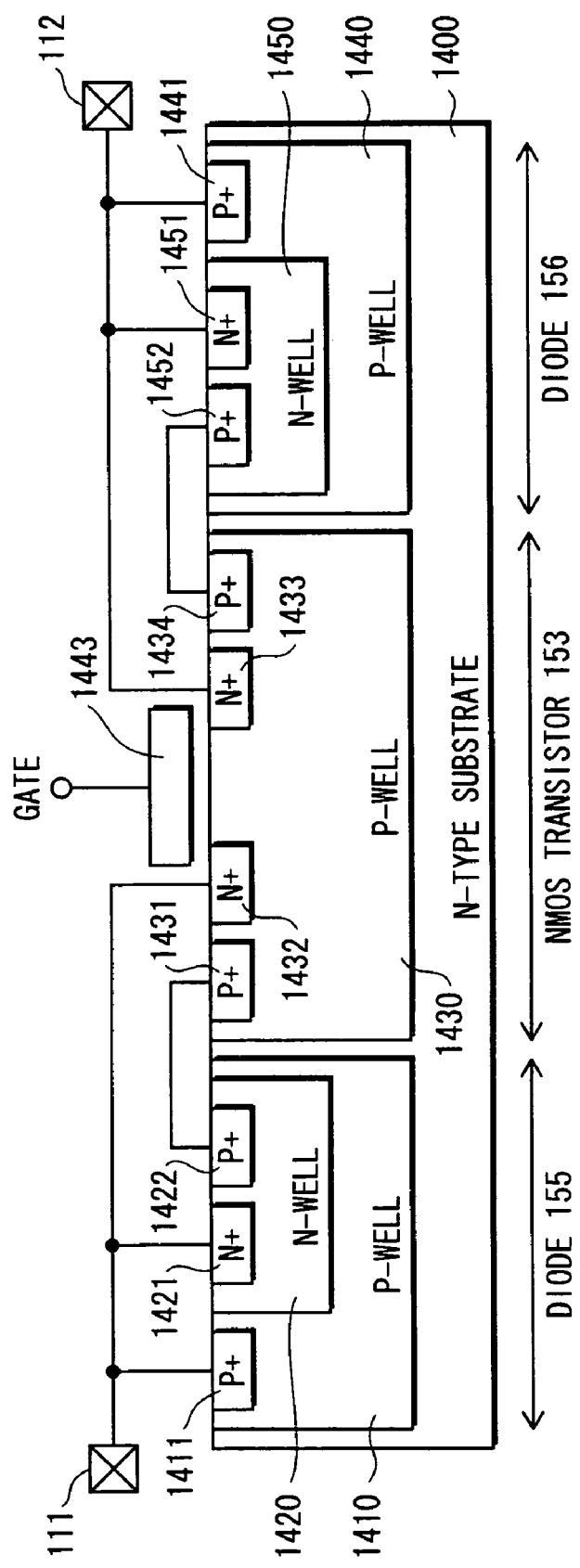
FIG. 11 is a cross-sectional diagram that shows the cross-sectional structure of the switch circuit 2.

FIG. 11 shows an example cross-section of a substrate on which the switch circuit 2 shown in FIG. 10 has been formed. In FIG. 11, the level shift circuit 154 shown in FIG. 10 is omitted.

(1) NMOS Transistor 153

As shown in FIG. 11, the NMOS transistor 153 is configured from a P-well region 1430 formed on an N-type substrate 1400, N+ diffusion layers 1432 and 1433 formed in the P-well region 1430, and a gate electrode 1443. Although not shown in FIG. 11, an insulating oxide film is formed between the gate electrode 1443 and the P-well region 1430. The N-type substrate 1400 is connected to a ground potential.

Here, a PN junction between the N+ diffusion layer 1432 and the P-well region 1430 is the parasitic diode 157, and a PN junction between the N+ diffusion layer 1433 and the P-well region 1430 forms the parasitic diode 158.

In the NMOS transistor 153, when electric potential is transmitted bi-directionally and the potential of the input-output terminal 111 is higher than the potential of the input-output terminal 112, the N+ diffusion layer 1432 functions as the drain, and the N+ diffusion layer 1433 functions as the source. Conversely, when the potential of the input-output terminal 112 is higher than the potential of the input-output terminal 111, the N+ diffusion layer 1432 functions as the source, and the N+ diffusion layer 1433 functions as the drain.

As shown in FIGS. 10 and 11, the N+ diffusion layer 1432 of the NMOS transistor 153 is connected to the input-output terminal 111, and the N+ diffusion layer 1433 is connected to the input-output terminal 112. The NMOS transistor 153 is connected to the anode terminal of the diodes 156 and 157 via P+ diffusion layers 1431 and 1434 formed in the P-well region 1430 (the back gate). Thus, the potential of the P-well region 1430 (the back gate) is the same as the lower potential among the potentials of the input-output terminals 111 and 112. The gate electrode 1443 is connected to the output terminal of the level shift circuit 154.

In the NMOS transistor 153, a signal with the same potential as the power source potential, or a signal with the same potential as the back gate of the NMOS transistor 153, is input from the level shift circuit 154 to the gate electrode, and according to the potential of the input signal, the NMOS transistor 113 is switched on-off.

Specifically, when a signal with the same potential as the back gate of the NMOS transistor 153 is input, the NMOS transistor 153 enters the off state and the connection between the input-output terminals 111 and 112 is cut off. When a signal with the same potential as the power source is input, an N-type channel is formed in the P-well region 1430 and the NMOS transistor 153 enters the on state, so that current flows between input-output terminals 111 and 112.

In the above configuration, even when the potential of the gate electrode of the NMOS transistor 153 is the power source potential, if the difference in potential between the gate electrode and either the source or the drain (the N+ diffusion layers 1432 and 1433) is less than a threshold voltage of the NMOS transistor 153, the NMOS transistor 153 will not enter the on state. Accordingly, the potential that the switch circuit 2 can transmit is limited to not more than a value obtained by subtracting the threshold voltage of the NMOS transistor 153 from the power source potential.

(2) Diodes 155 and 156

As shown in FIG. 11, the diode 155 is configured from a P-well region 1410 formed on the N-type substrate 1400, an N-well region 1420 and a P+ diffusion layer 1411 formed in the P-well region 1410, and an N+ diffusion layer 1421 and a P+ diffusion layer 1422 formed in the N-well region 1420. In the diode 155, the P+ diffusion layer 1411 and the N+ diffusion layer 1421 are connected to the cathode terminal, and the P+ diffusion layer 1422 is connected to the anode terminal.

The cathode terminal of the diode 155 is connected to the input-output terminal 111, and the P-well region 1410 and the N-well region 1420 have the same potential as the input-output terminal 111. The anode terminal is connected to the back gate of the NMOS transistor 153 via the P+ diffusion layer 1431. When the potential of the input-output terminal 111 is lower than the potential of the back gate of the NMOS transistor 153, the diode 155 is conductive, so the potential of the back gate of the NMOS transistor 153 is reduced to the potential of the input-output terminal 111. Conversely, when the potential of the input-output terminal 111 is higher than the potential of the back gate of the NMOS transistor 153, the diode 155 is not conductive, so the transmission of the potential of the input-output terminal 111 is cut off.

As shown in FIG. 11, the diode 156 is configured from a P-well region 1440 formed on the N-type substrate 1400, a P+ diffusion layer 1441 and an N-well region 1450 formed in the P-well region 1440, and an N+ diffusion layer 1451 and a P+ diffusion layer 1452 formed in the N-well region 1450. In the diode 156, the P+ diffusion layer 1441 and the N+ diffusion layer 1451 are connected to the cathode terminal, and the P+ diffusion layer 1452 is connected to the anode terminal.

The cathode terminal of the diode 156 is connected to the input-output terminal 112, and the P-well region 1440 and the N-well region 1450 have the same potential. The anode terminal is connected to the back gate of the NMOS transistor 153 via the P+ diffusion layer 1434. The diode 156 becomes conductive when the potential of the input-output terminal 112 is lower than the potential of the back gate of the NMOS transistor 153, so that the potential of the back gate of the NMOS transistor 153 is reduced to the potential of the input-output terminal 112. Conversely, when the potential of the input-output terminal 112 is greater than the potential of the back gate of the NMOS transistor 153, the diode 156 becomes non-conductive, so that transmission of the potential of the input-output terminal 112 is cut off.

The configuration of the diodes 155 and 156 is the same as that of the diode 130 shown in FIG. 4.

(3) Level Shift Circuit 154

The negative high voltage power terminal of the level shift circuit 154 is connected to the back gate of the NMOS transistor 153, and the output terminal is connected to the gate electrode the NMOS transistor 153.

The level shift circuit 154 is able to operate normally by receiving supply of an operating potential of not less than a predetermined operating threshold value, and obtains the operating potential from the back gate of the NMOS transistor 153 via the negative high voltage power terminal. Here, the operating threshold value of the level shift circuit 154 is the ground potential (0V).

The level shift circuit 154 receives an H-level or L-level control signal CNT from an external circuit. When the received control signal is an H-level signal, the power source potential is output, and when the control signal is an L-level signal, the potential of the back gate of the NMOS transistor 153 is output.

2.3 Operation of Switch Circuit 2

Following is a specific description of the operation of the switch circuit 2. Here, it is assumed that the potential of the input-output terminal 111 is −10V, and the potential of the input-output terminal 112 is −3V.

When voltage is applied to the input-output terminals 111 and 112 respectively, current flows in the forward bias direction to the diode 155 and the parasitic diode 157, to reduce the potential of the back gate of the NMOS transistor 153 to −10V.

When the control signal is an H-level signal, the level shift circuit 154 outputs the power source potential to the gate electrode of the NMOS transistor 153. At this time the difference in potential between the gate electrode and the source (the N+ diffusion layer 1432) of the NMOS transistor 153 becomes the power source potential—(−10V), so that the NMOS transistor 153 enters the on state and thus current flows between the input-output terminals 111 and 112.

When the control signal is an L-level signal, the level shift circuit 154 outputs −10V, which is the potential of the back gate of the NMOS transistor 153, to the gate electrode of the NMOS transistor 153. At this time, the difference in potential between the gate and the source of the NMOS transistor 153 becomes zero, so that the NMOS transistor 153 enters the off state and thus current is cut off between the input-output terminals 111 and 112.

When the size relationship of the potentials supplied to the input-output terminals 111 and 112 is reversed, the potential of the back gate of the NMOS transistor 153 is reduced to the potential of the input-output terminal 112 via the diode 156 and the parasitic diode 158, so that the N+ diffusion layer 1433 functions as the source.

2.4 Effects

As described above, in the switch circuit 2 of the present invention, the transmission of potential from the input-output terminal 111 to the back gate of the NMOS transistor 153 is performed by the diode 155, which is formed on the same substrate as the NMOS transistor 153, and the parasitic diode 157, which is between the P-well region 1430 and the N+ diffusion layer 1432 of the NMOS transistor 153. That is, a forward bias voltage is applied to the PN junction used to configure the parasitic diode 157, and forward bias current flows according to the applied voltage. When the forward bias current flows, minority carrier injection occurs at the PN junction face.

As an example of a parasitic element present on the substrate on which the switch circuit 2 is formed, a parasitic thyristor is conceivable that is configured from the N+ diffusion layer 1432, the P-well region 1430, the N-type substrate 1400 and a P-type diffusion layer other than the P-well region 1430 formed on the N-type substrate 1400. This parasitic thyristor is equivalent to a circuit in which a bipolar first parasitic transistor, configured from the N+ diffusion layer 1432, the p-well region 1430, and the N-type substrate 1400, is connected to a bipolar second parasitic transistor, configured from the P-well region 1430, the N-type substrate 1400, and a P-type diffusion layer other than the P-well region 1430 formed on the N-type substrate 1400.

When minority carrier injection occurs at the PN junction face of the N+ diffusion layer 1432 and the P-well region 1430, a base current flows to the first parasitic transistor, and if the potential of the P-type diffusion layer other than the P-well region 1430 is sufficiently high, a collector current flows to the first parasitic transistor, and thus it is possible that latch-up will occur in the parasitic thyristor.

At this time, the number of minority carriers grows as the current that flows through the PN junction forming the parasitic diode 157 increases, and thus the risk that latch-up will occur increases.

Here, the effects of the switch circuit 2 of the present invention will be more specifically described, assuming that in the initial state, the potential of all of the input-output terminals 111 and 112 and the back gate of the NMOS transistor 153 is the ground potential (0V).

When supplying a potential of −10V from an external circuit to the input-output terminal 111, a finite time Ta (Ta>0) is necessary for the potential of the input-output terminal 111 to reach −10V. This can be expressed as $Ea(Ta)=-10V$ when the potential of the input-output terminal 111 for an elapsed time t since starting to supply potential to the input-output terminal 111 is expressed as $Ea(t)$. Also, the potential of the back gate of the NMOS transistor 153 for an elapsed time (t) since starting to supply potential to the input-output terminal 111 is expressed as $E(t)$. $E(t)$ decreases according to the total amount of the charge moved from the back gate, and the total amount of the charge moved from the back gate is proportional to a value obtained by integrating the current between the input-output terminal 111 and the back gate with the time t.

When the elapsed time since starting to supply potential to the input-output terminal 111 is t1 (0≦t1≦Ta), the forward bias voltage applied to the parasitic diode 157 is $E(t1)-Ea(t1)$, so the forward bias voltage applied to the parasitic diode 157 decreases as the potential of the back gate decreases, or in other words, decreases as the amount of the charge moved from the back gate during the passage of time t1 increases. The forward bias current that flows to the parasitic diode 157 decreases as the applied forward bias voltage decreases.

In the switch circuit 2 of the present invention, the parasitic diode 157 and the diode 155 are connected in parallel, and movement of a charge to the back gate is performed by both, so the speed with which the charge is moved is comparatively faster than when the diode 155 is not present. Accordingly, because the potential $E(t1)$ of the back gate at the point in time of elapsed time t1 is lower than when the diode 155 is not present, the forward bias voltage $E(t1)-Ea(t1)$ applied to the parasitic diode 157 is reduced. Thus, the forward direction current that flows to the parasitic diode 157 is also reduced, and therefore it is possible to suppress the occurrence of latch-up in the parasitic thyristor.

Conversely, also when the potential of the input-output terminal 112 is lower than the potential of the input-output terminal 111, because the diode 156 is present, it is possible to achieve suppression of latch-up of the parasitic thyristor, which includes the PN junction face between the N+ diffusion layer 1433 and the P-well region 1430.

By, in this manner, respectively providing the diodes 155 and 156 in parallel with the parasitic diodes 157 and 158 of the NMOS transistor 153, in the switch circuit 2 of the present invention, it is possible to suppress the occurrence of latch-up in both the transmission of potential from the input-output terminal 111 to the input-output terminal 112, and the transmission of potential from the input-output terminal 112 to the input-output terminal 111.

Moreover, in the switch circuit 2, the lower potential among the potentials of the input-output terminals 111 and 112 is transmitted to the back gate of the NMOS transistor 153, and the level shift circuit 154 acquires an operating potential from the back gate of the NMOS transistor 153 via the negative high voltage power terminal. Accordingly, the switch circuit 2 can allow current to flow or be cut off between the input-output terminal 111 and the input-output terminal 112 without requiring a special external power source to the level shift circuit 154.

2.5 Modified Example of Embodiment 2

In the above description, as shown in FIG. 11, the diodes 155 and 156 were described as PN junction diodes formed from the PN junction of a P+ diffusion layer and an N-well region, but diodes configured as desired may be used. However, because the diodes used here are intended to mitigate the current that flows to the parasitic diodes 157 and 158, they actively allow current to flow therethrough. Therefore, it is desirable that the diodes themselves have a configuration that does not cause latch-up. Thus, same as in the case of Embodiment 1, it is necessary to satisfy one of the following two conditions.

Condition 1: latch-up is not caused even if minority carrier injection occurs when forward bias current flows to the PN junction face included in a diode.

Condition 2: minority carrier injection does not occur even if forward direction bias current is allowed to flow.

The above diodes 155 and 156 satisfy Condition 1. A diode with the configuration shown in FIG. 3A described in Embodiment 1 is conceivable as a diode that satisfies Condition 1.

With respect to a circuit that satisfies Condition 2, an example is conceivable in which a Schottky barrier diode and a transistor are used as diodes, as described in section 1.5 of Embodiment 1. Schottky barrier diodes are well known technology, and therefore are not described here.

Following is a description of a transistor that functions as a diode that satisfies Condition 2.

(1) A PMOS transistor in which the back gate is connected to a power source potential and the drain is connected to the gate electrode is conceivable as one transistor that functions as a diode that satisfies Condition 2. This PMOS transistor functions as a diode in which the drain and the gate electrode are connected to the cathode terminal, and the source is connected to the anode terminal. The PMOS transistor enters the on state when the difference in potential between the gate and the source is equal to or greater than a threshold voltage.

Figure 12:
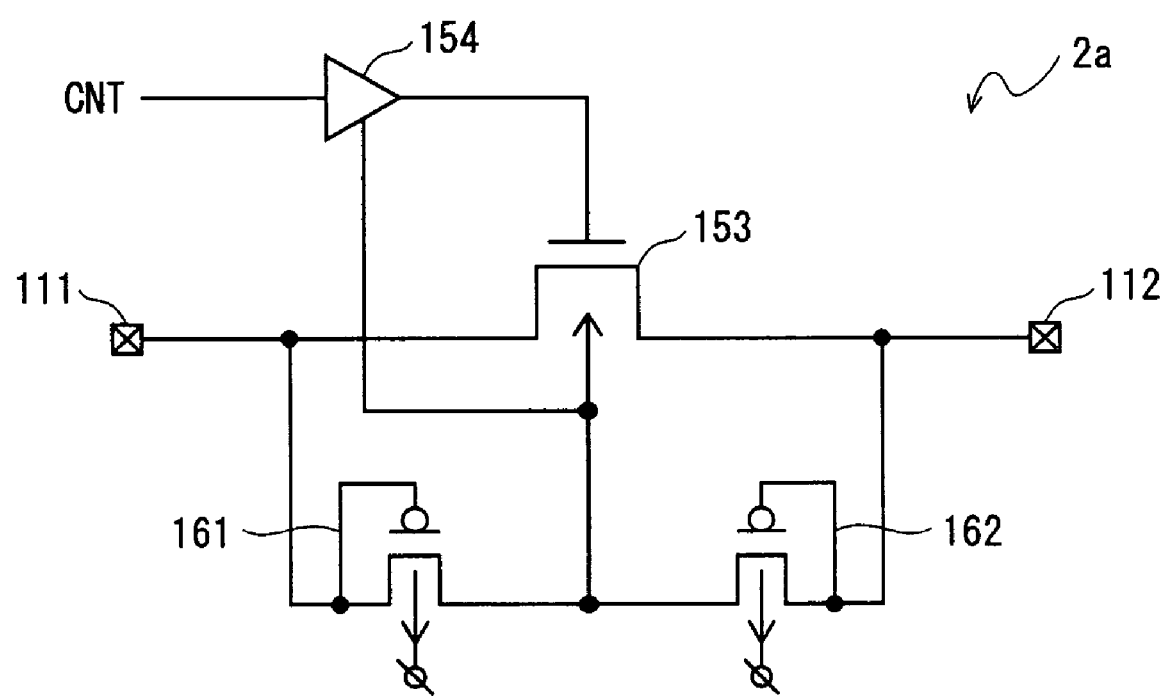

FIG. 12 shows a switch circuit 2a provided with transistors 161 and 162 with this configuration instead of the diodes 155 and 156 of the switch circuit 2 in FIG. 10. In FIG. 12, the parasitic diodes 157 and 158 are omitted.

In this configuration, the back gate of the transistor 161 always has the power source potential. The difference in potential between the drain and the source, that is, the difference in potential between the potential of the back gate of the NMOS transistor 153 and potential applied to the input-output terminal 111 is greater than the threshold voltage of the transistor 161, a P-type channel layer is formed in the back gate of the transistor 161, and the transistor 161 enters the on state. Thus, the potential of the back gate of the NMOS transistor 153 can be reduced to the potential of the input-output terminal 111. A PN junction face is present between the N+ diffusion layer where the source and the drain of the transistor 161 are formed and the P-well region, and at this time, in the transistor 161, current flows more dominantly to the channel, and thus there is substantially no occurrence of minority carrier injection at the PN junction face.

Figure 13:
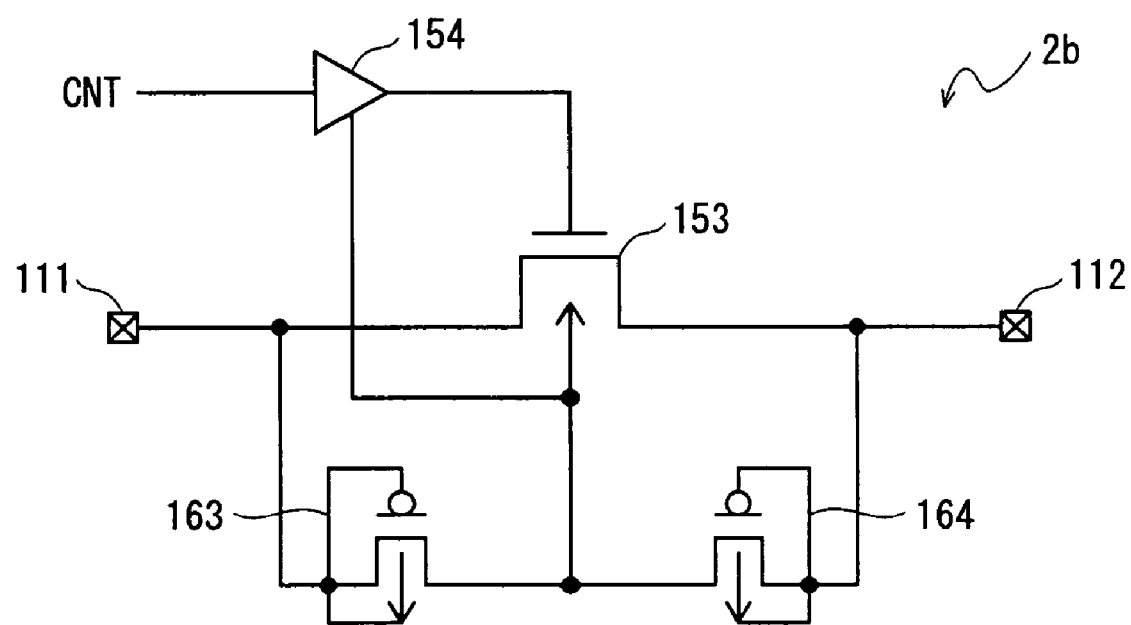
FIG. 13 is a circuit diagram that shows the configuration of a switch circuit 2b.

(2) FIG. 13 shows a switch circuit 2b in which transistors 163 and 164 are used instead of the diodes 155 and 156 in the switch circuit 2. The transistors 163 and 164 have the same configuration as the transistor 135 shown in FIG. 7, and function as diodes in which the source is connected to the anode terminal, and the drain, the gate electrode and the back gate are connected to the cathode terminal. This transistor was already described with reference to FIGS. 6 and 7, and thus is not described again here.

Figure 14:
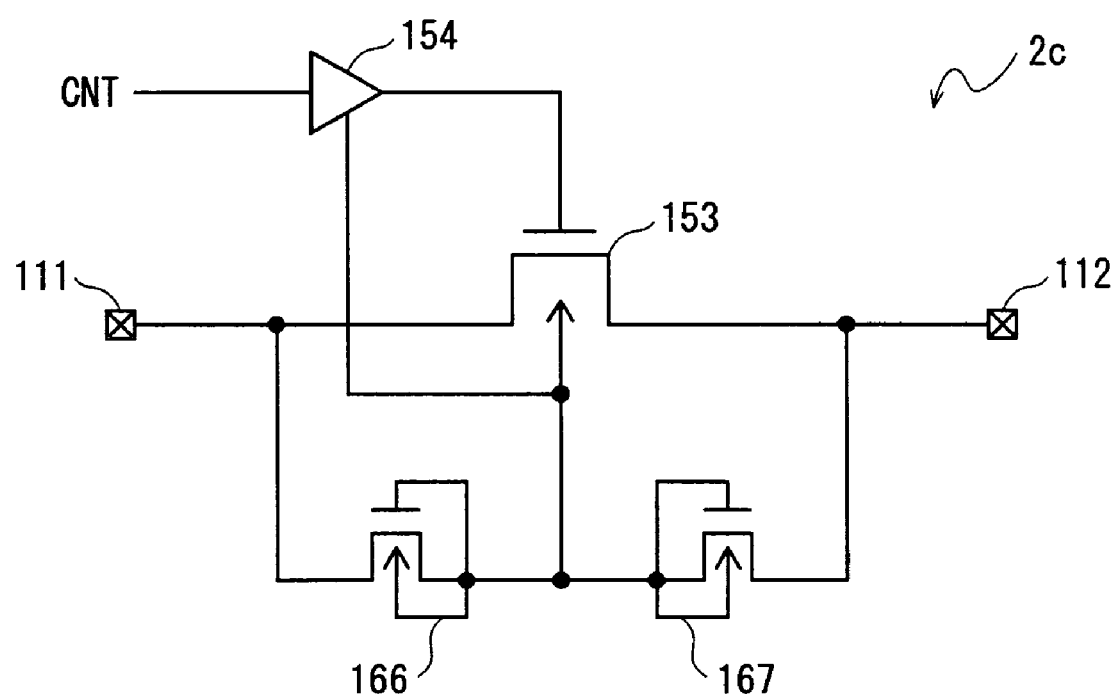
FIG. 14 is a circuit diagram that shows the configuration of a switch circuit 2c.

(3) FIG. 14 shows a switch circuit 2c in which transistors 166 and 167 are used instead of the diodes 155 and 156 in the switch circuit 2. The transistors 166 and 167 have the same configuration as the transistor 141 shown in FIG. 9, and function as diodes in which the drain, the gate electrode and the back gate of an NMOS transistor are connected to the anode terminal, and the source of a PMOS transistor is connected to the cathode terminal. This transistor was already described with reference to FIGS. 8 and 9, and thus is not described again here.

(4) Because latch-up is not caused in the transistors and diodes configured as described above, they are adopted in the switch circuit of the present invention.

3. Embodiment 3

Following is a description of a switch circuit 3 according to Embodiment 3 of the present invention, with reference to the accompanying drawings.

3.1 Overview of Switch Circuit 3

In the switch circuit 3, a diode is further connected to the switch circuit 1 described in Embodiment 1. In this diode, the anode terminal is connected to a power source potential, and the cathode terminal is connected to the back gate of the PMOS transistor 113. The potential of the back gate of the PMOS transistor 113 is, at least, not less than the power source potential, and so the level shift circuit can operate normally even when the potential input from an input-output terminal is less than an operating threshold value of the level shift circuit.

In the following description, a description of the same portions as in Embodiment 1 is omitted, so that mainly distinguishing portions of the present embodiment are described. Also, in FIG. 15, constituent elements that are the same as in Embodiment 1 have the same reference numerals.

3.2 Configuration of Switch Circuit 3

Figure 15:
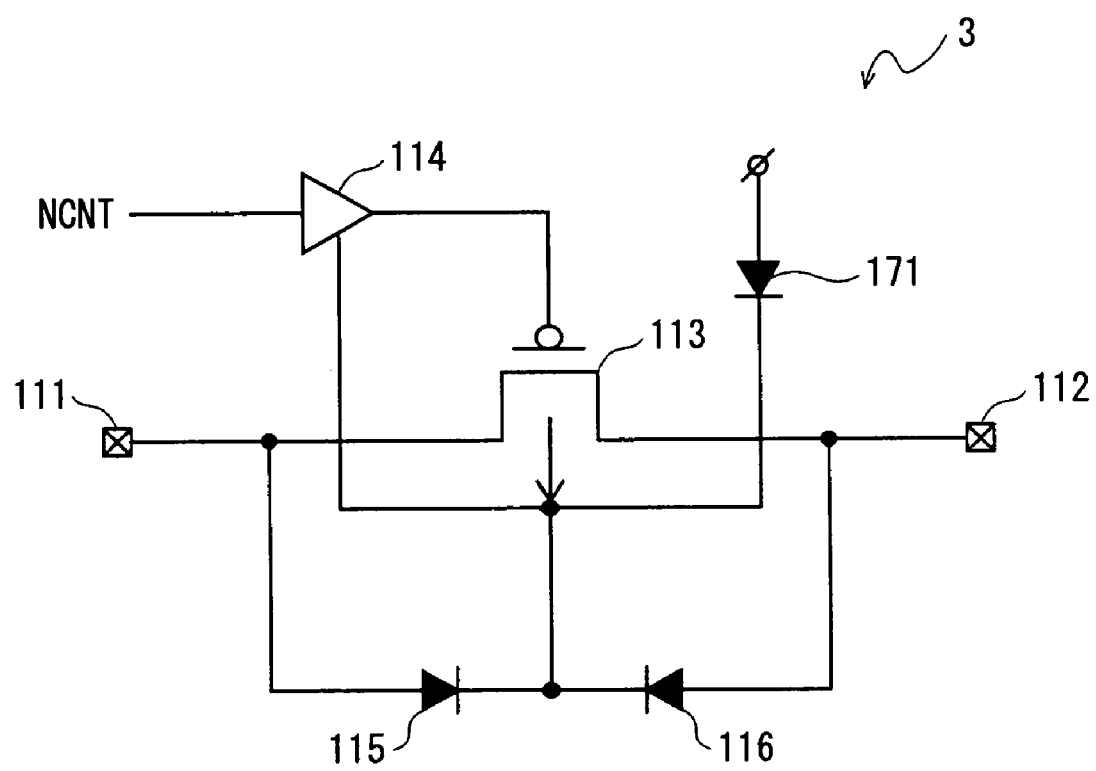
FIG. 15 is a circuit diagram that shows the configuration of a switch circuit 3.

As shown in FIG. 15, the switch circuit 3 is configured from the input-output terminals 111 and 112, the PMOS transistor 113, the diodes 115 and 116, the level shift circuit 114, and a diode 171. Although omitted in FIG. 15, same as in the switch circuit 1 shown in FIG. 1, the PMOS transistor 113 includes the two parasitic diodes 117 and 118. The constituent elements other than the diode 171 and their connections to each other are the same as in the switch circuit 1 of Embodiment 1, and so a description thereof is omitted here.

In the diode 171, the anode terminal is connected to a power source potential, and the cathode terminal is connected to the back gate of the PMOS transistor 113. When the potential of the back gate of the PMOS transistor 113 is less than the power source potential, the on state is entered, and thus the power source potential is transmitted to the back gate of the PMOS transistor 113. A diode configured as desired can be adopted as the diode 171, but here, the diode 171 has the same configuration as the diode 115 shown in FIG. 3A.

The operation of the switch circuit 3 is the same as that of the switch circuit 1 in Embodiment 1, and so a description thereof is omitted here.

3.3 Effects

With the above configuration, the potential of the back gate of the PMOS transistor 113 used to configure the switch circuit 3 is the same as the highest potential among the potential of the input-output terminal 111, the potential of the input-output terminal 112, and the power source potential.

In the level shift circuit 114 used to configure the switch circuit 3, the positive high voltage power terminal is connected to the back gate of the PMOS transistor 113, and acquires an operating potential from the back gate. If the acquired operating potential is equal to or greater than an operating threshold value, the switch circuit 3 operates normally.

In the switch circuit 3 of the present invention, even when the potential of the input-output terminals 111 and 112 is less than the operating threshold value of the level shift circuit 114, the power source potential is supplied via the diode 171 and the back gate of the PMOS transistor 113. Thus, the level shift circuit 114 can always control the on-off state of the PMOS transistor 113 normally.

3.4 Modified Example

A PN junction diode as shown in FIGS. 3A to 3C is used as the diodes 115, 116, and 171 used to configure the above switch circuit 3, but any desired diode may be used. However, as also stated in Embodiment 1, the diodes 115 and 116 are intended to mitigate the forward bias current that flows to the parasitic diode of the PMOS transistor 113, and thus it is necessary that they actively allow a large current to flow. Also, when the potential of the input-output terminals 111 and 112 is low, potential is transmitted to the back gate of the PMOS transistor 113 only by the diode 171. Accordingly, it is desirable to have a configuration in which latch-up is not caused, and more specifically, it is desirable that one of the two conditions stated in Embodiment 1 is satisfied.

In the above switch circuit 3, a PN junction diode with the configuration shown in FIG. 3A was adopted as a diode that satisfies Condition 1, but a PN junction diode with the configuration shown in FIG. 4 may be used instead.

Also, as described also in Embodiment 1, a transistor that functions as a diode that satisfies Condition 2 may be used. This transistor was already described in detail with reference to FIGS. 5 to 9 in Embodiment 1, and so it described here only briefly.

Figure 16:
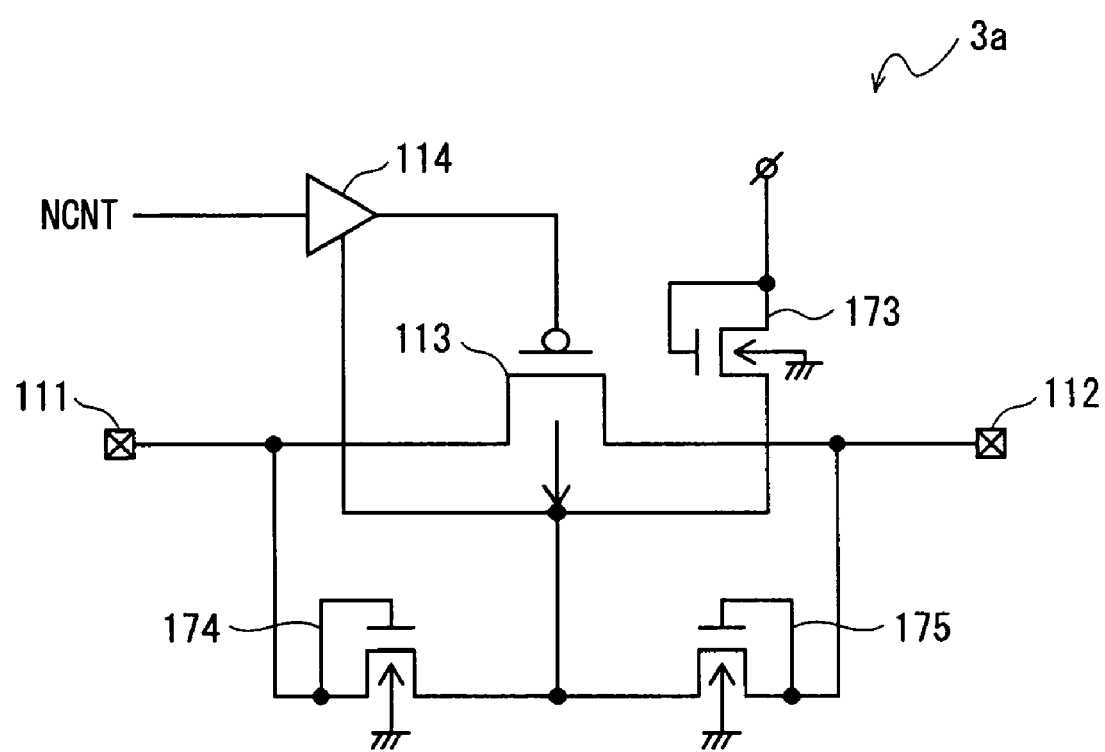
Figure 17:
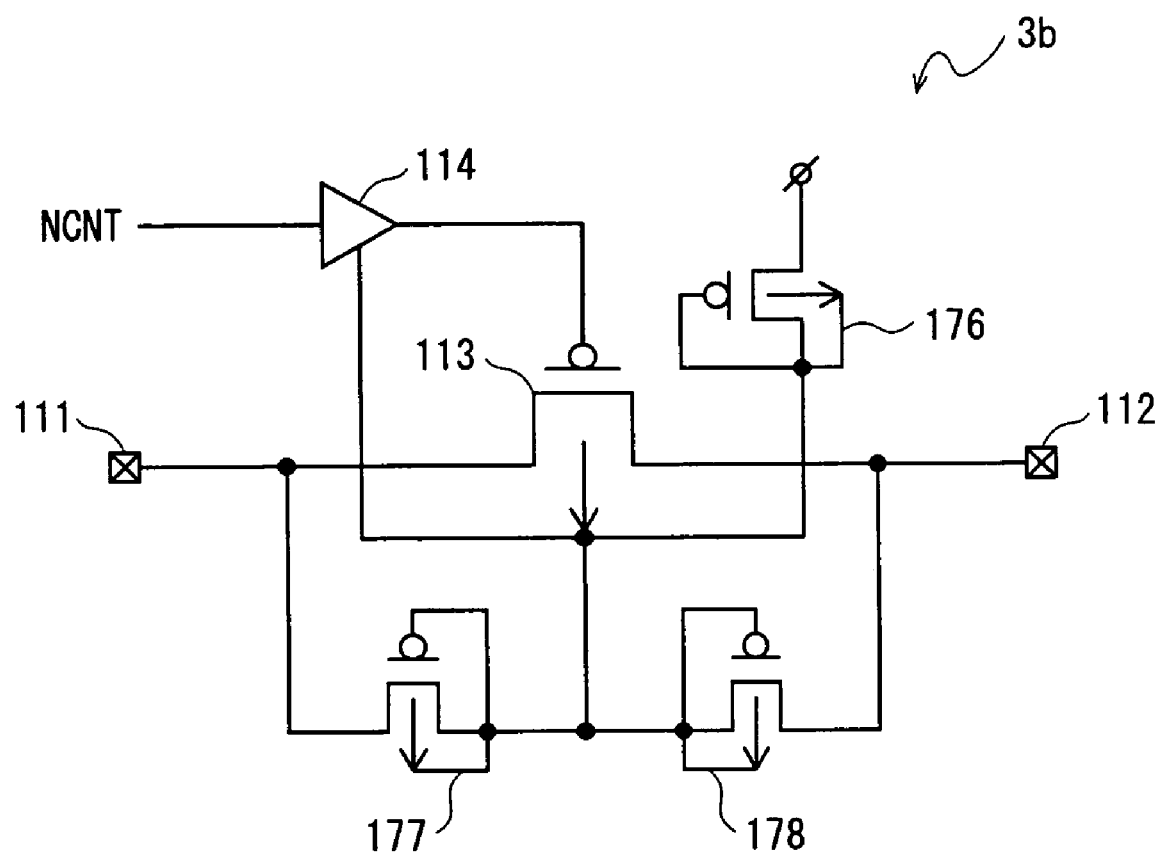
FIG. 17 is a circuit diagram that shows the configuration of a switch circuit 3b.
Figure 18:
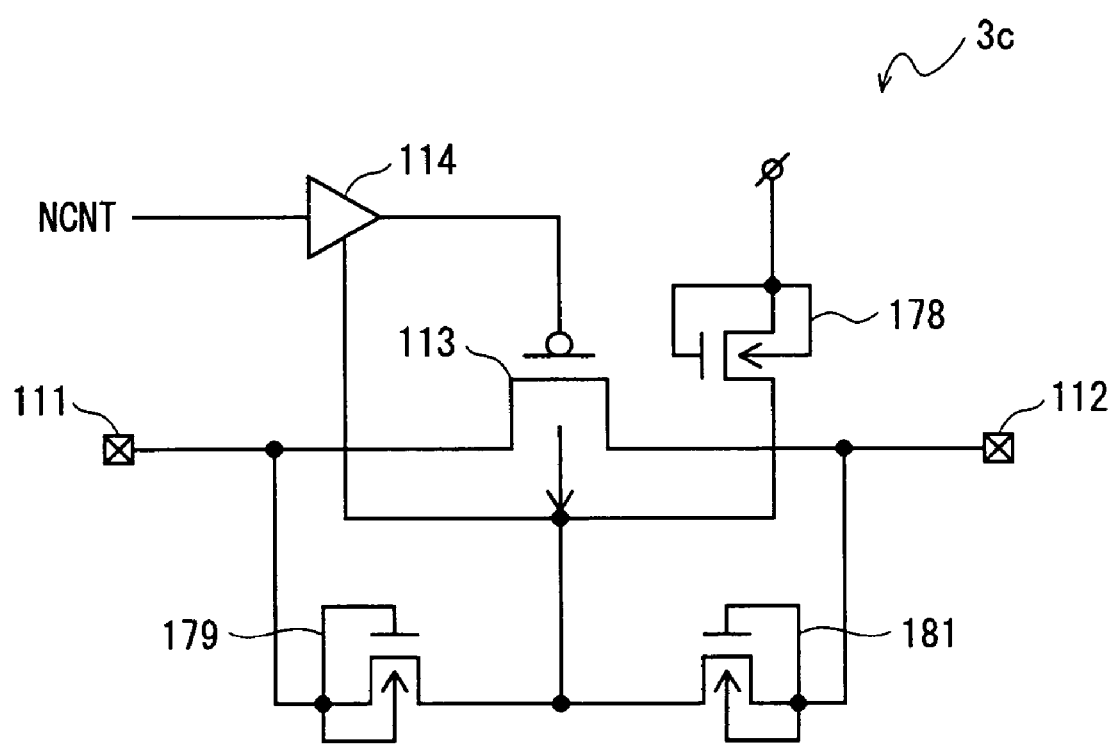
FIG. 18 is a circuit diagram that shows the configuration of a switch circuit 3c.

FIGS. 16 to 18 show a switch circuit in which a transistor that functions as a diode is adopted instead of each of the diodes 115, 116, and 171.

FIG. 16 shows a switch circuit 3a provided with transistors 173, 174, and 175 instead of the three diodes provided in the switch circuit 3. The transistors 173, 174, and 175 have the same configuration as the transistor 131 shown in FIG. 5. These are NMOS transistors in which the back gate is connected to a ground potential, that function as a diode in which the drain is connected to the cathode terminal, and the source and the gate electrode are connected to the anode terminal.

FIG. 17 shows a switch circuit 3b provided with transistors 176, 177, and 178 instead of the three diodes provided in the switch circuit 3. The transistors 176, 177, and 178 have the same configuration as the transistor 135 shown in FIG. 6, and function as a diode in which the source of a PMOS transistor is connected to the anode terminal, and the drain, the back gate, and the gate electrode are connected to the cathode terminal.

FIG. 18 shows a switch circuit 3c provided with transistors 178, 179, and 181 instead of the three diodes provided in the switch circuit 3. The transistors 178, 179, and 181, same as the transistor 141 shown in FIG. 8, function as diodes in which the source of an NMOS transistor is connected to the cathode terminal, and the drain, the back gate, and the gate electrode are connected to the anode terminal.

4. Embodiment 4

Following is a description of a switch circuit 4 according to Embodiment 4 of the present invention, with reference to the accompanying drawings.

4.1 Overview of Switch Circuit 4

In the switch circuit 4, a diode is further connected to the switch circuit 2 described in Embodiment 2. In this diode, the anode terminal is connected to the back gate of the NMOS transistor 153, and the cathode terminal is connected to a ground potential. The potential of the back gate of the transistor 153 is certainly not less than the ground potential, so the level shift circuit can operate normally even when the potential of the input-output terminals is higher than the operating threshold value of the level shift circuit. In the following description, a description of the same portions as in Embodiment 2 is omitted, so that mainly distinguishing portions of the present embodiment are described. Also, in FIG. 19, constituent elements that are the same as in Embodiment 2 have the same reference numerals.

4.2 Configuration of Switch Circuit 4

Figure 19:
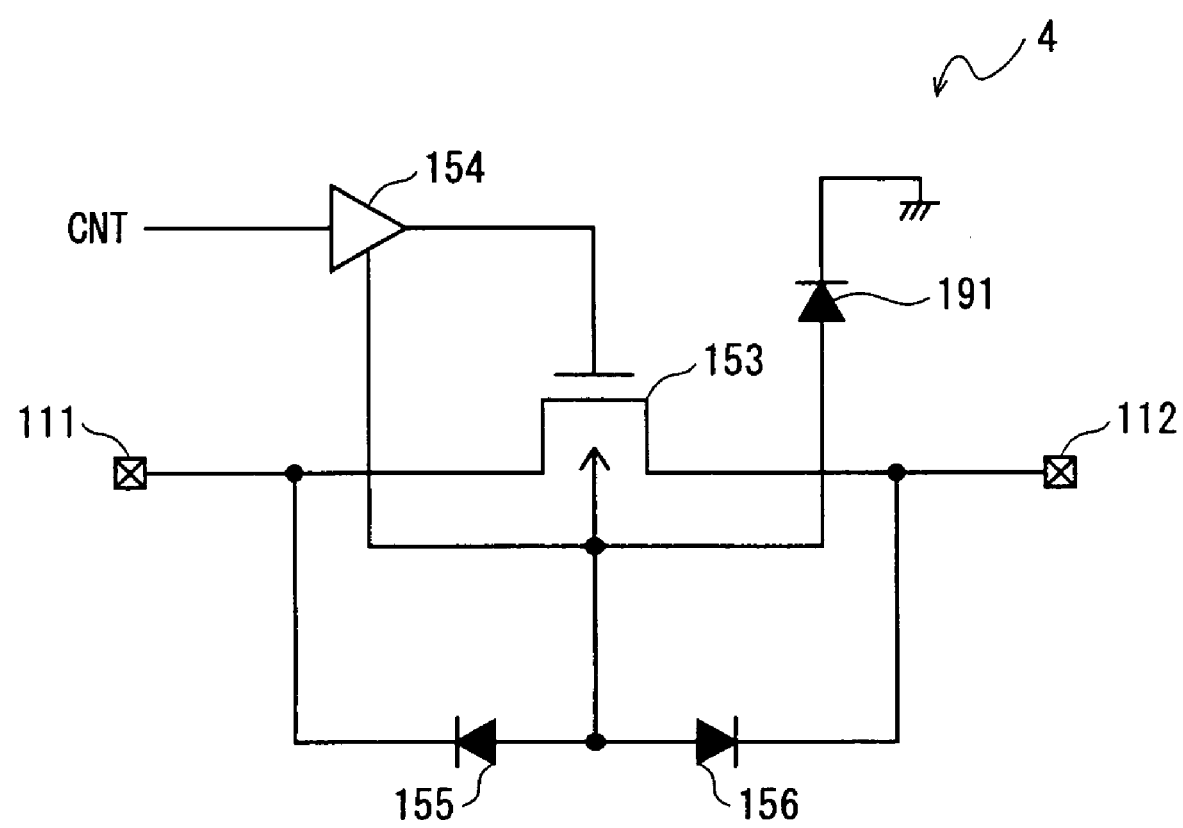
FIG. 19 is a circuit diagram that shows the configuration of a switch circuit 4.

As shown in FIG. 19, the switch circuit 4 is configured from the input-output terminals 111 and 112, the NMOS transistor 153, diodes 155 and 156, the level shift circuit 154, and a diode 191. Although omitted in FIG. 19, same as in the switch circuit 2 shown in FIG. 10, the NMOS transistor 153 includes the parasitic diodes 157 and 158. The constituent elements other than the diode 191 and their connections to each other are the same as in the switch circuit 2 of Embodiment 2, and so a description thereof is omitted here.

In the diode 191, the anode terminal is connected to the back gate of the NMOS transistor 153, and the cathode terminal is connected to a ground potential. When the potential of the back gate of the NMOS transistor 153 is greater than the ground potential, current is allowed to flow in the forward direction, and thus the potential of the back gate of the NMOS transistor 153 is reduced to the ground potential. A diode configured as desired can be adopted as the diode 191, but as an example, here the diode 191 has the same configuration as the diode 155 shown in FIG. 11.

The operation of the switch circuit 4 is the same as that of the switch circuit 2 in Embodiment 2, and so a description thereof is omitted here.

4.3 Effects

With the above configuration, the potential of the back gate of the NMOS transistor 153 used to configure the switch circuit 4 is the same as the lowest potential among the potential of the input-output terminal 111, the potential of the input-output terminal 112, and the ground potential.

In the level shift circuit 154 used to configure the switch circuit 4, acquires an operating potential from the back gate of the NMOS transistor 153 via the negative high voltage power terminal. If the acquired operating potential is equal to or less than an operating threshold value (here, the ground potential), the switch circuit 4 operates normally.

In the switch circuit 4 of the present invention, even when the potential of the input-output terminals 111 and 112 is greater than the operating threshold value of the level shift circuit 154, the ground potential is supplied via the diode 191 and the back gate of the NMOS transistor 153. Thus, the level shift circuit 154 can always control the on-off state of the NMOS transistor 153 normally.

4.4 Modified Example

In the above switch circuit 4, the diodes 155, 156, and 191 were described as PN junction diodes as shown in FIG. 11, but any desired diode may be used. However, as also stated in Embodiments 1 and 2, these diodes, which are connected in parallel with the parasitic diodes 157 and 158, are intended to mitigate the forward bias current that flows to the parasitic diodes 157 and 158, and thus it is necessary that the diodes 155, 156, and 191 actively allow a large current to flow. Also, when the potential of the input-output terminals 111 and 112 is high, potential is transmitted to the back gate of the NMOS transistor 153 only by the diode 191. Accordingly, it is desirable to have a configuration in which latch-up is not caused, and more specifically, it is desirable that one of the two conditions stated in Embodiment 1 is satisfied.

In the above switch circuit 4, a PN junction diode with the configuration shown in FIG. 11 that satisfies Condition 1, but a PN junction diode with the configuration shown in FIG. 3A may be used instead.

Figure 20:
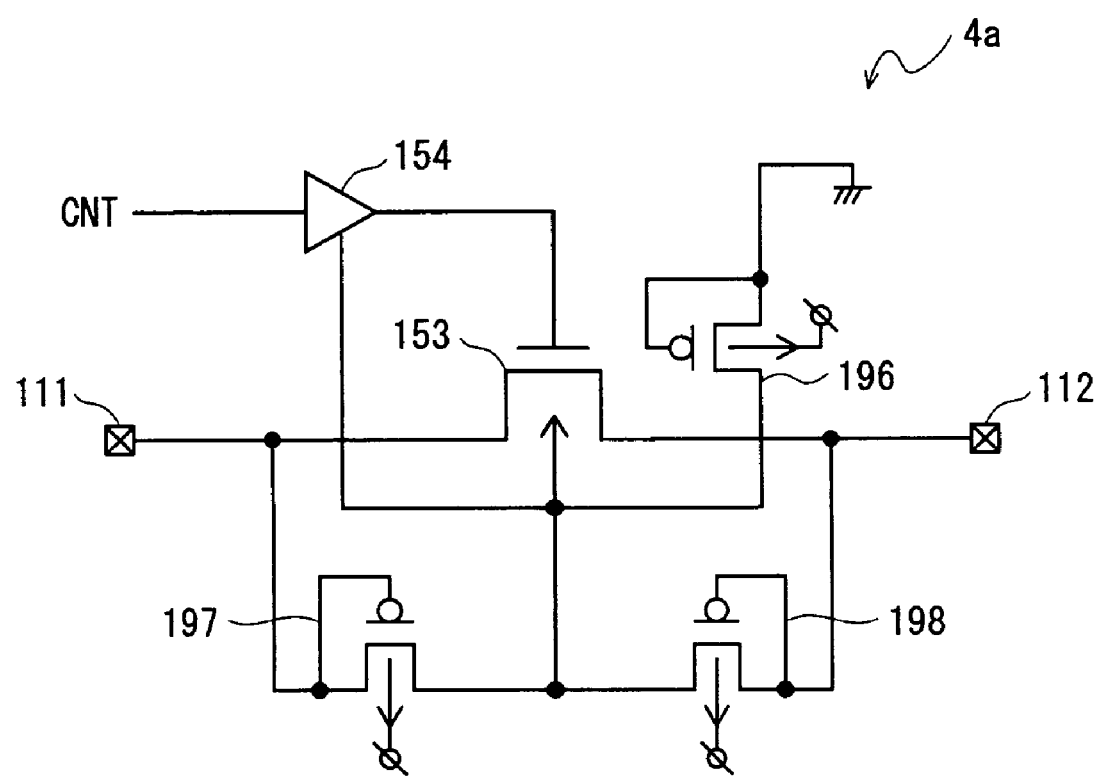
Figure 21:
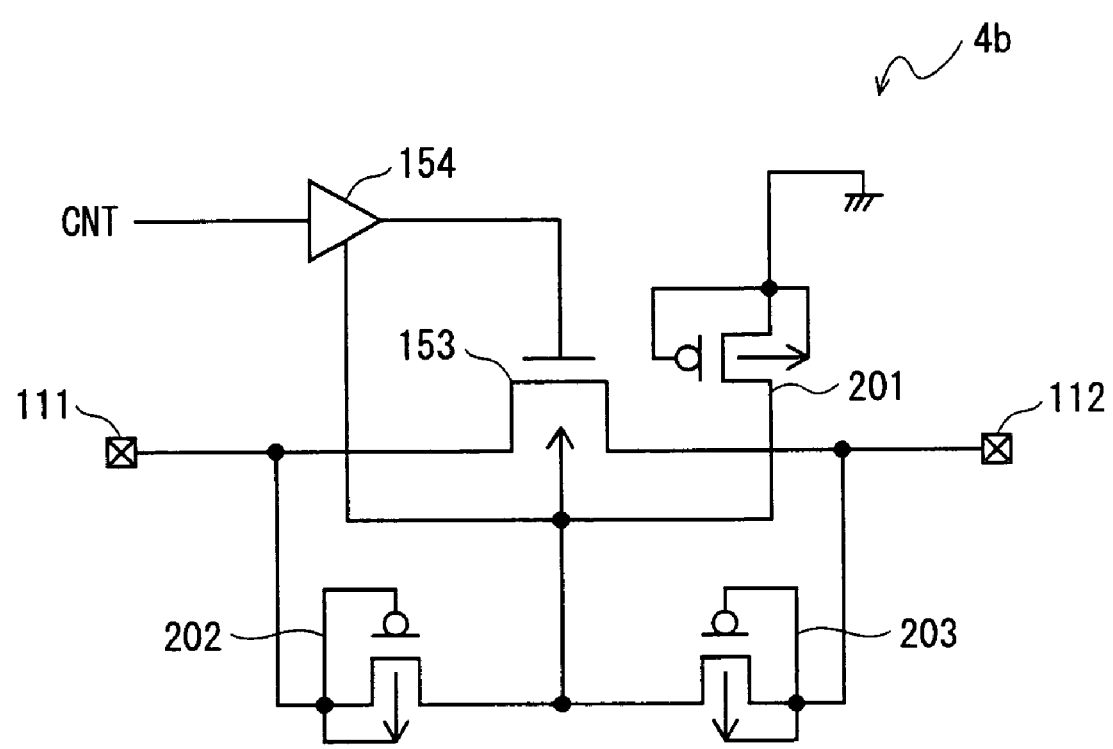
FIG. 21 is a circuit diagram that shows the configuration of a switch circuit 4b.
Figure 22:
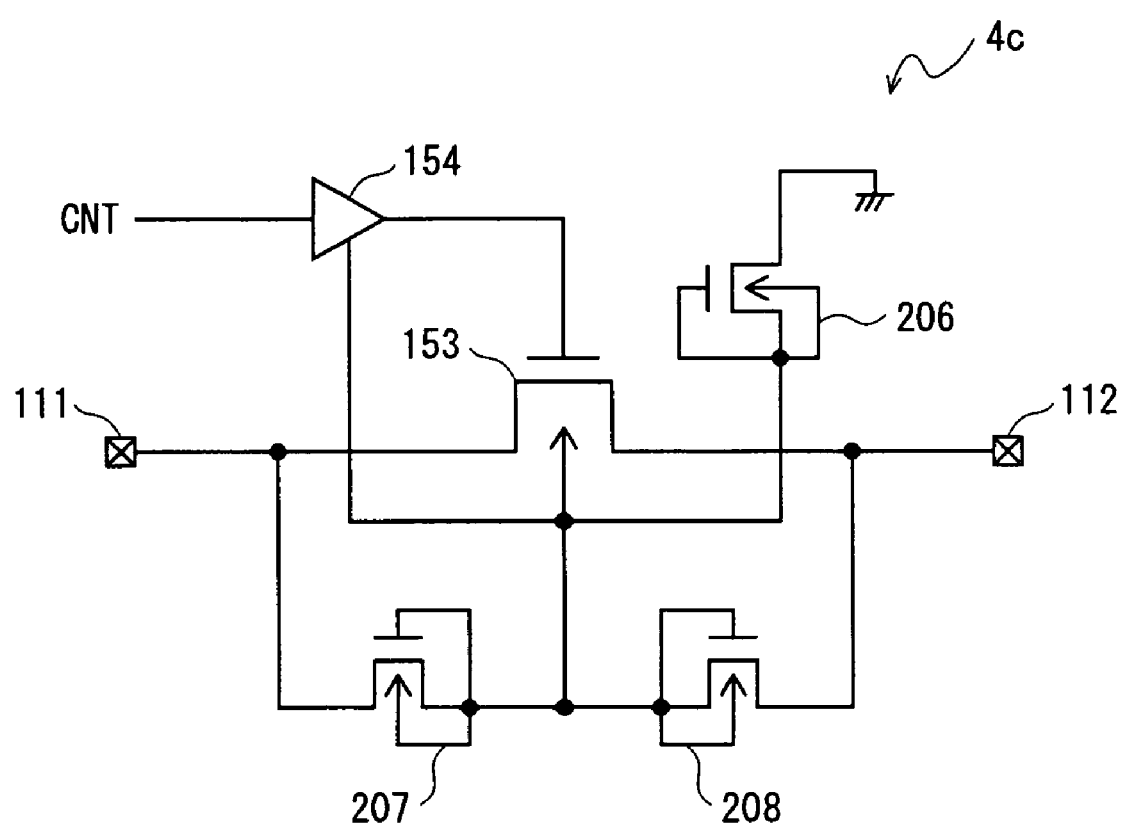
FIG. 22 is a circuit diagram that shows the configuration of a switch circuit 4c.

Also, as described also in Embodiment 2, a transistor that functions as a diode that satisfies Condition 2 may be used. This transistor was already described in detail with reference to FIGS. 6 to 9 and 12 to 14 in Embodiments 1 and 2, and so it described here only briefly. FIGS. 20 to 22 show a switch circuit in which a transistor that functions as a diode is adopted instead of each of the diodes 155, 156, and 191.

FIG. 20 shows a switch circuit 4a provided with transistors 196, 197, and 198 instead of the three diodes provided in the switch circuit 4. The transistors 196, 197, and 198, same as the transistor 161 described in FIG. 12, are PMOS transistors in which the back gate is connected to the power source potential, and function as diodes in which the source is connected to the anode terminal, and the drain and the gate electrode are connected to the cathode terminal.

FIG. 21 shows a switch circuit 4b provided with transistors 201, 202, and 203 instead of the three diodes provided in the switch circuit 4. The transistors 201, 202, and 203, same as the transistor 135 described in FIG. 7, function as a diode in which the source of a PMOS transistor is connected to the anode terminal, and the drain, the back gate, and the gate electrode are connected to the cathode terminal.

FIG. 22 shows a switch circuit 4c provided with transistors 206, 207, and 208 instead of the three diodes provided in the switch circuit 4. The transistors 206, 207, and 208, same as the transistor 141 described in FIG. 8, function as a diode in which the source of an NMOS transistor is connected to the cathode terminal, and the drain, the back gate, and the gate electrode are connected to the anode terminal.

5. Embodiment 5

Following is a description of a switch circuit 5 according to Embodiment 5 of the present invention, with reference to the accompanying drawings.

5.1 Overview of Switch Circuit 5

In the switch circuit 5, an NMOS transistor and an inverter are further connected to the switch circuit 3 described in Embodiment 3. The NMOS transistor is connected to the PMOS transistor 113 in parallel. When the difference in potential between the input-output terminals 111 and 112 and the ground potential is less than the threshold voltage of the PMOS transistor 113, the switch circuit 5 allows current to flow between the input-output terminals 111 and 112, via the NMOS transistor connected in parallel to the PMOS transistor 113.

In the following description, a description of the same portions as in Embodiment 3 is omitted, and mainly distinguishing portions of the present embodiment are described. Also, in FIG. 23, constituent elements that are the same as in Embodiment 3 have the same reference numerals.

5.2 Configuration of Switch Circuit 5

Figure 23:
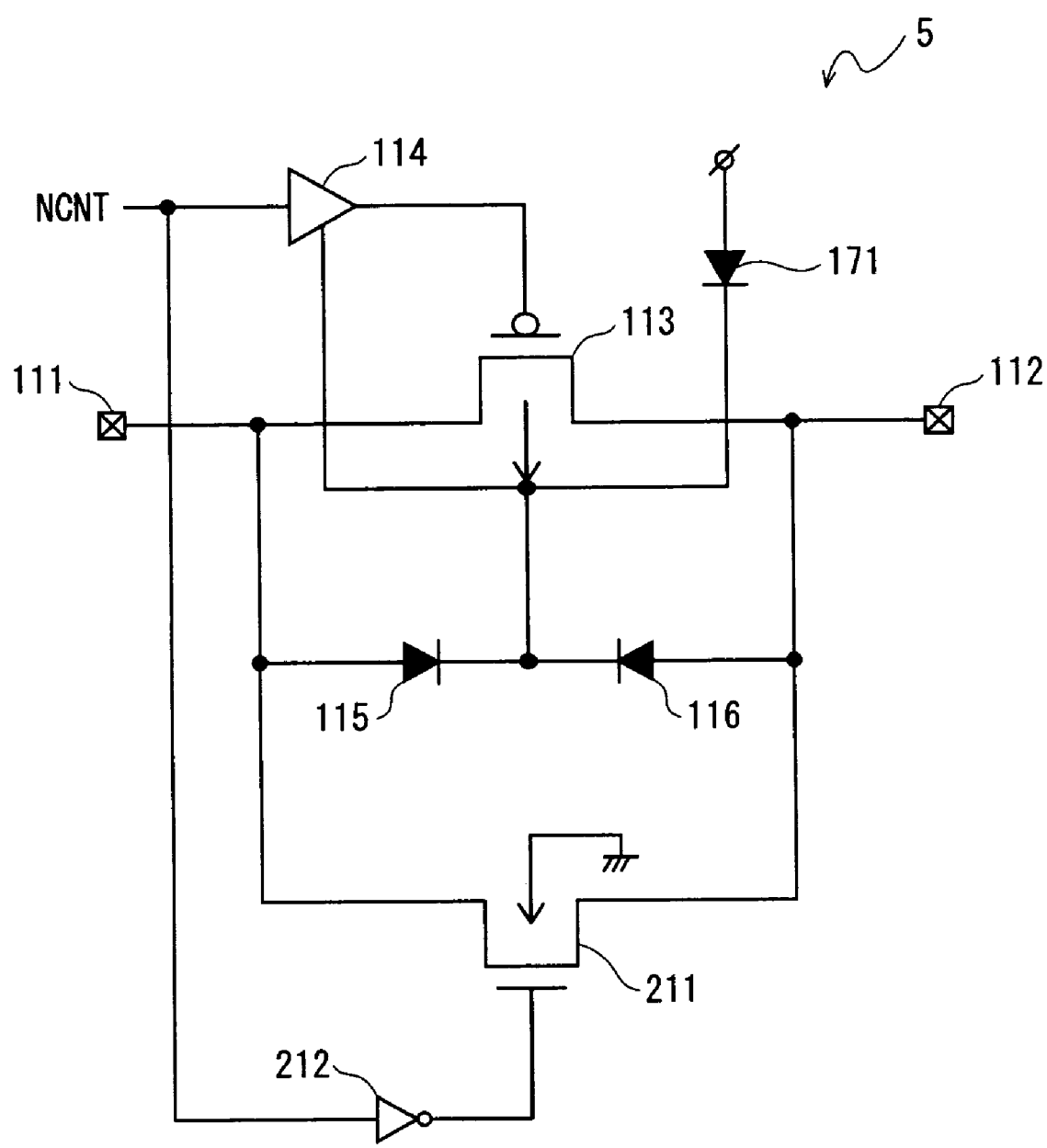
FIG. 23 is a circuit diagram that shows the configuration of a switch circuit 5.

As shown in FIG. 23, the switch circuit 5 is configured from the input-output terminals 111 and 112, the PMOS transistor 113, the level shift circuit 114, the diodes 115, 116, and 171, an NMOS transistor 211, and an inverter 212.

The input-output terminals 111 and 112, the PMOS transistor 113, the level shift circuit 114, and the diodes 115, 116, and 171 have the same configuration and connections to each other as described in Embodiment 3, and so a description thereof is omitted here.

In the NMOS transistor 211, the back gate is connected to a ground potential, either the source or the drain is connected to the input-output terminal 111, and the other is connected to the input-output terminal 112. The gate electrode is connected to the output terminal of the inverter 212, and an H-level (power source potential) or L-level (ground potential) signal is input from the inverter 212. When the difference in potential between the gate electrode and the input-output terminal 111 is equal to or greater than the threshold voltage of the NMOS transistor 211, or when the difference in potential between the gate electrode and the input-output terminal 112 is equal to or greater than the threshold voltage of the NMOS transistor 211, the NMOS transistor 211 enters the on state. The range of potential that the NMOS transistor 211 can transmit is from the ground potential to a potential obtained by subtracting the threshold voltage from the power source potential.

The inverter 212 inverts a control signal input from an external circuit and outputs the inverted control signal to the gate electrode of the NMOS transistor. Specifically, if the control signal is an H-level signal, the inverter 212 outputs an L-level (ground potential) signal, and if the control signal is an L-level signal, the inverter 212 outputs an H-level (power source potential) signal.

5.3 Operation of Switch Circuit 5

Following is a description of the operation of the switch circuit 5. Here, the power source potential is expressed as E, the potential of the input-output terminal 111 is expressed as Va, the potential of the input-output terminal 112 is expressed as Vb, the threshold voltage of the PMOS transistor 113 is expressed as Tp, the threshold voltage of the NMOS transistor 211 is expressed as Tn, and the operating threshold value of the level shift circuit 114 is expressed as Ts. Here, it is assumed that the power source potential E is sufficiently large compared to the threshold voltages Tp and Tn, and the operating threshold value Ts.

As stated in Embodiment 1, the potential that can be transmitted by the PMOS transistor 113 is limited to a potential not less than a value obtained by adding the threshold voltage of the PMOS transistor 113 to the ground potential (0V), that is, a potential that is not less than Tp.

When potential is applied to the input-output terminals 111 and 112 respectively, the potential of the back gate of the PMOS transistor 113 becomes equal to the largest among the potentials Va, Vb, and E. The potential of the back gate is equal to or greater than the operating threshold value Ts, so the level shift circuit 114 operates normally.

Here, a case is assumed in which Va<Tp and Vb<Tp. The potential of the back gate of the PMOS transistor 113 is E.

When the control signal is an H-level signal, the level shift circuit 114 outputs the potential E of the back gate of the PMOS transistor 113. At this time, the difference in potential between the gate electrode and the back gate of the PMOS transistor 113 is 0V, so the PMOS transistor 113 enters the off state.

The inverter 212 inverts the control signal and outputs an L-level signal to the gate electrode of the NMOS transistor 211. The back gate of the NMOS transistor 211 is connected to a ground potential, so the NMOS transistor 211 enters the off state. Because both the PMOS transistor 113 and the NMOS transistor 211 are in the off state, the switch circuit 5 cuts off the flow of current between the input-output terminals 111 and 112.

When the control signal is an L-level signal, the level shift circuit 114 outputs the ground potential. At this time, the difference in potential between the gate electrode and the back gate is E, but the difference in potential between the input-output terminal 111 and the gate electrode is Va, and the difference in potential between the input-output terminal 112 and the gate electrode is Vb, and both are less than Tp, so the PMOS transistor 113 remains in the off state.

On the other hand, the inverter 212 inverts the L-level control signal and outputs an H-level (power source potential) control signal to the NMOS transistor 211. The power source potential E is sufficiently large compared to the threshold voltages Tp and Tn, so E−Tn>Tp is realized. Also, because Tp>Va, E−Tn>Va. Accordingly, E−Va>Tn, that is, the difference is potential between the gate electrode and the input-output terminal 111 is equal to or greater than the threshold value of the NMOS transistor 211, so the NMOS transistor 211 enters the on state.

The PMOS transistor 113 is in the off state, but the NMOS transistor 211 is in the on state, so current is allowed to flow between the input-output terminals 111 and 112.

5.4 Effect

As described above, the back gate of the PMOS transistor 113 has the same potential as the highest among the potentials of the input-output terminals 111 and 112 and the power source potential. When the control signal is an L-level signal, the level shift circuit 114 outputs the ground potential, so that a difference in potential occurs between the back gate and the gate electrode of the PMOS transistor 113, and thus the PMOS transistor 113 is expected to enter the on state. However, when both the difference in potential between the input-output terminal 111 and the gate electrode, and the difference in potential between the input-output terminal 112 and the gate electrode, are less than the threshold value of the PMOS transistor 113, the PMOS transistor 113 remains in the off state.

However, the switch circuit 5 of the present embodiment is provided with the NMOS transistor 211, and when the PMOS transistor 113 is in the off state, the NMOS transistor 211 enters the on state. Accordingly, it is possible to expand the range of potential that can be transmitted by the switch circuit 5 to not less than the ground potential.

5.5 Modified Example of Embodiment 5

PN junction diodes as shown in FIG. 3A are adopted as the diodes 115, 116, and 171 used to configure the above switch circuit 5. A diode as desired may be adopted instead, but same as in Embodiments 1 to 4, it is desirable to adopt a diode that satisfies one of Conditions 1 and 2 above. The diodes 115, 116, and 171 used to configure the switch circuit 5 satisfy Condition 1. Instead, a PN junction diode with the configuration shown in FIG. 4 may be used.

Figure 24:
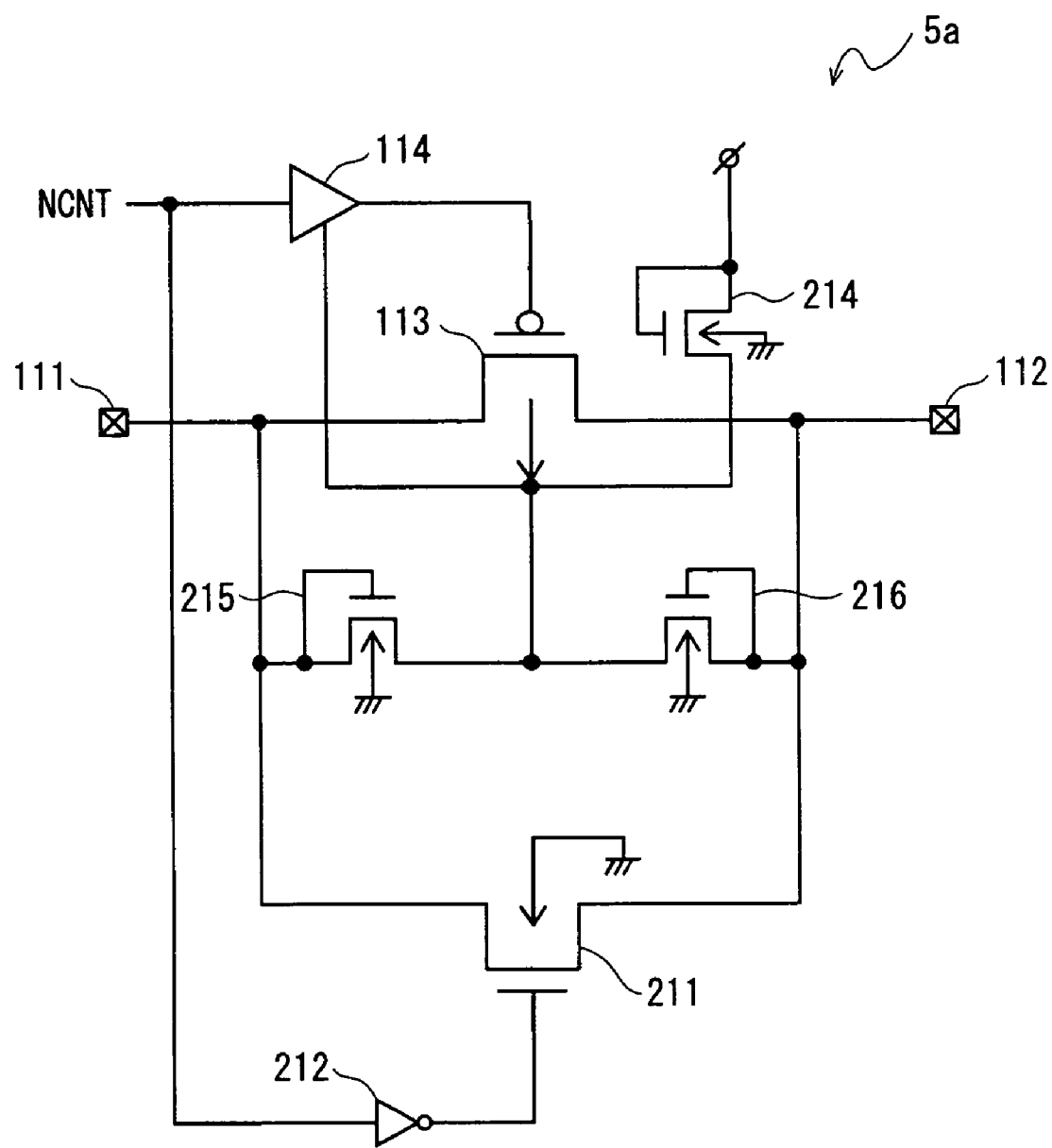
Figure 25:
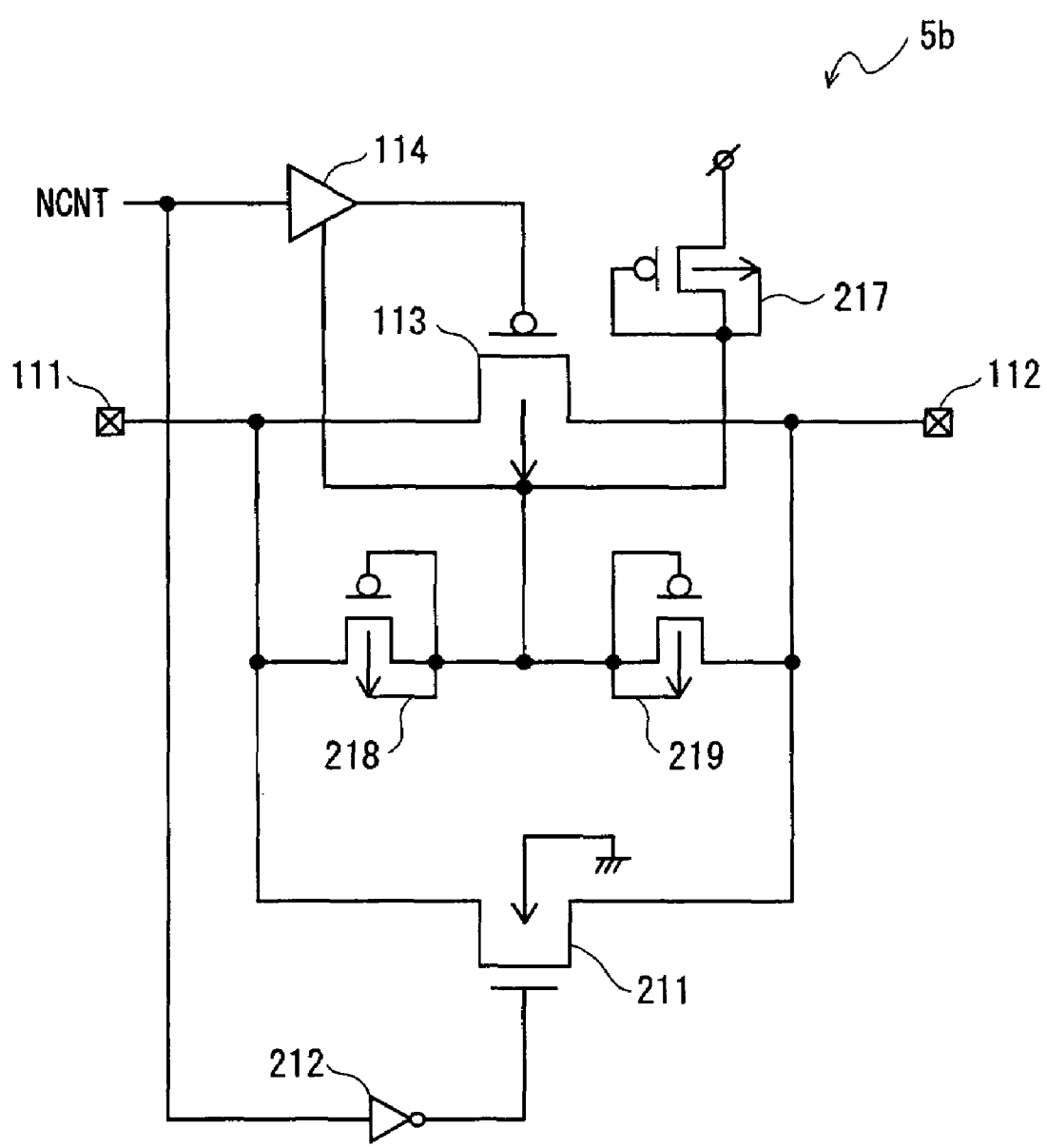
FIG. 25 is a circuit diagram that shows the configuration of a switch circuit 5b.
Figure 26:
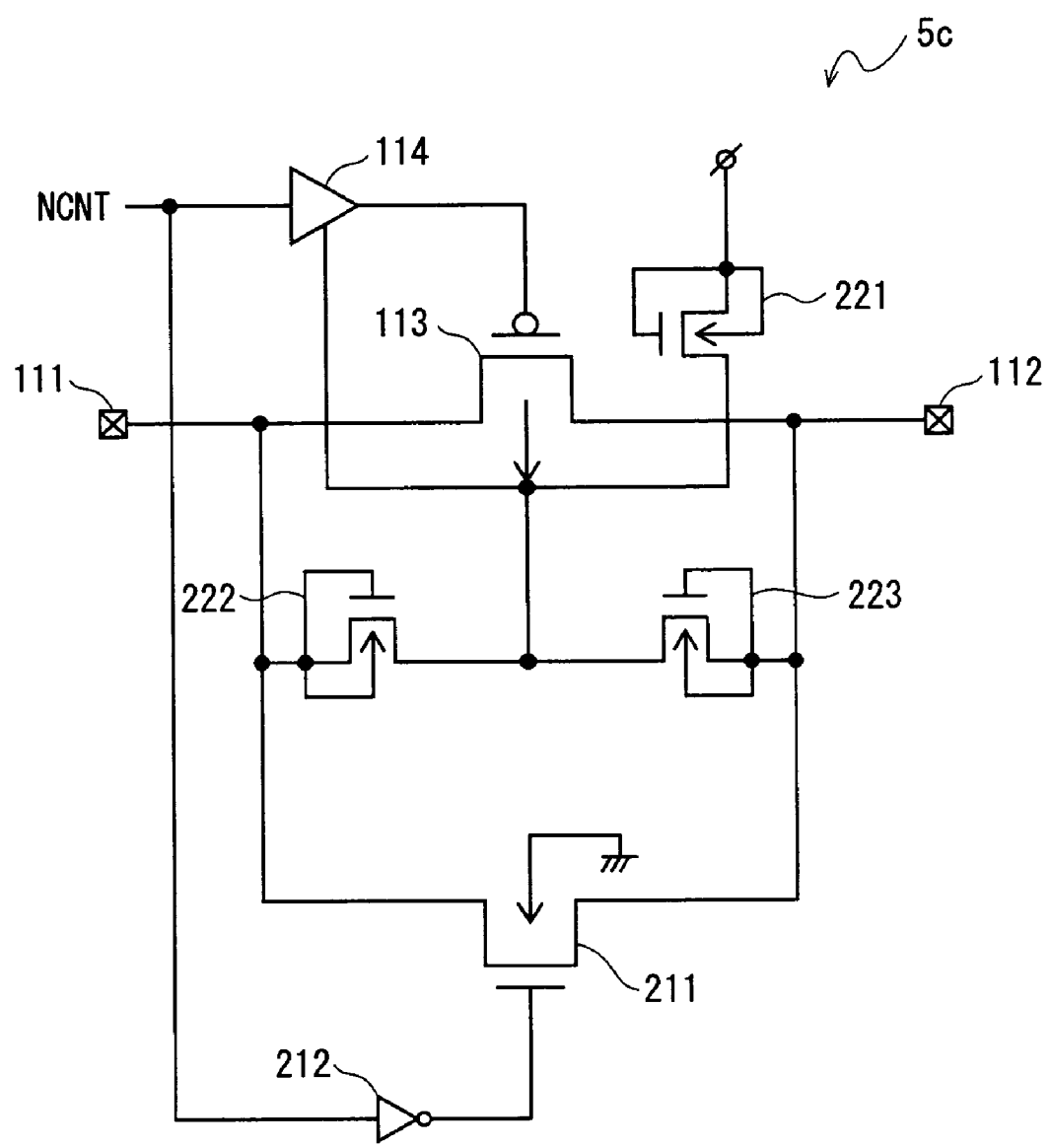
FIG. 26 is a circuit diagram that shows the configuration of a switch circuit 5c.

Also, as described in Embodiments 1 to 4, a transistor may be used that functions as a diode that satisfies Condition 2. FIGS. 24 to 26 each show an example of a switch circuit provided with a transistor that functions as a diode. The transistors used to configure the switch circuits 5a to 5c shown in FIGS. 24 to 26 are as already stated in Embodiment 3, and so a description thereof is omitted here.

6. Embodiment 6

Following is a description of a switch circuit 6 according to Embodiment 6 of the present invention, with reference to the accompanying drawings.

6.1 Switch Circuit 6

The switch circuit 6 is configured with a PMOS transistor and an inverter further connected to the switch circuit 4 described in Embodiment 4. The PMOS transistor is connected to the NMOS transistor 153 in parallel. When the difference in potential between the input-output terminals 111 and 112 and the power source potential is less than the threshold voltage of the NMOS transistor 153, the switch circuit 6 allows current to flow between the input-output terminals 111 and 112, via the NMOS transistor connected in parallel to the NMOS transistor 153.

In the following description, a description of the same portions as in Embodiment 4 is omitted, and mainly distinguishing portions of the present embodiment are described. Also, in FIG. 27, constituent elements that are the same as in Embodiment 4 have the same reference numerals.

6.2 Configuration of Switch Circuit 6

Figure 27:
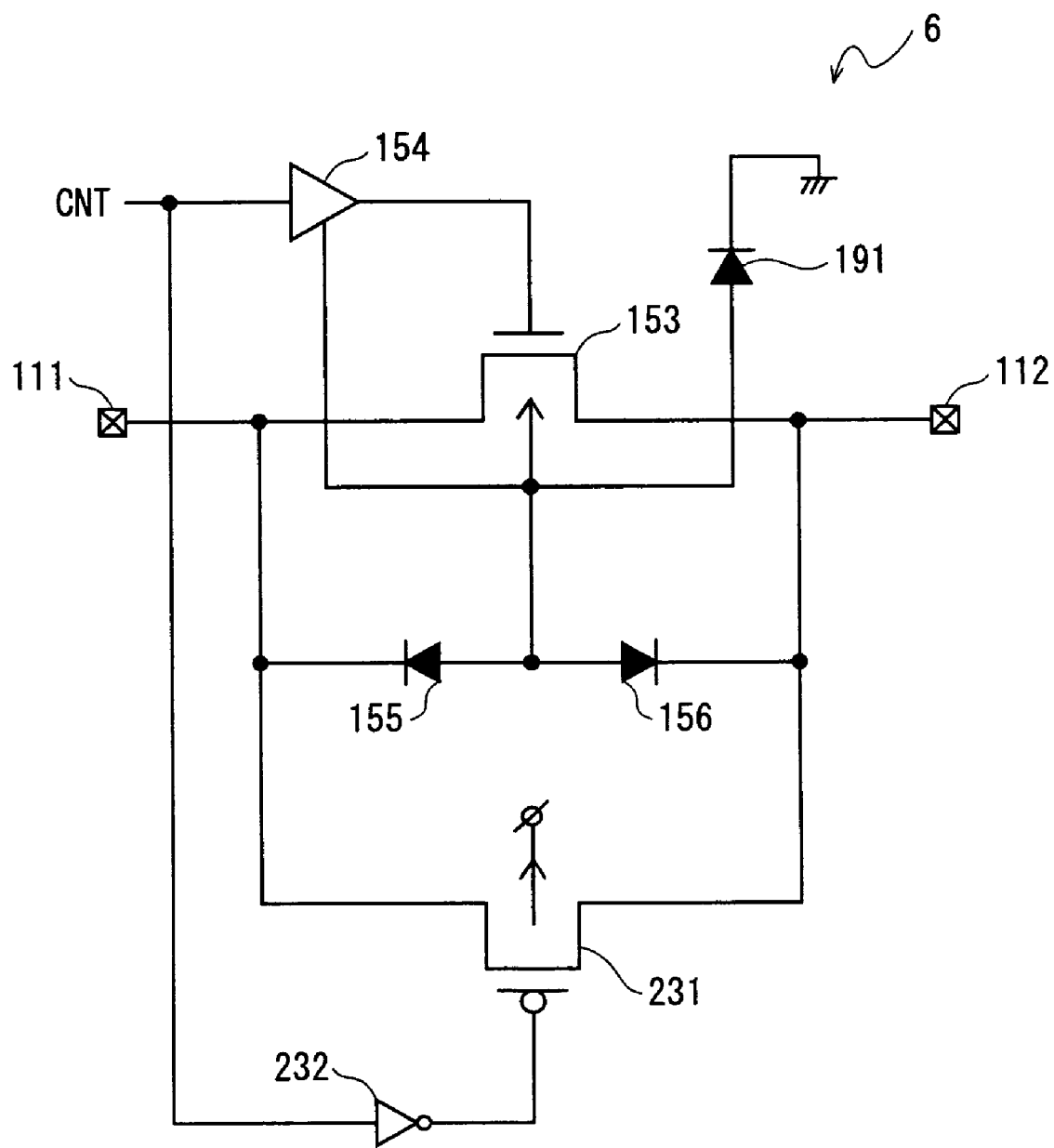
FIG. 27 is a circuit diagram that shows the configuration of a switch circuit 6.

As shown in FIG. 27, the switch circuit 6 is configured from the input-output terminals 111 and 112, the NMOS transistor 153, the level shift circuit 154, the diodes 155, 156, and 191, a PMOS transistor 231, and an inverter 232.

The input-output terminals 111 and 112, the NMOS transistor 153, the level shift circuit 154, and the diodes 155, 156, and 191 have the same configuration and connections to each other as described in Embodiment 4.

In the PMOS transistor 231, the back gate is connected to a power source potential, either the source or the gate is connected to the input-output terminal 111, and the other is connected to the input-output terminal 112. The gate electrode is connected to the output terminal of the inverter 232, and an H-level (power source potential) or L-level (ground potential) signal is input from the inverter 232. When an L-level signal is input to the gate electrode, and the difference in potential between the gate electrode and the input-output terminal 111 or 112 is equal to or greater than the threshold voltage of the PMOS transistor 231, or when the difference in potential between the gate electrode and the input-output terminal 112 is equal to or greater than the threshold voltage of the PMOS transistor 231, the PMOS transistor 231 enters the on state. The range of potential that the NMOS transistor 231 can transmit is from the threshold voltage to the power source potential.

The inverter 232 inverts a control signal input from an external circuit and outputs the inverted control signal to the gate electrode of the PMOS transistor 231. Specifically, if the control signal is an H-level signal, the inverter 232 outputs an L-level signal, and if the control signal is an L-level signal, the inverter 232 outputs an H-level signal.

6.3 Operation of Switch Circuit 6

Following is a description of the operation of the switch circuit 6. Here, the power source potential is expressed as E, the potential of the input-output terminal 111 is expressed as Va, the potential of the input-output terminal 112 is expressed as Vb, the threshold voltage of the NMOS transistor 153 is expressed as Tn, the threshold voltage of the PMOS transistor 231 is expressed as Tp, and the operating threshold value of the level shift circuit 154 is expressed as Ts ((0V). Here, it is assumed that the power source potential E is sufficiently large compared to the threshold voltages Tp and Tn, and the operating threshold value Ts.

As stated in Embodiment 2, the potential that can be transmitted by the NMOS transistor 153 is limited to not more than a potential calculated by subtracting the threshold voltage of the NMOS transistor 153 from the power source potential, that is, a potential that is not more than E−Tn.

When potential is applied to the input-output terminals 111 and 112 respectively, the potential of the back gate of the NMOS transistor 153 becomes equal to the lowest among the potential of the input-output terminals 111 and 112 and the ground potential.

At this time, the potential of the back gate of the NMOS transistor 153 is equal to or less than Ts, so the level shift circuit 154 operates normally.

Here, it is assumed that E−Va<Tn, and E−Vb<Tn. At this time, the potential of the back gate of the NMOS transistor 153 is the ground potential (0V).

When the control signal is an L-level signal, the level shift circuit 154 outputs the potential of the back gate of the NMOS transistor 153. At this time, the difference in potential between the gate electrode and the back gate of the NMOS transistor 153 is 0V, so the NMOS transistor 153 enters the off state.

The inverter 232 inverts the control signal and outputs an H-level signal to the gate electrode of the PMOS transistor 231. An H-level signal is input to the gate electrode, so the PMOS transistor 231 enters the off state.

Because both the NMOS transistor 153 and the PMOS transistor 231 are in the off state, the switch circuit 6 cuts off the flow of current between the input-output terminals 111 and 112.

When the control signal is an H-level signal, the level shift circuit 154 outputs the power source potential. At this time, the difference in potential between the back gate and the gate electrode is E−0=E>Tn. However, the difference in potential between the gate electrode and the input-output terminal 111 is E−Va, and the difference in potential between the gate electrode and the input-output terminal 112 is E−Vb, and both are less than Tp, so the NMOS transistor 153 remains in the off state.

On the other hand, the inverter 232 inverts the H-level control signal and outputs an L-level control signal to the gate electrode of the PMOS transistor 231. At this time, the difference in potential between the input-output terminal 111 and the gate electrode of the PMOS transistor 231 becomes Va. Now E−Va<Tn is realized, so E−Tn<Va. Also, E is sufficiently large compared to Tp and Tn, so Tp<E−Tn. Thus, Tp<Va is realized, so the difference in potential between the gate electrode of the PMOS transistor 231 and the input-output terminal 111 is equal to or greater than the threshold value Tp, and thus the PMOS transistor 231 enters the on state.

The NMOS transistor 153 is in the off state, but the PMOS transistor 231 is in the on state, so current is allowed to flow between the input-output terminals 111 and 112.

6.4 Effects

As described above, the back gate of the NMOS transistor 153 has the same potential as the lowest among the potentials of the input-output terminals 111 and 112 and the ground potential. When the control signal is an H-level signal, the level shift circuit 154 outputs the power source potential, so that a difference in potential occurs between the back gate and the gate electrode of the NMOS transistor 153, but when both the difference in potential between the input-output terminal 111 and the gate electrode, and the difference in potential between the input-output terminal 112 and the gate electrode, are less than the threshold voltage of the NMOS transistor 153, the NMOS transistor 153 remains in the off state.

However, the switch circuit 6 of the present embodiment is provided with the PMOS transistor 231, and even when the NMOS transistor 153 is in the off state because the potential applied to the input-output terminals 111 and 112 is high, the PMOS transistor 231 enters the on state. Accordingly, the upper limit of the range of potential that can be transmitted by the switch circuit 6 can be reduced to the power source potential.

6.5 Modified Example of Embodiment 6

PN junction diodes as shown in FIG. 11 are adopted as the diodes 155, 156, and 191 used to configure the above switch circuit 6. A diode as desired may be adopted instead, but same as in Embodiments 1 to 4, it is desirable to adopt a diode that satisfies one of Conditions 1 and 2 above. The diodes 155, 156, and 191 satisfy Condition 1. Instead, a PN junction diode with the configuration shown in FIG. 3A may be used.

Figure 28:
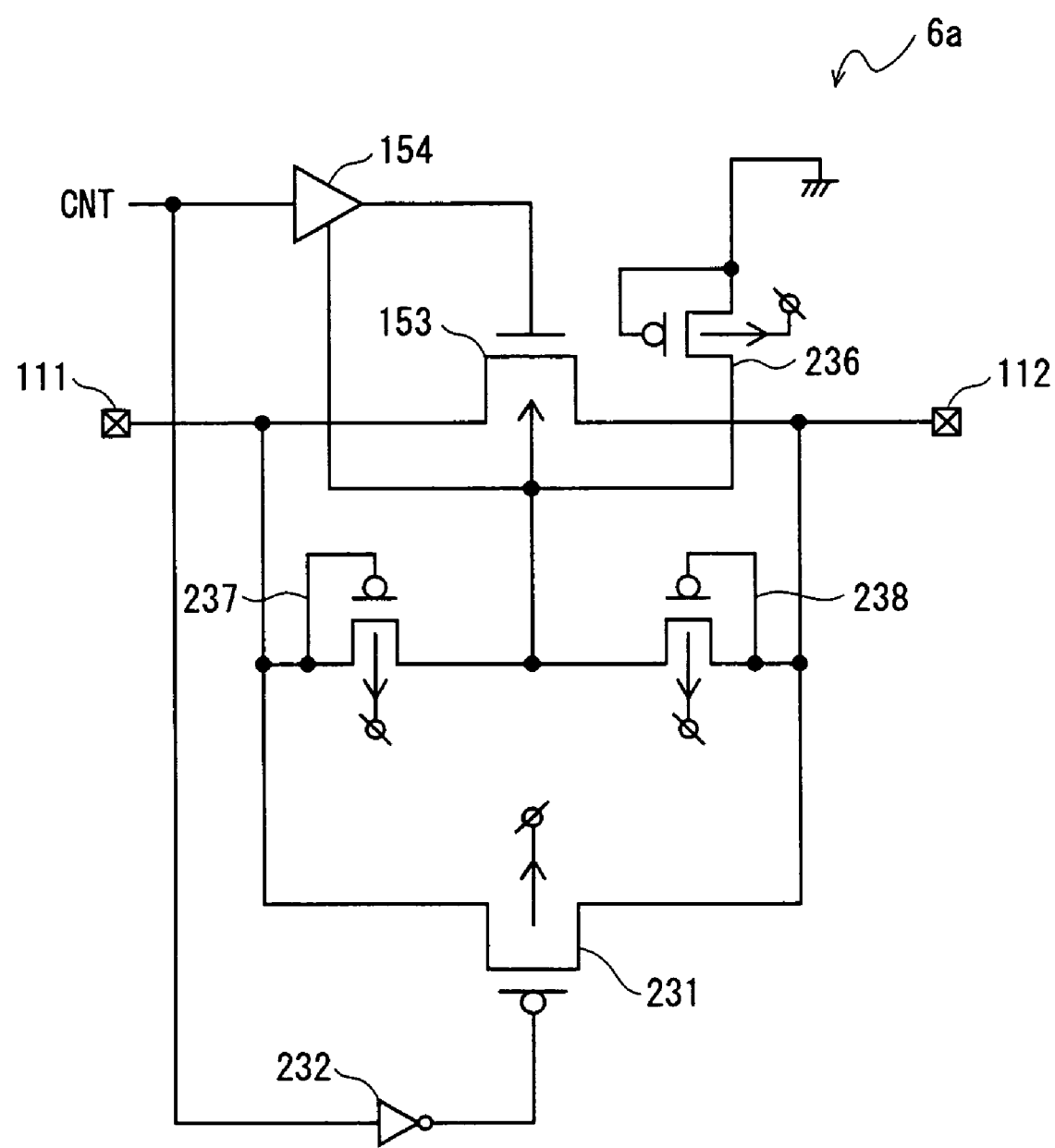
Figure 29:
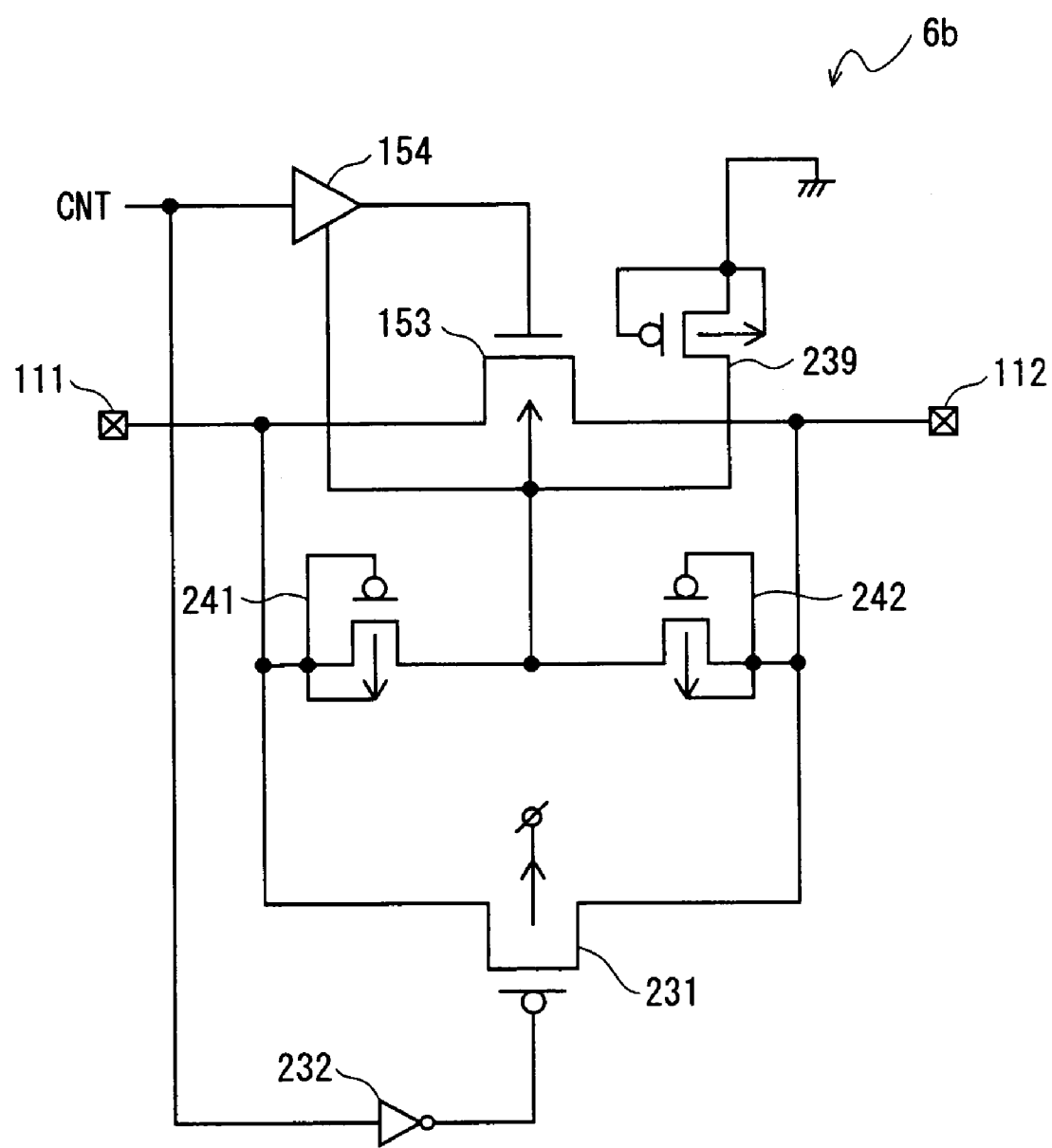
FIG. 29 is a circuit diagram that shows the configuration of a switch circuit 6b.
Figure 30:
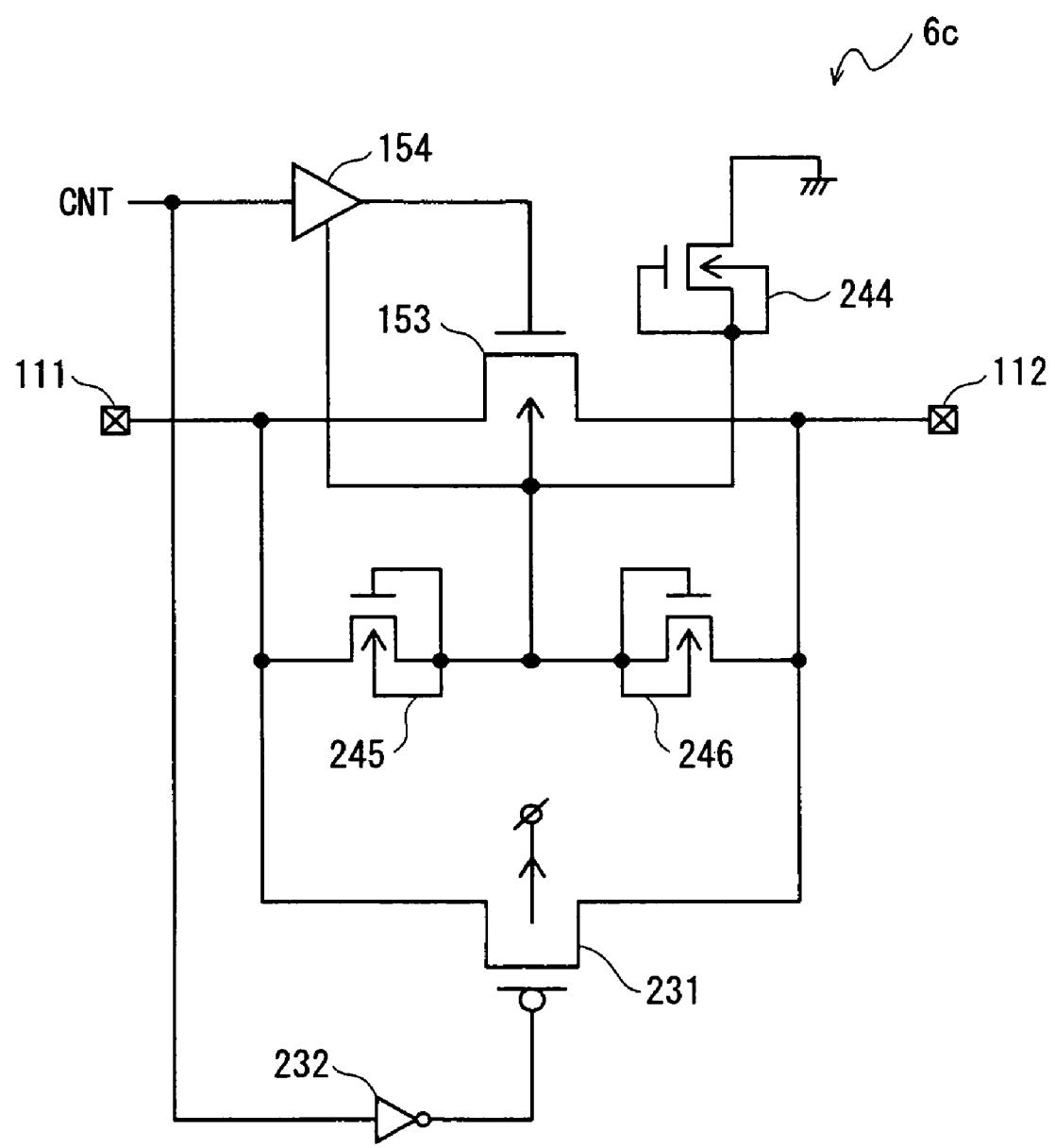
FIG. 30 is a circuit diagram that shows the configuration of a switch circuit 6c.

Also, as described in Embodiments 1 to 4, a transistor may be used that functions as a diode that satisfies Condition 2. FIGS. 28 to 30 each show an example of a switch circuit provided with a transistor that functions as a diode instead of the diodes 155, 156, and 191. The transistors used to configure the switch circuits 6A to 6C shown in FIGS. 28 to 30 are as already stated in Embodiment 4, and so a description thereof is omitted here.

7. Embodiment 7

Following is a description of a switch circuit 7 according to Embodiment 7 of the present invention, with reference to the accompanying drawings.

7.1 Overview of Switch Circuit 7

The switch circuit 7 is configured with the switch circuit 3 described in Embodiment 3 connected in parallel to the switch circuit 4 described in Embodiment 4, and can transmit positive and negative potential.

In the following description, a description of the same portions as in Embodiments 3 and 4 is omitted, and mainly distinguishing portions of the present embodiment are described.

7.2 Configuration of Switch Circuit 7

Figure 31:
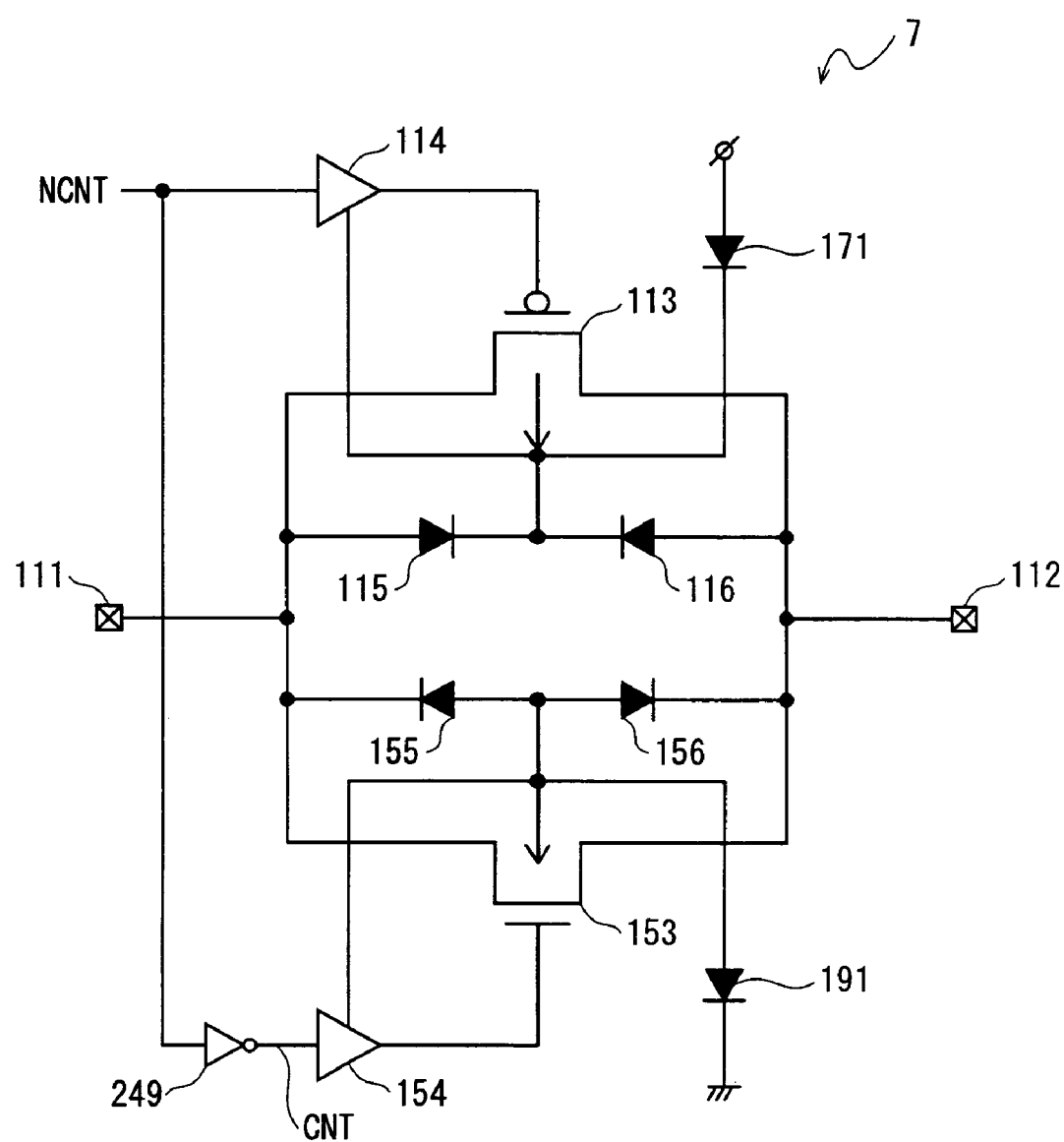
FIG. 31 is a circuit diagram that shows the configuration of a switch circuit 7.

As shown in FIG. 31, the switch circuit 7 is configured from the input-output terminals 111 and 112, the PMOS transistor 113, the level shift circuit 114, the diodes 115, 116, and 171, the NMOS transistor 153, the level shift circuit 154, the diodes 155, 156, and 191, and an inverter 249. In FIG. 31, constituent elements that are the same as in Embodiments 3 and 4 have the same reference numerals as in FIGS. 15 and 19.

Within the switch circuit 7, the portions configured from the input-output terminals 111 and 112, the PMOS transistor 113, the level shift circuit 114, and the diodes 115, 116, and 171 are the same as in the switch circuit 3 in Embodiment 3.

Within the switch circuit 7, in the portion configured from the input-output terminals 111 and 112, the NMOS transistor 153, the level shift circuit 154, the inverter 249, and the diodes 155, 156, and 191, the inverter 249 is disposed between the input-output terminal 111 and the level shift circuit 154 of the switch circuit 4 in Embodiment 4.

The constituent elements of the switch circuit 7 other than the inverter 249 and their connections to each other were described in Embodiments 3 and 4, so here, a detailed description thereof is omitted. Same as in Embodiments 3 and 4, the PMOS transistor 113 and the NMOS transistor 153 include the parasitic diodes 117, 118, 157, and 158 formed by an internal PN junction face, but they are omitted from FIG. 31.

The input terminal of the inverter 249 is connected to an external circuit that outputs a control signal, and the output terminal is connected to the gate electrode of the NMOS transistor 153. The inverter 249 inverts the control signal input from the external circuit, and outputs the inverted control signal to the level shift circuit 154.

7.3 Operation of the Switch Circuit 7

Following is a description of the operation of the switch circuit 7.

Here, the power source potential is expressed as E, the potential of the input-output terminal 111 is expressed as Va, the potential of the input-output terminal 112 is expressed as Vb, the threshold voltage of the PMOS transistor 113 is expressed as Tp, the threshold voltage of the NMOS transistor 153 is expressed as Tn, and the operating threshold value of the level shift circuit 114 is expressed as Ts. Here, it is assumed that the power source potential E is sufficiently large compared to the threshold voltages Tp and Tn, and the operating threshold value Ts.

As stated in Embodiment 1, the range of the potential that can be transmitted by the PMOS transistor 113 is limited to not less than a value calculated by adding the threshold voltage of the PMOS transistor 113 to the ground potential (0V), that is, a potential that is not less than Tp.

Also, as stated in Embodiment 2, the potential that can be transmitted by the NMOS transistor 153 is limited to not more than a potential calculated by subtracting the threshold voltage of the NMOS transistor 153 from the power source potential, that is, a potential that is not more than E−Tn.

(1) Va=Tp or Vb=Tp

The range of potential that can be transmitted by the NMOS transistor 153 is equal to or less than E−Tn, so the NMOS transistor 153 is always in the off state when the potential is outside of this range. When either Va or Vb is equal to or less than E−Tn, the on-off state is switched by the signal input to the gate electrode.

Either Va or Vb is equal to or greater than Tp, so the PMOS transistor 113 operates normally, and thus when the control signal input to the switch circuit 7 is an H-level signal, the PMOS transistor 113 enters the on state. When the control signal is an L-level signal, the PMOS transistor 113 enters the off state.

The inverter 249 inverts the control signal output from the external circuit, and outputs the inverted control signal to the level shift circuit 154, so when either Va or Vb is equal to or less than E−Tn, the PMOS transistor 113 and the NMOS transistor 153 are synchronized to switch the on-off state.

(2) E−Tn=Va or E−Tn=Vb

The range of potential that can be transmitted by the PMOS transistor 113 is not less than Tp, so the PMOS transistor 113 is always in the off state when the potential is outside of this range. When either Va or Vb is equal to or greater than Tp, the on-off state is switched by the signal input to the gate electrode.

Either Va or Vb is equal to or less than E−Tn, so the NMOS transistor 153 always operates normally. The inverter 249 inverts the control signal input to the switch circuit 7, so when the control signal input from the external circuit is an H-level signal, the NMOS transistor 153 enters the off state. When the control signal input from the external circuit is an L-level signal, the NMOS transistor 153 enters the on state.

(3) E−Tn=Va=Tp or E−Tn=Vb=Tp

At this time, either Va or Vb is included in a portion shared between the range of potential that can be transmitted by the PMOS transistor 113 and the range of potential that can be transmitted by the NMOS transistor 153, so both the PMOS transistor 113 and the NMOS transistor 153 operate normally.

At this time, the inverter 249 inverts the control signal input from the external circuit, so the level shift circuits 114 and 154 are synchronized to switch the on-off state of the PMOS transistor 113 and the NMOS transistor 153.

7.4 Effects

As described above, the level shift circuits 114 and 154 used to configure the switch circuit 7 of Embodiment 7 are synchronized to switch the on-off state of the PMOS transistor 113 and the NMOS transistor 153. When the signal input from the input-output terminals 111 and 112 are equal to or greater than the threshold voltage of the PMOS transistor 113, the on-off state of the PMOS transistor 113 is switched according to the signal from the level shift circuit 114.

Regardless of the potential input from the input-output terminals 111 and 112, at least one of the PMOS transistor 113 and the NMOS transistor 153 operates normally. Accordingly, the switch circuit can transmit potential in a wide range, from a positive voltage to a negative voltage.

In the above description, the six diodes included in the switch circuit 7 are PN junction diodes as shown in FIGS. 3 and 4, but same as in the above Embodiments, they may be replaced with diodes that satisfy Condition 1 or 2.

8. Embodiment 8

Following is a description of a switch circuit 8 according to Embodiment 8 of the present invention, with reference to the accompanying drawings.

8.1 Overview of Switch Circuit 8

The switch circuit 8 is configured with two PMOS transistors further connected to the switch circuit 1 described in Embodiment 1. In these PMOS transistors, either the source or the drain is connected to the back gate of the PMOS transistor 113, which functions to allow or cut off current between the input-output terminals. These PMOS transistors enter the on state as necessary, allowing current to flow in parallel with the diodes 115 and 116, thus controlling the current that flows to a parasitic diode of the PMOS transistor 113.

In the following description, a description of the same portions as in Embodiment 1 is omitted, and mainly distinguishing portions of the present embodiment are described.

8.2 Configuration of Switch Circuit 8

Figure 32:
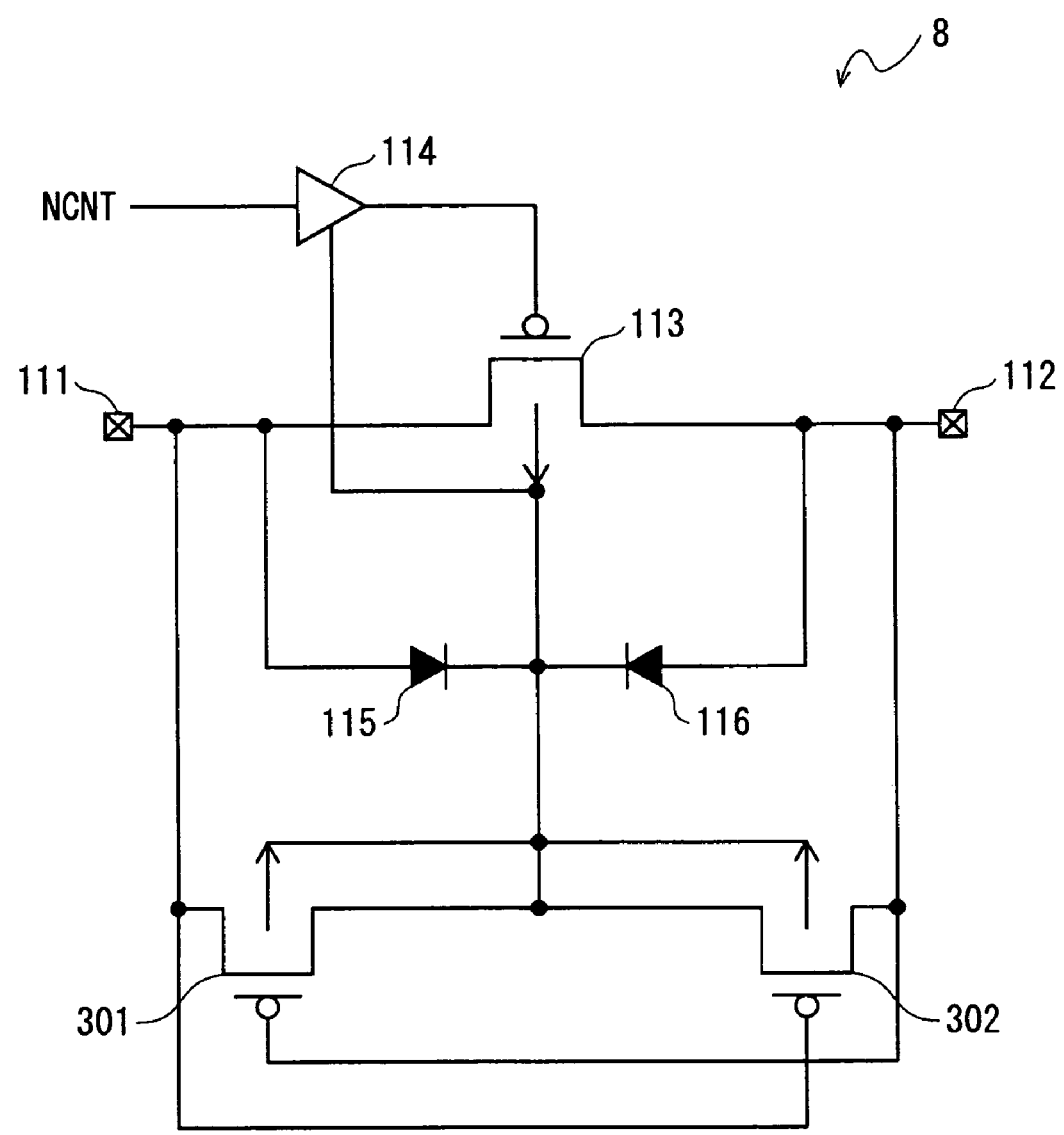
FIG. 32 is a circuit diagram that shows the configuration of a switch circuit 8.

FIG. 32 is a circuit diagram that shows the configuration of the switch circuit 8. In FIG. 32, constituent elements that are the same as in the switch circuit 1 in Embodiment 1 have the same reference numerals.

As shown in FIG. 32, the switch circuit 8 is configured from the PMOS transistor 113, the diodes 115 and 116, the level shift circuit 114, the input-output terminals 111 and 112, and PMOS transistors 301 and 302. The PMOS transistor 113, the diodes 115 and 116, the level shift circuit 114, and the input-output terminals 111 and 112 have the same configuration and connections with each other as in Embodiment 1, and so a description thereof is omitted here. Also, the parasitic diodes 117 and 118 described in Embodiment 1 are omitted here.

In the PMOS transistor 301, either the source or the drain is connected to the input-output terminal 111, and the other is connected to the back gate of the PMOS transistor 113. Moreover, the gate electrode is connected to the input-output terminal 112, and the back gate is connected to the back gate of the PMOS transistor 113.

In the PMOS transistor 302, either the source or the drain is connected to the input-output terminal 112, and the other is connected to the back gate of the PMOS transistor 113. Moreover, the gate electrode is connected to the input-output terminal 111, and the back gate is connected to the back gate of the PMOS transistor 113.

8.3 Operation of Switch Circuit 8

The operation of the switch circuit 8 is described divided into the following three cases. For the convenience of description, the potential applied to the input-output terminal 111 is expressed as Va, the potential applied to the input-output terminal 112 is expressed as Vb, and the potential of the back gate of the PMOS transistor 113 is expressed as Vbac.

(1) Va>Vb, Vbac<Va, and Vbac<Vb

It is assumed that at a point in time before Va and Vb are applied to the input-output terminals 111 and 112 respectively, the potential of the back gate of the PMOS transistor 113 satisfies Vbac<Va and Vbac<Vb. At this time, Va−Vb is not less than the threshold value of the PMOS transistor 301.

When Va and Vb are applied to the input-output terminals 111 and 112 respectively, the potential of the gate electrode of the PMOS transistor 301 becomes Vb. The PMOS transistor 301 enters the on state. In parallel with the diode 115 and the parasitic diode of the PMOS transistor 113, the PMOS transistor 301 allows current to flow to the back gate of the PMOS transistor 113 from the input-output terminal 111, and current stops when the potential Vbac of the back gate of the PMOS transistor 113 becomes equal to Va.

At this time, the potential of the gate electrode of the PMOS transistor 302 is Va. The potential of the back gate of the PMOS transistor 113, that is, the potential of the back gate of the PMOS transistor 302, is always equal to or less than Va, so the PMOS transistor 302 remains in the off state.

(2) Va<Vb, Vbac<Va, and Vbac<Vb

It is assumed that at a point in time before Va and Vb are applied to the input-output terminals 111 and 112 respectively, the potential of the back gate of the PMOS transistor 113 is less than Va and Vb. At this time, Vb−Va is not less than the threshold value of the PMOS transistor 301.

In this case, opposite to the case in (1) above, the PMOS transistor 302 enters the on state, and allows current to flow to the back gate of the PMOS transistor 113 in parallel with the diode 116 and the parasitic diode of the PMOS transistor 113, and the PMOS transistor 301 remains in the off state.

(3) Va<Vbac and Vb<Vbac

A case is assumed in which, at a stage before Va and Vb are applied to the input-output terminals 111 and 112 respectively, the potential Vbac of the back gate of the PMOS transistor 113 is higher than Va and Vb.

When Va and Vb are applied to the input-output terminals 111 and 112 respectively, the potential of the gate electrode of the PMOS transistor 301 becomes Vb. The potential of the back gate of the PMOS transistor 301 is Vbac, same as the potential of the back gate of the PMOS transistor 113, and Vb<Vbac, so the PMOS transistor 301 enters the on state. Because Va<Vbac, current flows from the back gate of the PMOS transistor 113 to the input-output terminal 111.

On the other hand, the potential of the gate electrode of the PMOS transistor 302 becomes Va. The potential of the back gate of the PMOS transistor 302 is Vbac, same as the potential of the back gate of the PMOS transistor 113, and Va<Vbac, so the PMOS transistor 302 enters the on state. Because Vb<Vbac, current flows from the back gate of the PMOS transistor 113 to the input-output terminal 112.

The PMOS transistors 301 and 302 both enter the on state, allowing current to flow from the back gate of the PMOS transistor 113 to the input-output terminals 111 and 112, and this is accompanied by a reduction in the potential Vbac of the back gate of the PMOS transistor 113.

If Va>Vb, when Vbac=Va, in the PMOS transistor 302, the difference in potential between the back gate and the gate electrode becomes 0V, so the PMOS transistor 302 enters the off state. Also, when Vbac=Va, the PMOS transistor 301 remains in the on state, but current stops because the difference in potential between the source and the drain is 0V.

If Va<Vb, when Vbac=Vb, the difference in potential between the back gate and the gate electrode of the PMOS transistor 301 becomes 0V, so the PMOS transistor 301 enters the off state. Also, when Vbac=Vb, the PMOS transistor 302 remains in the on state, but current stops because the difference in potential between the source and the drain is 0V.

8.4 Effects

As described above, in the switch circuit 8, when the potential of the input-output terminal 111 is greater than that of the input-output terminal 112, the PMOS transistor 301 enters the on state to allow current to flow from the input-output terminal 111 to the back gate of the PMOS transistor 113. Accordingly, it is possible to control the forward bias current that flows to the parasitic diode 117 (not shown in FIG. 32, but shown in FIG. 1) of the PMOS transistor 113. On the other hand, the PMOS transistor 302 enters the off state, so current does not flow directly from the input-output terminal 111 to the input-output terminal 112 via the PMOS transistors 301 and 302.

Conversely, when the potential of the input-output terminal 112 is greater than that of the input-output terminal 111, the PMOS transistor 301 enters the off state, and the PMOS transistor 302 enters the on state to allow current to flow from the input-output terminal 112 to the back gate of the PMOS transistor 113. Accordingly, it is possible to control the forward bias current that flows to the parasitic diode 118 (not shown in FIG. 32, but shown in FIG. 1) of the PMOS transistor 113.

Further, when, after applying a high potential to the input-output terminal 111 or 112, a low potential is then applied, the PMOS transistors 301 and 302 both enter the on state, and reduce the potential of the back gate of the PMOS transistor 113. Thus, it is possible to prevent a reduction in current capacity due to a substrate bias effect of the PMOS transistor 113.

8.5 Modified Example of Embodiment 8

Same as in the case of Embodiment 1, a diode that satisfies above condition 1 or 2 may be used instead of the diodes 115 and 116 used to configure the switch circuit 8.

Figure 33:
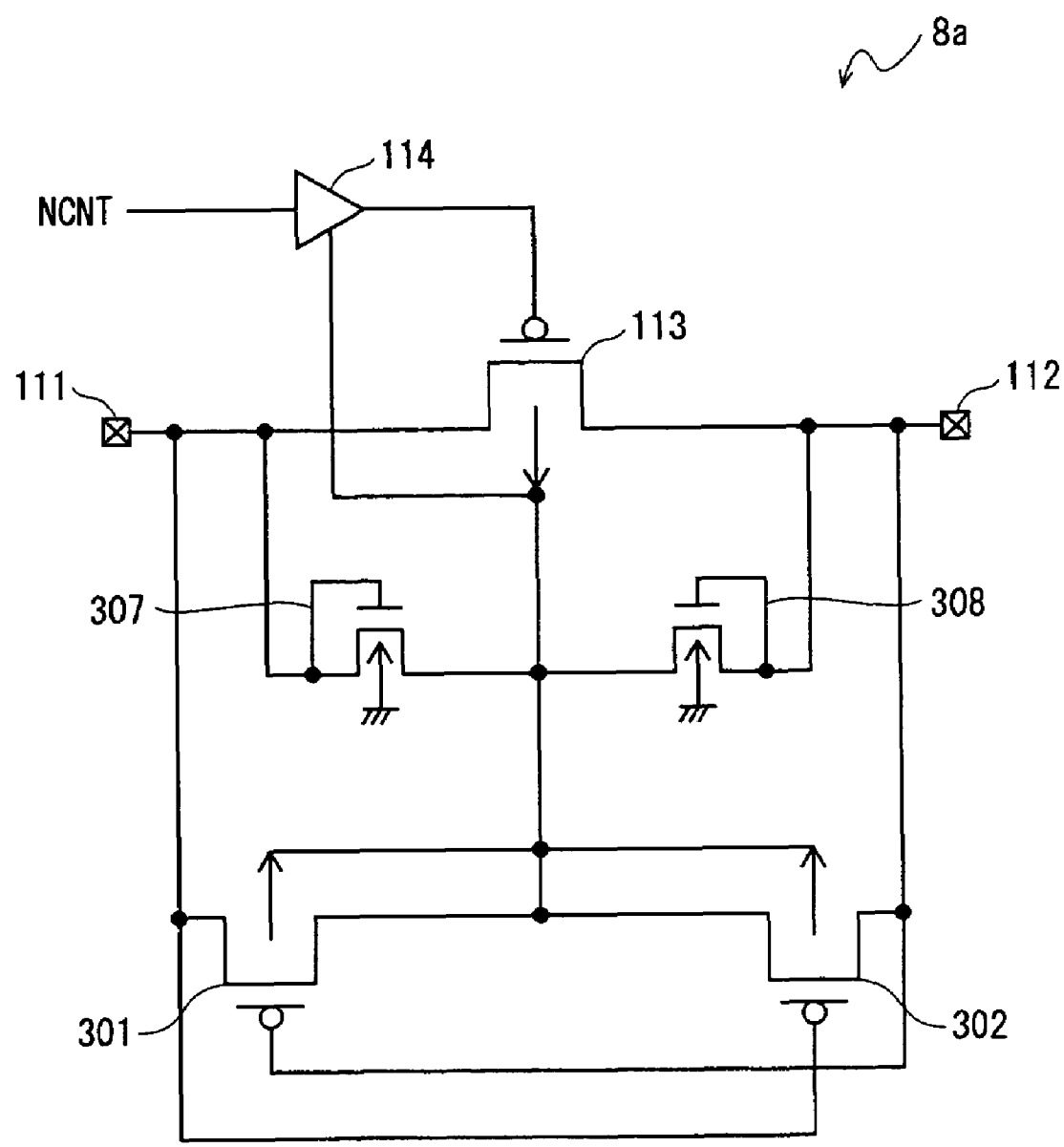
Figure 34:
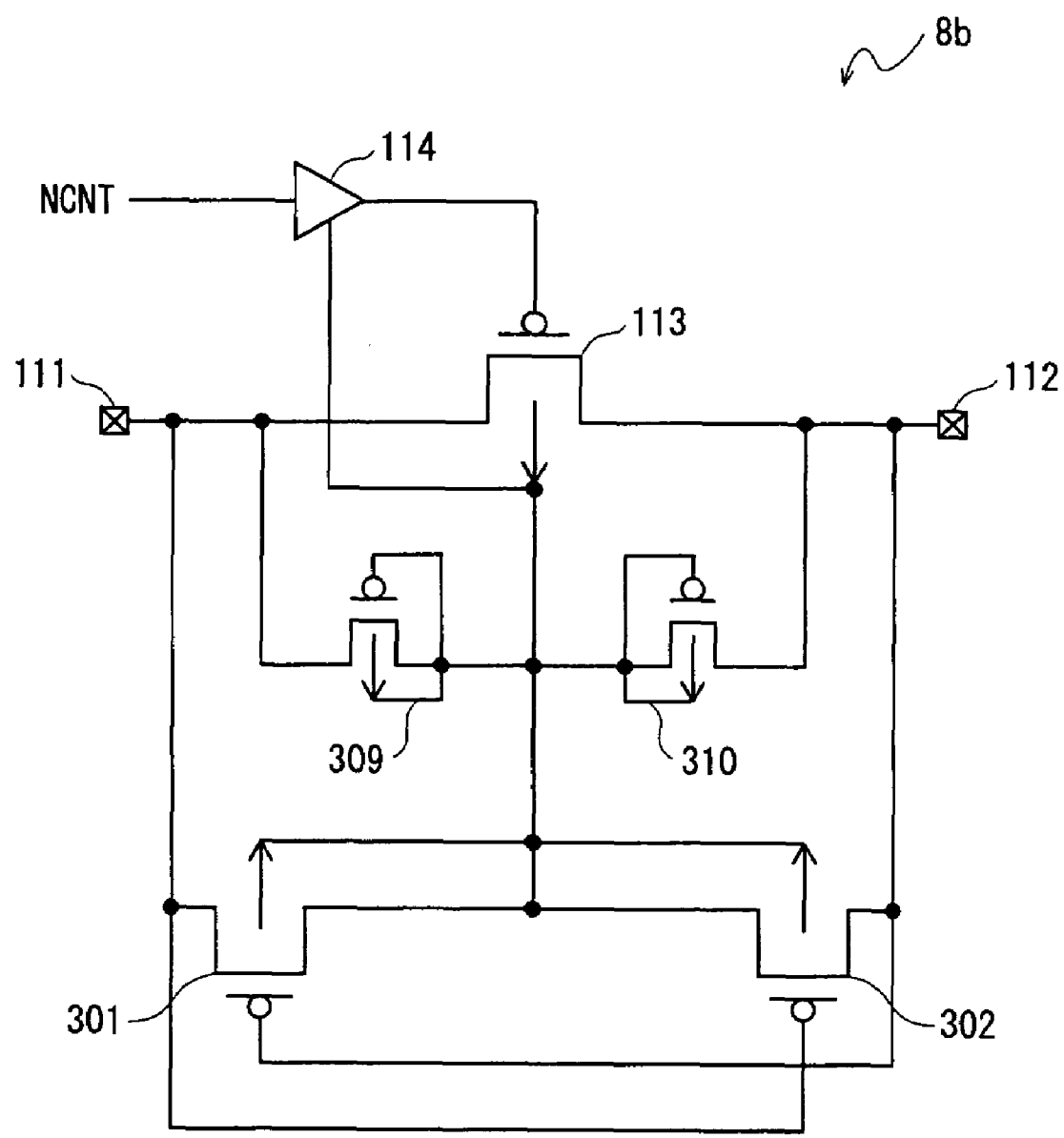
FIG. 34 is a circuit diagram that shows the configuration of a switch circuit 8b.
Figure 35:
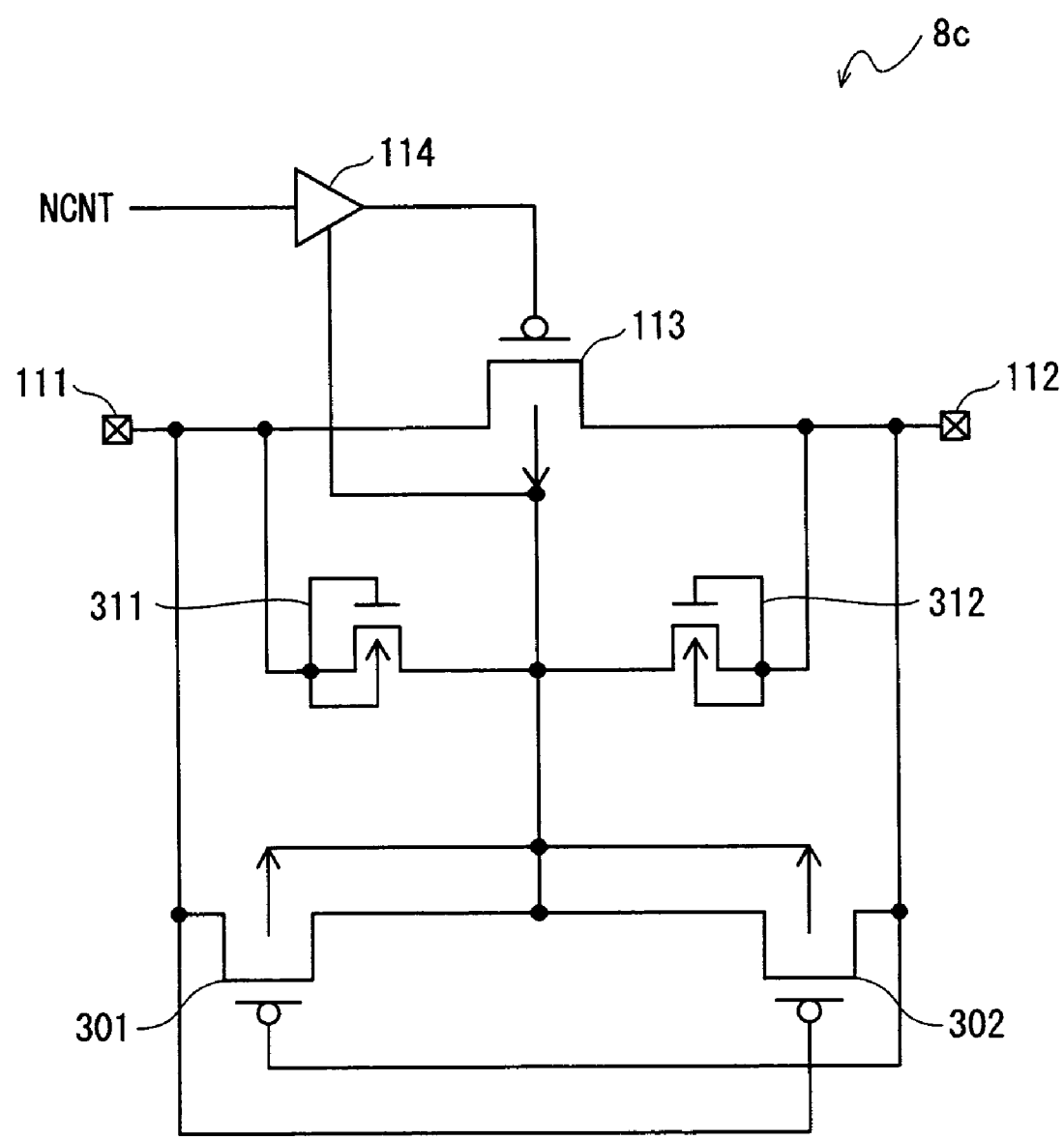
FIG. 35 is a circuit diagram that shows the configuration of a switch circuit 8c.

FIGS. 33 to 35 show a switch circuit provided with transistors that function as diodes that satisfy Condition 2 instead of the diodes 115 and 116. These transistors included in the switch circuit were previously described in Embodiment 1, and so a description thereof is omitted here.

9. Embodiment 9

Following is a description of a switch circuit 9 according to Embodiment 9 of the present invention, with reference to the accompanying drawings.

9.1 Overview of Switch Circuit 9

The switch circuit 9 is configured with two NMOS transistors further connected to the switch circuit 2 described in Embodiment 2. In these NMOS transistors, either the source or the drain is connected to the back gate of the NMOS transistor 153, which functions to allow or cut off current between the input-output terminals. These NMOS transistors enter the on state as necessary, allowing current to flow in parallel with the diodes 155 and 156, thus controlling the current that flows into a parasitic diode of the NMOS transistor 153.

In the following description, a description of the same portions as in Embodiment 2 is omitted, and mainly distinguishing portions of the present embodiment are described.

9.2 Configuration of Switch Circuit 9

Figure 36:
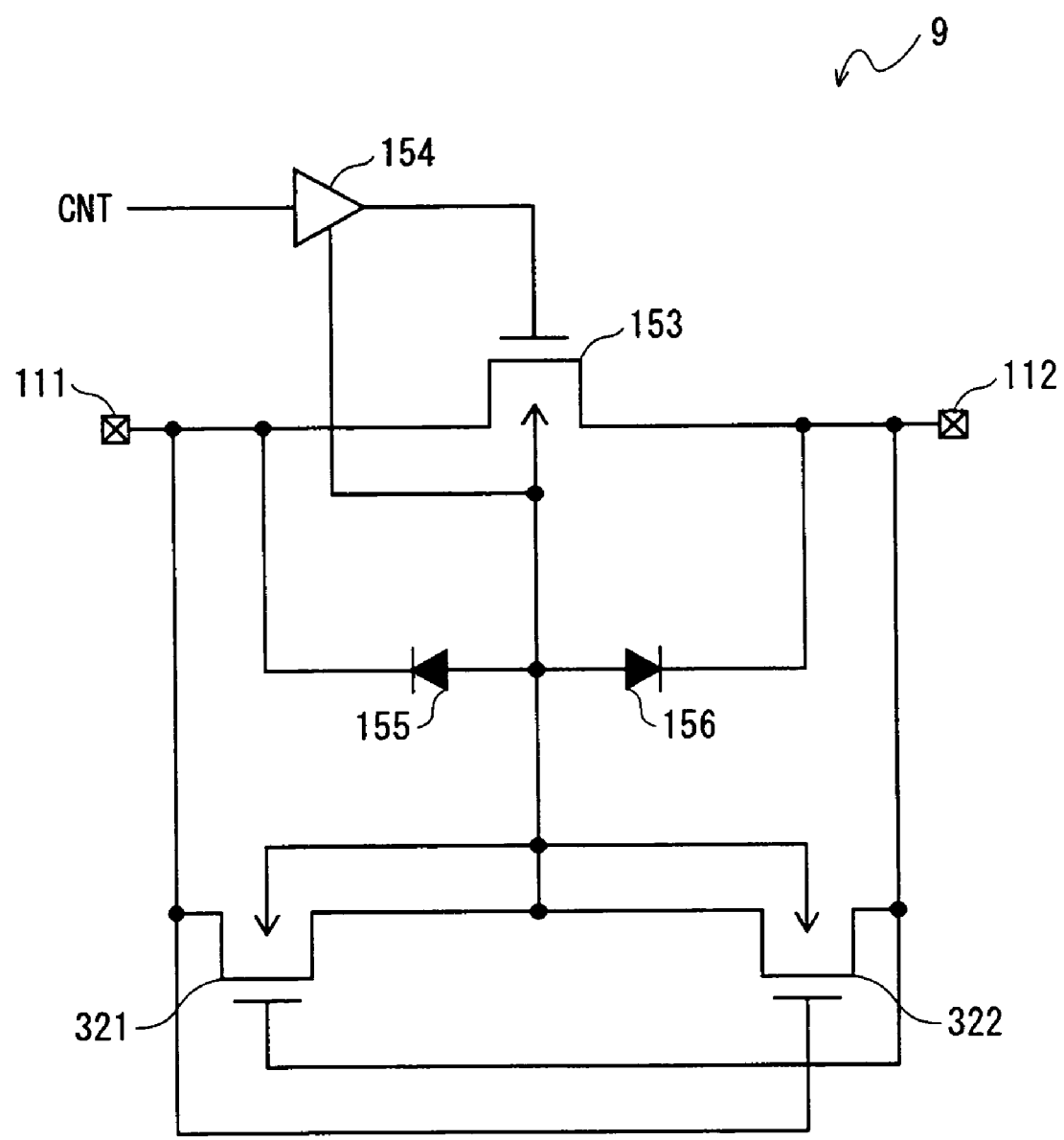
FIG. 36 is a circuit diagram that shows the configuration of a switch circuit 9.

FIG. 36 is a circuit diagram that shows the configuration of the switch circuit 9. In FIG. 36, constituent elements that are the same as in the switch circuit 2 in Embodiment 2 have the same reference numerals.

As shown in FIG. 36, the switch circuit 9 is configured from the NMOS transistor 153, the diodes 155 and 156, the level shift circuit 154, the input-output terminals 111 and 112, and NMOS transistors 321 and 322. The NMOS transistor 153, the diodes 155 and 156, the level shift circuit 154, and the input-output terminals 111 and 112 have the same configuration and connections with each other as in Embodiment 2, and so a description thereof is omitted here.

In the NMOS transistor 321, either the source or the drain is connected to the input-output terminal 111, and the other is connected to the back gate of the NMOS transistor 153. Moreover, the gate electrode is connected to the input-output terminal 112, and the back gate is connected to the back gate of the NMOS transistor 153.

In the NMOS transistor 322, either the source or the drain is connected to the input-output terminal 112, and the other is connected to the back gate of the NMOS transistor 153. Moreover, the gate electrode is connected to the input-output terminal 111, and the back gate is connected to the back gate of the NMOS transistor 153.

9.3 Operation of Switch Circuit 9

The operation of the switch circuit 9 is described divided into the following three cases. For the convenience of description, the potential applied to the input-output terminal 111 is expressed as Va, the potential applied to the input-output terminal 112 is expressed as Vb, and the potential of the back gate of the NMOS transistor 153 is expressed as Vbac.

(1) Va<Vb, Vbac>Va, and Vbac>Vb

It is assumed that Va<Vb, and at a point in time before Va and Vb are applied to the input-output terminals 111 and 112 respectively, the potential Vbac of the back gate of the NMOS transistor 153 satisfies Vbac>Va and Vbac>Vb. At this time, Vb−Va is not less than the threshold value of the NMOS transistor 321.

When Va and Vb are applied to the input-output terminals 111 and 112 respectively, the potential of the gate electrode of the NMOS transistor 321 becomes Vb, and the NMOS transistor 321 enters the on state. In parallel with the diode 155 and the parasitic diode of the NMOS transistor 153, the NMOS transistor 321 allows current to flow the back gate of the NMOS transistor 153 from the input-output terminal 111. Current stops when the potential of the back gate of the NMOS transistor 153 becomes equal to Va.

On the other hand, the potential of the gate electrode of the NMOS transistor 322 is Va. The potential of the back gate of the NMOS transistor 153, that is, the potential of the back gate of the NMOS transistor 322, is always equal to or greater than Va, so the NMOS transistor 322 remains in the off state.

(2) Va>Vb, Vbac>Va, and Vbac>Vb

A case is assumed in which Va>Vb, and at a point in time before Va and Vb are applied to the input-output terminals 111 and 112 respectively, the potential Vbac of the back gate of the NMOS transistor 153 is greater than Va and Vb. Va−Vb is assumed to be greater than the threshold value of the NMOS transistors 321 and 322.

In this case, opposite to the case in (1) above, the NMOS transistor 322 enters the on state, and allows current to flow from the back gate of the NMOS transistor 153 to the input-output terminal 112, in parallel with the diode 156 and the parasitic diode of the NMOS transistor 153, so the NMOS transistor 321 remains in the off state.

(3) Va>Vbac and Vb>Vbac

A case is assumed in which, at a stage before Va and Vb are applied to the input-output terminals 111 and 112 respectively, the potential Vbac of the back gate of the NMOS transistor 153 is lower than Va and Vb.

When Va and Vb are applied to the input-output terminals 111 and 112 respectively, the potential of the gate electrode of the NMOS transistor 321 becomes Vb. At this time, the potential Vbac of the back gate of the NMOS transistor 321 is less than Vb, so the NMOS transistor 321 enters the on state, and allows current to flow from the input-output terminal 111 to the back gate of the NMOS transistor 153.

On the other hand, the potential of the gate electrode of the NMOS transistor 322 becomes Va, and the potential Vbac of the back gate is greater than Va, so the NMOS transistor 322 enters the on state, and allows current to flow from the input-output terminal 112 to the back gate of the NMOS transistor 153.

The NMOS transistors 321 and 322 both enter the on state, allowing current to flow from the input-output terminals 111 and 112 to the back gate of the NMOS transistor 153, and this is accompanied by an increase in the potential Vbac of the back gate of the NMOS transistor 153.

If Va<Vb, when Vbac=Va, in the NMOS transistor 322, the difference in potential between the back gate and the gate electrode becomes 0V, so the NMOS transistor 322 enters the off state. Also, when Vbac=Va, the NMOS transistor 321 remains in the on state, but current stops because the difference in potential between the source and the drain is 0V.

If Va>Vb, when Vbac=Vb, the potential of the gate electrode and the back gate of the NMOS transistor 321 becomes the same, so the NMOS transistor 321 enters the off state. Also, when Vbac=Vb, in the NMOS transistor 322, the difference in potential between the source and the drain is 0V, so current stops.

9.4 Effects

As described above, in the switch circuit 9, when the potential of the input-output terminal 111 is less than that of the input-output terminal 112, the NMOS transistor 321 enters the on state, allowing current to flow from the back gate of the NMOS transistor 153 to the input-output terminal 111. Accordingly, it is possible to control the forward bias current allowed to flow to the parasitic diode 157 (shown in FIG. 2) of the NMOS transistor 153. On the other hand, the NMOS transistor 322 enters the off state, so current is not allowed to flow directly from the input-output terminal 111 to the input-output terminal 112 via the NMOS transistors 321 and 322.

Conversely, when the potential of the input-output terminal 112 is less than that of the input-output terminal 111, the NMOS transistor 321 enters the off state, and the NMOS transistor 322 enters the on state, allowing current to flow from the back gate of the NMOS transistor 153 to the input-output terminal 112. Accordingly, it is possible to control the forward bias current allowed to flow to the parasitic diode 158 (shown in FIG. 2) of the NMOS transistor 153.

Further, when, after applying a low potential to the input-output terminal 111 or 112, a high potential is then applied, the NMOS transistors 321 and 322 both enter the on state, and reduce the potential of the back gate of the NMOS transistor 153. Thus, it is possible to prevent a reduction in current capacity due to a substrate bias effect of the PMOS transistor 153.

9.5 Modified Example of Embodiment 9

Same as in the case of Embodiment 2, a diode that satisfies above Condition 1 or 2 may be used instead of the diodes 155 and 156 used to configure the switch circuit 9.

Figure 37:
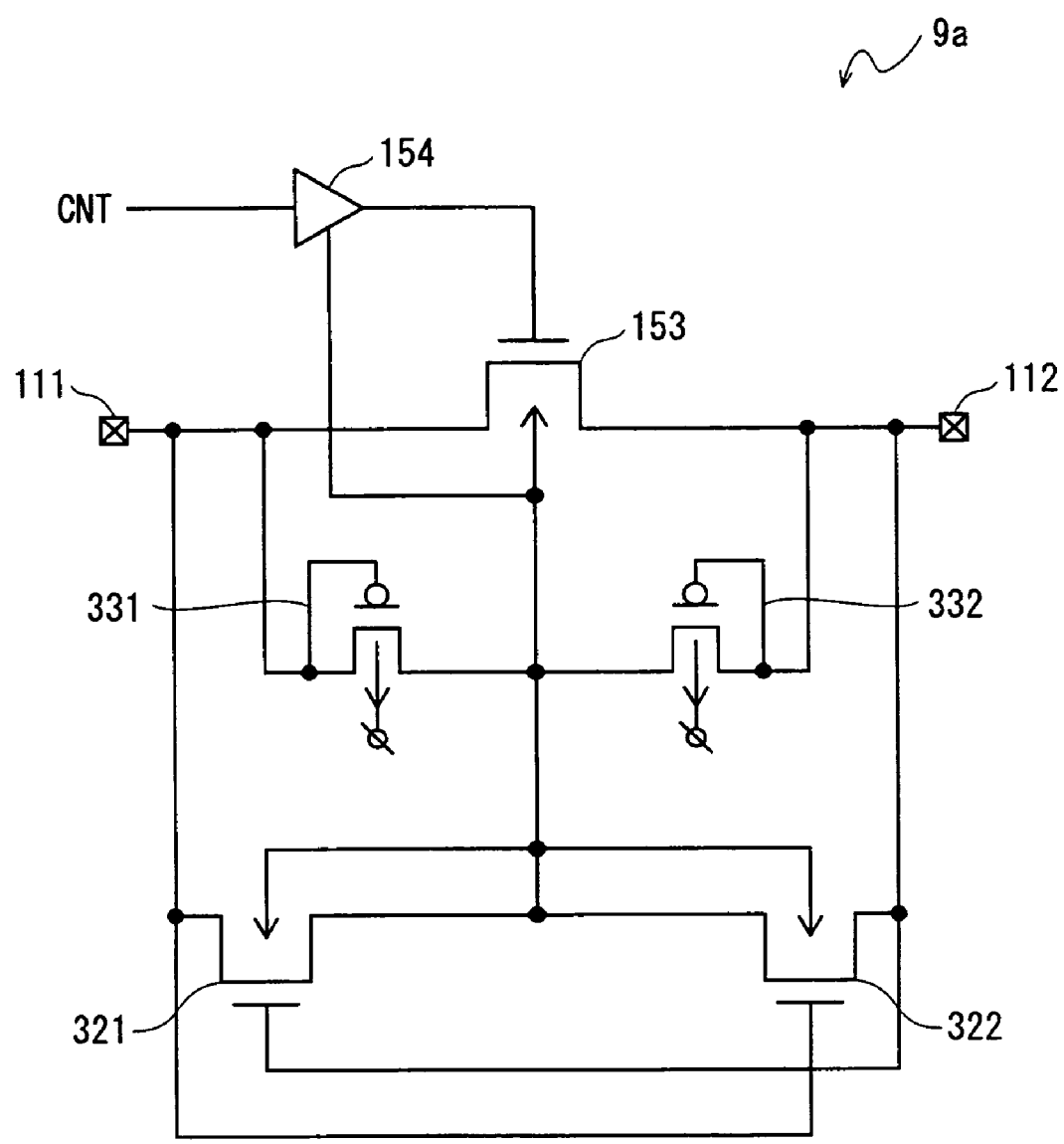
Figure 38:
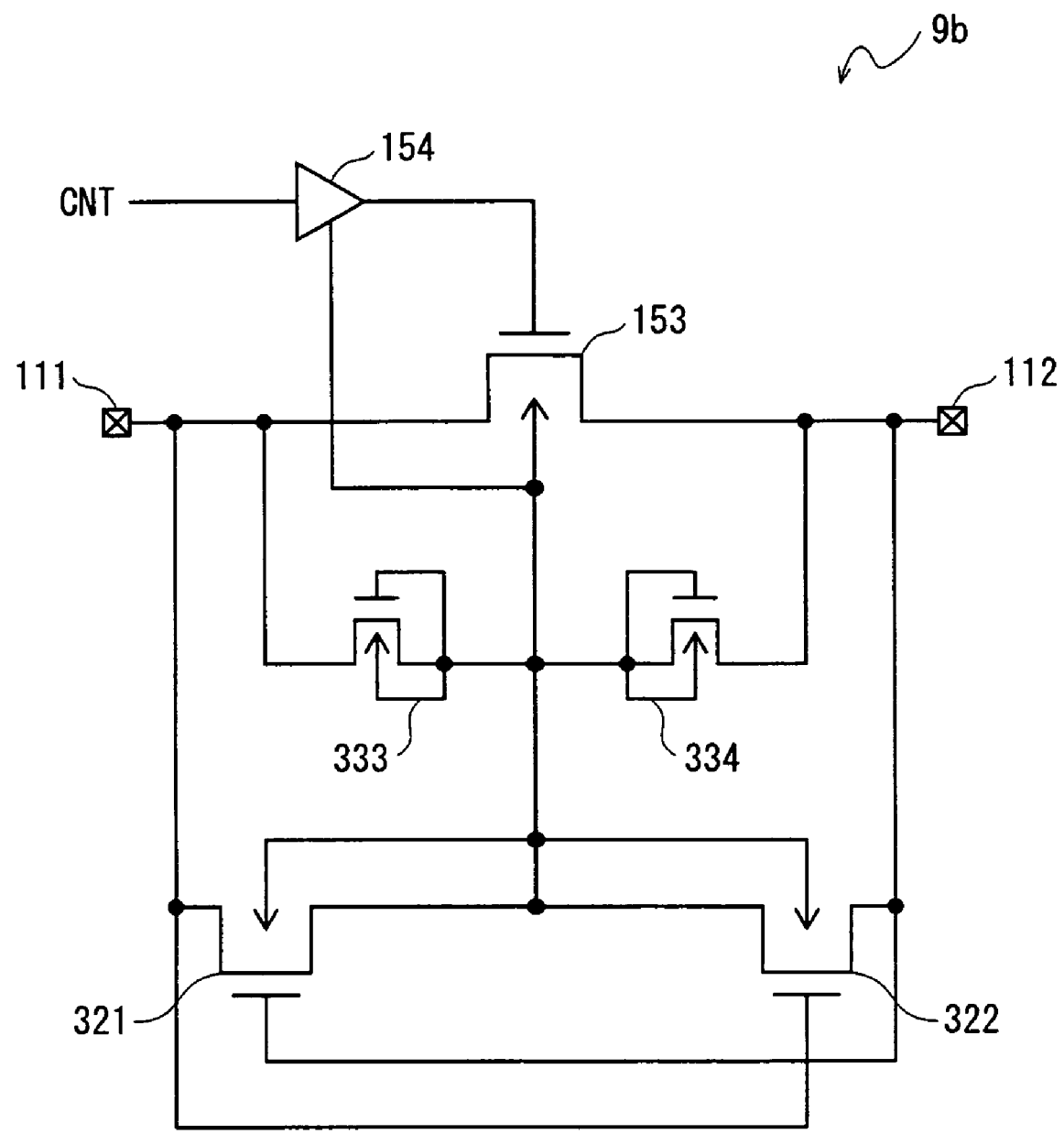
FIG. 38 is a circuit diagram that shows the configuration of a switch circuit 9b.
Figure 39:
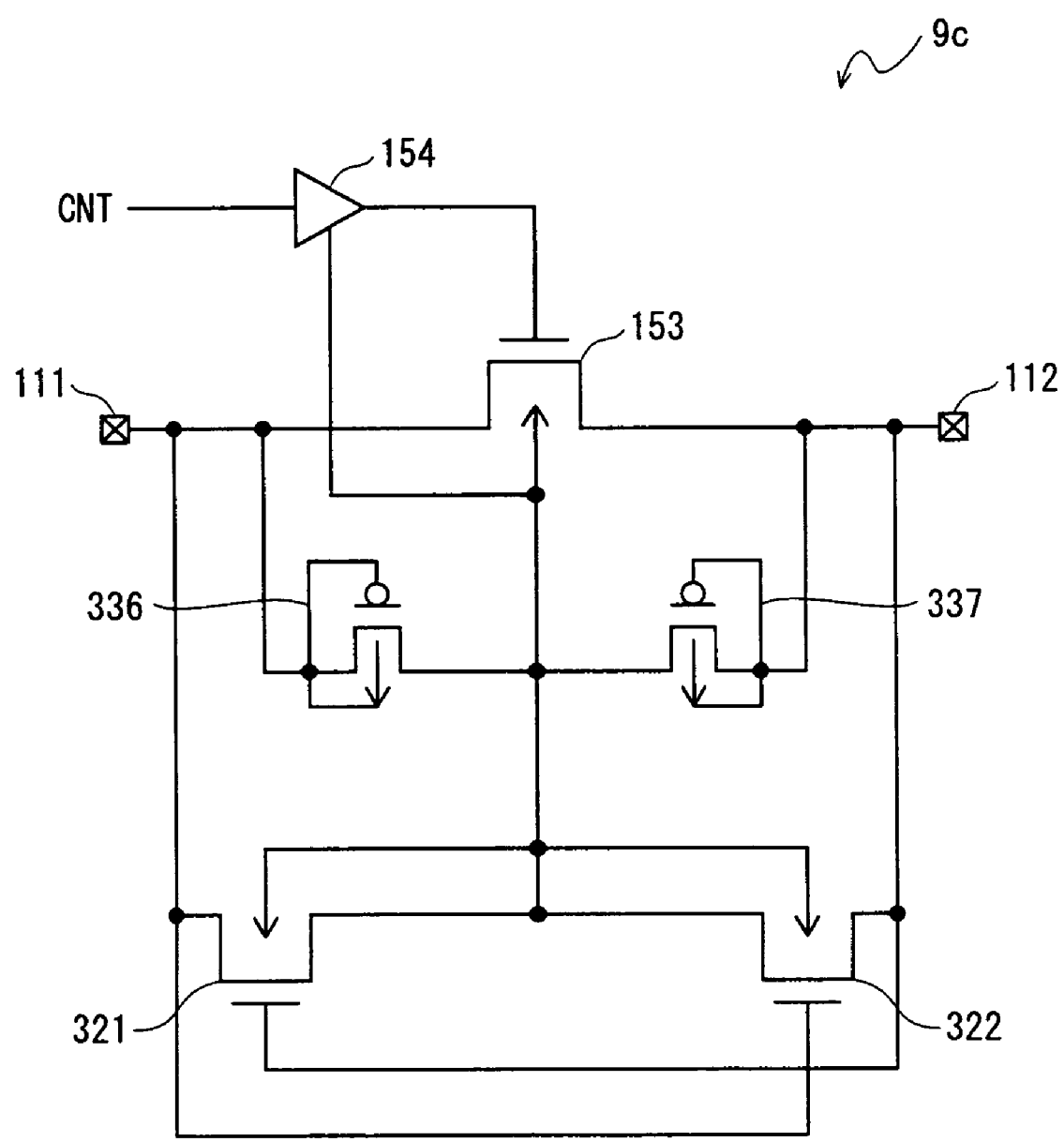
FIG. 39 is a circuit diagram that shows the configuration of a switch circuit 9c.

FIGS. 37 to 39 show a switch circuit provided with transistors that function as diodes that satisfy Condition 2 instead of the diodes 155 and 156. These transistors used to configure the switch circuit were previously described in Embodiment 1, and so a description thereof is omitted here.

10. Other Modified Examples

Above, the present invention was described with reference to Embodiments 1 to 9, but the present invention is not limited to these embodiments. The present invention also includes the examples described below.

(1) In Embodiment 1, one diode 115 is connected in parallel with the parasitic diode 117, but the present invention is not limited to this configuration. A plurality of diodes may be connected in parallel with the parasitic diode 117. The parasitic diode 118 may likewise be connected in parallel with a plurality of diodes, not only the diode 116.

The same is true with respect to Embodiments 2 to 7; a plurality of diodes may be connected in parallel with a parasitic diode.

(2) Also, any of the PN junction diodes described with reference to FIG. 3 or 4, a Schottky barrier diode, and the transistors described with reference to FIGS. 5 to 9, or a combination of these, may be used for the plurality of diodes connected in parallel in Modified Example (1).

(3) In Embodiment 1, an element that causes a voltage drop may be connected to the parasitic diode 117 in series. As examples, a resistor or a MOS transistor are conceivable. By connecting such an element, it is possible to reduce the voltage applied to the parasitic diode 117. This is also true with respect to the parasitic diode 118.

Also, the same is true with respect to Embodiments 2 to 9; a resistor or the like may be connected to a parasitic diode in series.

(4) Also, in the present invention, the above Embodiments 1 to 9 and modified examples may be variously combined.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A switch circuit comprising:
   first and second input-output terminals;
   a MOS transistor, whose source is connected to the first input-output terminal, and whose drain is connected to the second input-output terminal;
   a first rectifying unit, connected between the first input-output terminal and a back gate of the MOS transistor, which has a same rectifying direction as a first parasitic diode and is connected in parallel with the first parasitic diode, the first parasitic diode being parasitic between the source and the back gate of the MOS transistor, the first rectifying unit not being parasitic;
   a second rectifying unit, connected between the second input-output terminal and the back gate of the MOS transistor, which has a same rectifying direction as a second parasitic diode and is connected in parallel with the second parasitic diode, the second parasitic diode being between the drain and the back gate of the MOS transistor, the second rectifying unit not being parasitic; and
   a control unit operable to control an on-off state of the MOS transistor based on a control signal.

2. The switch circuit according to claim 1, wherein the MOS transistor is a P-channel-type transistor;
   the first rectifying unit and the second rectifying unit are respectively provided with an anode terminal and a cathode terminal, the anode terminal receiving input of current and the cathode terminal outputting current;
   the anode terminal of the first rectifying unit is connected to the first input-output terminal, and the cathode terminal is connected to the back gate of the MOS transistor; and
   the anode terminal of the second rectifying unit is connected to the second input-output terminal, and the cathode terminal is connected to the back gate of the MOS transistor.

3. The switch circuit according to claim 2, further comprising:
   a third rectifying unit, in which the anode terminal is connected to a power source potential, and the cathode terminal is connected to the back gate of the MOS transistor;
   wherein the control unit acquires an operating potential from the back gate of the MOS transistor.

4. The switch circuit according to claim 3, further comprising:
   a supplemental transistor that is an N-channel-type MOS transistor, whose source is connected to the first input-output terminal, and whose drain is connected to the second input-output terminal, and whose back gate is connected to a ground potential;
   wherein the control unit further controls the on-off state of the supplemental transistor in synchronization with the on-off state of the MOS transistor.

5. The switch circuit according to claim 2, further comprising:
   a first adjusting transistor that is a P-channel-type MOS transistor, whose source or drain is connected to the first input-output terminal, and whose back gate and the other among the source and the drain are connected to the back gate of the MOS transistor, and whose gate is connected to the second input-output terminal; and
   a second adjusting transistor that is a P-channel-type MOS transistor, whose source or drain is connected to the second input-output terminal, and whose back gate and the other among the source and the drain are connected to the back gate of the MOS transistor, and whose gate is connected to the first input-output terminal.

6. The switch circuit according to claim 2, wherein the control unit controls the on-off state of the MOS transistor by outputting either the potential of the back gate of the MOS transistor or the ground potential, based on the control signal.

7. The switch circuit according to claim 1, wherein the MOS transistor is an N-channel-type transistor;
the first rectifying unit and the second rectifying unit respectively comprise:
an anode terminal that receives input of current;
a cathode terminal that outputs current;
wherein the anode terminal of the first rectifying unit is connected to the back gate of the MOS transistor, and the cathode terminal of the first rectifying unit is connected to the first input-output terminal; and
the anode terminal of the second rectifying unit is connected to the back gate of the MOS transistor, and the cathode terminal of the second rectifying unit is connected to the second input-output terminal.

8. The switch circuit according to claim 7, further comprising:
a third rectifying unit, in which the anode terminal is connected to the back gate of the MOS transistor, and the cathode terminal is connected to a ground potential;
wherein the control unit acquires an operating potential from the back gate of the MOS transistor.

9. The switch circuit according to claim 8, further comprising:
a supplemental transistor that is a P-channel-type MOS transistor, whose source is connected to the first input-output terminal, and whose drain is connected to the second input-output terminal, and whose back gate is connected to a power source potential;
wherein the control unit further controls the on-off state of the supplemental transistor in synchronization with the on-off state of the MOS transistor.

10. The switch circuit according to claim 7, further comprising:
a first adjusting transistor that is an N-channel-type MOS transistor, whose source or drain is connected to the first input-output terminal, and whose back gate and the other among the source and the drain are connected to the back gate of the MOS transistor, and whose gate is connected to the second input-output terminal; and
a second adjusting transistor that is an N-channel-type MOS transistor, whose source or drain is connected to the second input-output terminal, and whose back gate and the other among the source and the drain is connected to the back gate of the MOS transistor, and whose gate is connected to the first input-output terminal.

11. The switch circuit according to claim 7, wherein the control unit controls the on-off state of the MOS transistor by outputting either the potential of the back gate of the MOS transistor or the power source potential, based on the control signal.

12. The switch circuit according to claim 1, wherein at least one among the first and second rectifying units comprises:
a first semiconductor region of a second conductivity-type, formed on a semiconductor substrate of a first conductivity-type;
a first diffusion layer of the second conductivity-type, formed in the first semiconductor region;
a second semiconductor region of the first conductivity-type, formed in the first semiconductor region;
a second diffusion layer of the first conductivity-type, formed in the second semiconductor region;
a third diffusion layer of the second conductivity-type, formed in the second semiconductor region;
a first terminal, connected to the first diffusion layer and the second diffusion layer; and
a second terminal, connected to the third diffusion layer.

13. The switch circuit according to claim 1, wherein at least one among the first and second rectifying units comprises:
a first semiconductor region of a second conductivity-type, formed on a semiconductor substrate of a first conductivity-type;
a first diffusion layer of the second conductivity-type, formed in the first semiconductor region;
a second semiconductor region of the first conductivity-type, formed in the first semiconductor region;
a second diffusion layer of the first conductivity-type, formed in the second semiconductor region;
an internal MOS transistor of the second conductivity-type, formed in the second semiconductor region;
a first terminal, connected to the first and second diffusion layers, either the source or the drain of the internal MOS transistor, and the gate of the internal MOS transistor; and
a second terminal, connected to the other among the source and the drain of the internal MOS transistor.

14. The switch circuit according to claim 13, wherein a threshold voltage of the internal MOS transistor is lower than a built-in potential of the first or second parasitic diodes.

15. The switch circuit according to claim 1, wherein at least one among the first and second rectifying units is a Schottky barrier diode.

16. The switch circuit according to claim 1, further comprising:
a voltage dividing unit that causes a predetermined voltage drop between the source of the MOS transistor and the first input-output terminal, and/or between the drain of the MOS transistor and the second input-output terminal.

17. A switch circuit comprising:
a MOS transistor, whose source is connected to the first input-output terminal, and whose drain is connected to the second input-output terminal;
a first rectifying unit, connected between the first input-output terminal and a back gate of the MOS transistor;
a second rectifying unit, connected between the second input-output terminal and the back gate of the MOS transistor;
a control unit operable to control an on-off state of the MOS transistor based on a control signal,
wherein the MOS transistor comprises:
a semiconductor region having a first conductivity-type that comprises the back gate;
a first semiconductor layer of a second conductivity-type, formed in the semiconductor region, the first semiconductor layer comprising the source;
a second semiconductor layer of the second conductivity-type, formed in the semiconductor region, the second semiconductor layer comprising the drain;
wherein the first rectifying unit has a same rectifying direction as a first parasitic diode and is connected in parallel with the first parasitic diode, the first parasitic diode being parasitic at a junction face of the first semiconductor layer and the semiconductor region, the first rectifying unit being of the second conductivity-type, formed in the semiconductor region, and comprising the drain;

the second rectifying unit has a same rectifying direction as a second parasitic diode and is connected in parallel with the second parasitic diode, the second parasitic diode being parasitic at a junction face of the second semiconductor layer and the semiconductor region, and
the first and second rectifying units are not parasitic diodes.

18. A switch circuit, comprising:

first and second input-output terminals;

a P-channel-type MOS transistor, whose source is connected to the first input-output terminal, and whose drain is connected to the second input-output terminal;

a first rectifying unit whose anode terminal is connected to the first input-output terminal, and whose cathode terminal is connected to the back gate of the P-channel-type MOS transistor, the anode terminal receiving input of current and the cathode terminal outputting current;

a second rectifying unit whose anode terminal is connected to the second input-output terminal, and whose cathode terminal is connected to the back gate of the P-channel-type MOS transistor, a third rectifying unit whose anode terminal is connected to a power source potential, and whose cathode terminal is connected to the back gate of the P-channel-type MOS transistor;

a first control unit that acquires an operating potential from the back gate of the P-channel-type MOS transistor, and controls the on-off state of the P-channel-type MOS transistor based on a control signal;

an N-channel-type MOS transistor whose source is connected to the first input-output terminal, and whose drain is connected to the second input-output terminal;

a fourth rectifying unit whose anode terminal is connected to the back gate of the N-channel-type MOS transistor, and whose cathode terminal is connected to the first input-output terminal;

a fifth rectifying unit whose anode terminal is connected to the back gate of the N-channel-type MOS transistor, and whose cathode terminal is connected to the second input-output terminal;

a sixth rectifying unit whose anode terminal is connected to the back gate of the N-channel-type MOS transistor, and whose cathode terminal is connected to a ground potential; and a second control unit that acquires an operating potential from the back gate of the N-channel-type MOS transistor, and controls the on-off state of the N-channel-type MOS transistor based on the control signal.

* * * * *